(12) United States Patent
Sakamoto

(10) Patent No.: US 11,309,511 B2
(45) Date of Patent: Apr. 19, 2022

(54) ORGANIC ELECTROLUMINESCENCE DEVICE AND NITROGEN-CONTAINING COMPOUND FOR ORGANIC ELECTROLUMINESCENCE DEVICE

(71) Applicant: SAMSUNG DISPLAY CO., LTD., Yongin-si (KR)

(72) Inventor: Naoya Sakamoto, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 372 days.

(21) Appl. No.: 16/453,516

(22) Filed: Jun. 26, 2019

(65) Prior Publication Data

US 2020/0013982 A1 Jan. 9, 2020

(30) Foreign Application Priority Data

Jul. 6, 2018 (KR) .......................... 10-2018-0078747

(51) Int. Cl.
*H01L 51/50* (2006.01)
*H01L 51/00* (2006.01)
*H01L 51/52* (2006.01)

(52) U.S. Cl.
CPC ...... *H01L 51/5064* (2013.01); *H01L 51/0067* (2013.01); *H01L 51/0072* (2013.01); *H01L 51/0073* (2013.01); *H01L 51/0074* (2013.01); *H01L 51/508* (2013.01); *H01L 51/5203* (2013.01)

(58) Field of Classification Search
None
See application file for complete search history.

(56) References Cited

U.S. PATENT DOCUMENTS

2016/0285009 A1 9/2016 Dyatkin et al.
2017/0346017 A1 11/2017 Nakano et al.

FOREIGN PATENT DOCUMENTS

JP 2007/194506 A 8/2007
JP 2017-210464 A 11/2017
KR 10-1452577 B1 10/2014

*Primary Examiner* — Gregory D Clark
(74) *Attorney, Agent, or Firm* — Lewis Roca Rothgerber Christie LLP

(57) ABSTRACT

An organic electroluminescence device includes a first electrode, a hole transport region, an emission layer including a nitrogen-containing compound, an electron transport region, and a second electrode. The nitrogen-containing compound may include a heterocyclic moiety and two carbazole moieties, the heterocyclic moiety may be a substituted pyridine, a substituted pyrimidine, or a substituted 1,3,5-triazine, each of two carbons among carbons of 2-, 4-, and 6-positions of the substituted pyridine, the substituted pyrimidine, or the substituted 1,3,5-triazine may be substituted with a phenylene group, a carbon in an ortho position of each phenylene group may be linked with a nitrogen at a 9-position of one of the carbazole moieties, and the remaining carbon among the carbons of the 2-, 4-, and 6-positions may be substituted with a substituted or unsubstituted aromatic group, and the carbazole moieties may be linked together by a linker.

20 Claims, 2 Drawing Sheets

ORGANIC ELECTROLUMINESCENCE DEVICE AND NITROGEN-CONTAINING COMPOUND FOR ORGANIC ELECTROLUMINESCENCE DEVICE

CROSS-REFERENCE TO RELATED APPLICATION

Korean Patent Application No. 10-2018-0078747, filed on Jul. 6, 2018, in the Korean Intellectual Property Office, and entitled: "Organic Electroluminescence Device and Nitrogen-Containing Compound for Organic Electroluminescence Device," is incorporated by reference herein in its entirety.

BACKGROUND

1. Field

Embodiments relate to an organic electroluminescence device and a nitrogen-containing compound for an organic electroluminescence device.

2. Description of the Related Art

Development on an organic electroluminescence display as an image display is being actively conducted. An organic electroluminescence display is different from a liquid crystal display and is so called a self-luminescent display that accomplishes display by recombining holes and electrons injected from a first electrode and a second electrode in an emission layer and emitting light from a luminescent material, which is an organic compound included in the emission layer.

SUMMARY

Embodiments are directed to an organic electroluminescence device, including a first electrode, a hole transport region on the first electrode, an emission layer on the hole transport region, the emission layer including a nitrogen-containing compound, an electron transport region on the emission layer, and a second electrode on the electron transport region. The nitrogen-containing compound may include a heterocyclic moiety and two carbazole moieties, the heterocyclic moiety may be a substituted pyridine, a substituted pyrimidine, or a substituted 1,3,5-triazine, each of two carbons among carbons of 2-, 4-, and 6-positions of the substituted pyridine, the substituted pyrimidine, or the substituted 1,3,5-triazine may be substituted with a phenylene group, a carbon in an ortho position of each phenylene group may be linked with a nitrogen at a 9-position of one of the carbazole moieties, and the remaining carbon among the carbons of the 2-, 4-, and 6-positions may be substituted with a substituted or unsubstituted aromatic group, and the carbazole moieties may be linked together by a linker.

The aromatic group may be a substituted or unsubstituted aryl group having 6 to 30 ring carbon atoms, or a substituted or unsubstituted heteroaryl group having 2 to 30 ring carbon atoms, and the linker may be a direct linkage, a substituted or unsubstituted arylene group having 6 to 30 ring carbon atoms, or a substituted or unsubstituted heteroarylene group having 2 to 30 ring carbon atoms.

The aromatic group may be a substituted or unsubstituted phenyl group, a substituted or unsubstituted dibenzofuran group, or a substituted or unsubstituted dibenzothiophene group, and the linker may be a direct linkage, a substituted or unsubstituted phenylene group, a substituted or unsubstituted dibenzofuranylene group, or a substituted or unsubstituted dibenzothiophenylene group.

The heterocyclic moiety may be a substituted pyrimidine or a substituted 1,3,5-triazine.

The emission layer may include a host and a dopant, and the dopant may include the nitrogen-containing compound.

The nitrogen-containing compound may be represented by the following Formula 1.

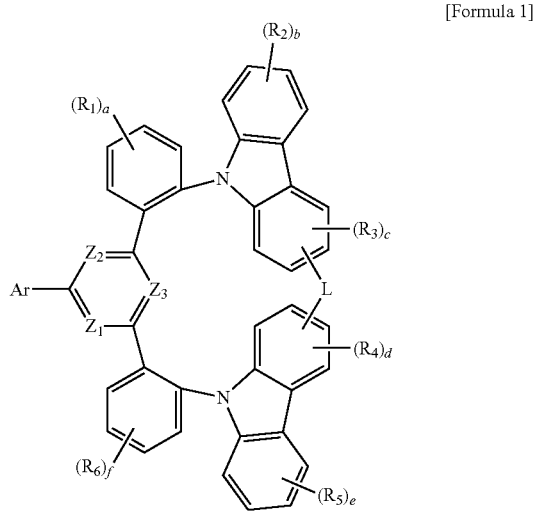

[Formula 1]

In Formula 1, $Z_1$ to $Z_3$ may be each independently C—$R_7$ or N, and at least one of $Z_1$ to $Z_3$ may be N, Ar may be a substituted or unsubstituted aryl group having 6 to 30 ring carbon atoms, or a substituted or unsubstituted heteroaryl group having 2 to 30 ring carbon atoms, L may be a direct linkage, a substituted or unsubstituted arylene group having 6 to 30 ring carbon atoms, or a substituted or unsubstituted heteroarylene group having 2 to 30 ring carbon atoms, and $R_1$ to $R_7$ may be each independently a hydrogen atom, a deuterium atom, a halogen atom, a cyano group, a substituted or unsubstituted amino group, a substituted or unsubstituted silyl group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms. a, b, e and f may be each independently an integer of 0 to 4, and c and d may be each independently an integer of 0 to 3.

Formula 1 may be represented by any one of Formulae 1-1 to 1-3.

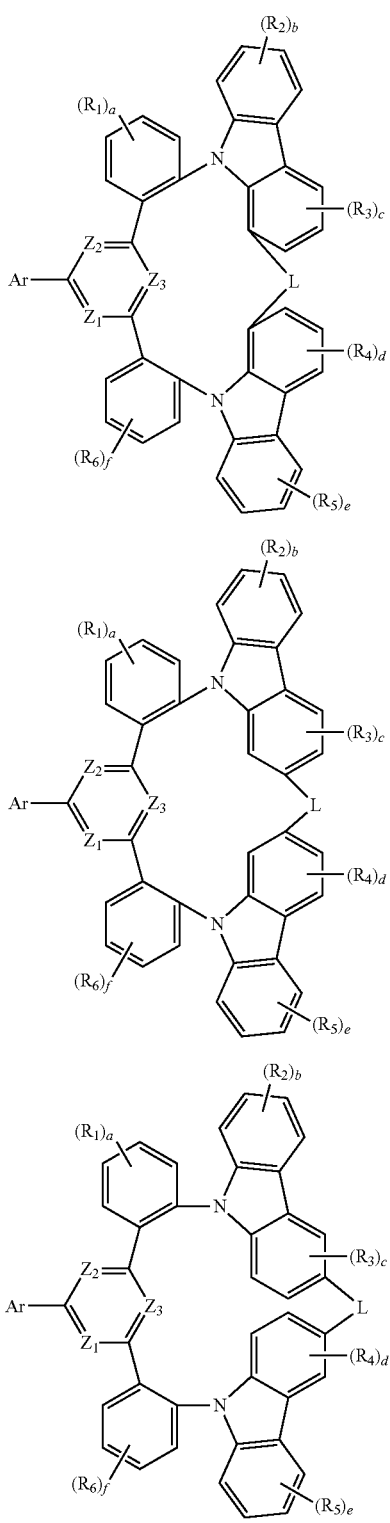

[Formula 1-1]

[Formula 1-2]

[Formula 1-3]

In Formulae 1-1 to 1-3, $Z_1$ to $Z_3$, Ar, L, $R_1$ to $R_7$ and a to f may be the same as defined in Formula 1.

In an embodiment, Ar may be a substituted or unsubstituted phenyl group, a substituted or unsubstituted dibenzofuran group, or a substituted or unsubstituted dibenzothiophene group, and L may be a direct linkage, a substituted or unsubstituted phenylene group, a substituted or unsubstituted dibenzofuranylene group, or a substituted or unsubstituted dibenzothiophenylene group.

In an embodiment, at least two of $Z_1$ to $Z_3$ may be N.

Embodiments are also directed to an organic electroluminescence device including a first electrode, a hole transport region on the first electrode, an emission layer on the hole transport region, the emission layer including a nitrogen-containing compound represented by Formula 1, an electron transport region on the emission layer, and a second electrode on the electron transport region.

Embodiments are also directed to a nitrogen-containing compound represented by Formula 1.

BRIEF DESCRIPTION OF THE DRAWINGS

Features will become apparent to those of skill in the art by describing in detail example embodiments with reference to the attached drawings in which.

DETAILED DESCRIPTION

Figure 1:
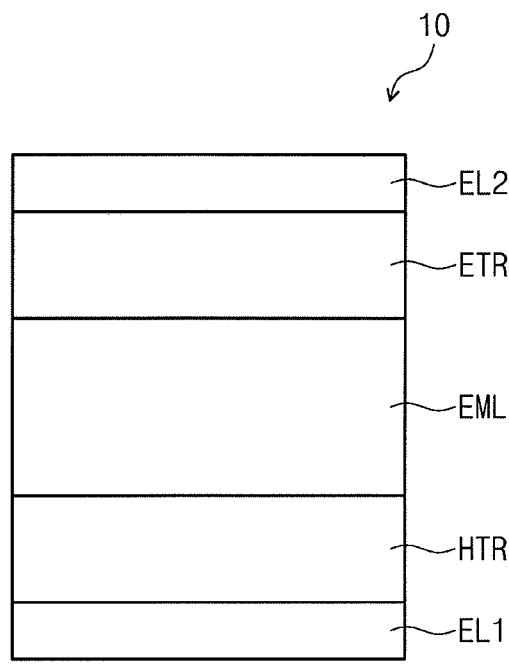
FIG. 1 illustrates a schematic cross-sectional view of an organic electroluminescence device according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

It will be understood that, although the terms first, second, etc. may be used herein to describe various elements, these elements should not be limited by these terms. These terms are only used to distinguish one element from another element. For example, a first element discussed below could be termed a second element, and similarly, a second element could be termed a first element. As used herein, the singular forms are intended to include the plural forms as well, unless the context clearly indicates otherwise.

It will be understood that the terms "comprise" or "have," when used in this specification, specify the presence of stated features, numerals, steps, operations, elements, parts, or a combination thereof, but do not preclude the presence or addition of one or more other features, numerals, steps, operations, elements, parts, or a combination thereof. It will also be understood that when a layer, a film, a region, a plate, etc. is referred to as being "on" another part, it can be "directly on" the other part, or intervening layers may also be present. On the contrary, when a layer, a film, a region, a plate, etc. is referred to as being "under" another part, it can be "directly under" the other part, or intervening layers may also be present.

In the present disclosure, "substituted or unsubstituted" may mean unsubstituted or substituted with at least one substituent selected from the group consisting of deuterium, halogen, cyano, nitro, amino, silyl, boron, phosphine oxide, phosphine sulfide, alkyl, alkenyl, aryl and heterocyclic group, unless the context clearly indicates otherwise. In addition, each of the substituent illustrated above may be substituted or unsubstituted. For example, biphenyl may be interpreted as aryl, or phenyl substituted with phenyl. A heterocyclic group includes Aliphatic heterocycle and aromatic heterocycle (heteroaryl group).

In the present disclosure, examples of a halogen atom are a fluorine atom, a chlorine atom, a bromine atom, or an iodine atom.

In the present disclosure, the alkyl group may have a linear, branched or cyclic form. The carbon number of the alkyl group may be 1 to 30, 1 to 20, 1 to 10, or 1 to 5. Examples of the alkyl group may include methyl, ethyl, n-propyl, isopropyl, n-butyl, s-butyl, t-butyl, butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl. 2-hexyldecyl, 2-octyldecyl, n-undecyl, n-dodecyl, 2-ethyldodecyl, 2-butyldodecyl, 2-hexyldodecyl. 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyl eicosyl, 2-butyl eicosyl, 2-hexyl eicosyl, 2-octyl eicosyl, n-heneicosyl, n-docosyl, n-tricosyl, n-tetracosyl, n-pentacosyl, n-hexacosyl, n-heptacosyl, n-octacosyl, n-nonacosyl, n-triacontyl, etc.

In the present disclosure, the alkenyl group may be linear or branched. The carbon number may be, for example, 2 to 30, 2 to 20, or 2 to 10. Examples of the alkenyl group include vinyl, 1-butenyl, 1-pentenyl, 1,3-butadienyl aryl, styrenyl, styrylvinyl, etc.

In the present disclosure, the aryl group means any functional group or substituent derived from an aromatic hydrocarbon ring. The aryl group may be monocyclic aryl or polycyclic aryl. In the aryl group, the carbon number of carbons for forming a ring may be 6 to 60, 6 to 30, 6 to 20, or 6 to 15. Examples of the aryl group may include phenyl, naphthyl, fluorenyl, anthracenyl, phenanthryl, biphenyl, terphenyl, quaterphenyl, quinqphenyl, sexiphenyl, biphenylene, triphenylene, pyrenyl, benzofluoranthenyl, chrysenyl, etc.

In the present disclosure, the heteroaryl group may be heteroaryl including at least one of B, O, N, P, Si, or S as a heteroatom. When the heteroaryl group includes two or more heteroatoms, these heteroatoms may be the same or different from each other. The heteroaryl group may be monocyclic heteroaryl or polycyclic heteroaryl. In the heteroaryl group, the carbon number of carbons for forming a ring may be 2 to 30, 2 to 20, or 2 to 10. Examples of the heteroaryl group include thiophene, furan, pyrrole, imidazole, thiazole, oxazole, oxadiazole, triazole, pyridine, bipyridine, pyrimidine, triazine, triazole, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-aryl carbazole, N-heteroaryl carbazole. N-alkyl carbazole, benzoxazole, benzoimidazole, benzothiazole, benzocarbazole, benzothiophene, dibenzothiophene, thienothiophene, benzofuran, phenanthroline, thiazole, isoxazole, oxadiazole, thiadiazole, phenothiazine, dibenzosilole, dibenzofuran, etc.

In the present disclosure, the silyl group includes alkyl silyl and aryl silyl. Examples of the silyl group include trimethylsilyl, triethylsilyl, t-butyl dimethylsilyl, vinyl dimethylsilyl, propyl dimethylsilyl, triphenylsilyl, diphenylsilyl, phenylsilyl, etc.

In the present disclosure, the boron group includes alkyl boron and aryl boron. Examples of the boron group include trimethyl boron, triethyl boron, t-butyl dimethyl boron, triphenyl boron, diphenyl boron, phenyl boron, etc.

In the present disclosure, the carbon number of the amino group may be, for example, 1 to 30. The amino group may include alkyl amino and aryl amino. Examples of the amino group include methylamino, dimethylamino, phenylamino, diphenylamino, naphthylamino, 9-methyl-anthracenylamino, triphenylamino, etc.

In the present disclosure, the phosphine oxide group may be substituted with at least one of alkyl or aryl, for example. Examples of the phosphine oxide group include phenylphosphine oxide, diphenylphosphine oxide, etc.

In the present disclosure, the phosphine sulfide group may be substituted with at least one of alkyl or aryl.

The above explanation on the aryl group may be applied to the arylene group, except that the arylene group is divalent.

The above explanation on the heteroaryl group may be applied to the heteroarylene group, except that the heteroarylene group is divalent.

In the present disclosure, a direct linkage may mean a single bond between atoms.

An organic electroluminescence device according to an example embodiment will be explained referring to FIGS. 1 to 3.

FIG. 1 is a schematic cross-sectional view illustrating an organic electroluminescence device according to an example embodiment. FIG. 2 is a schematic cross-sectional view illustrating an organic electroluminescence device according to an example embodiment. FIG. 3 is a schematic cross-sectional view illustrating an organic electroluminescence device according to an example embodiment.

Figure 2:
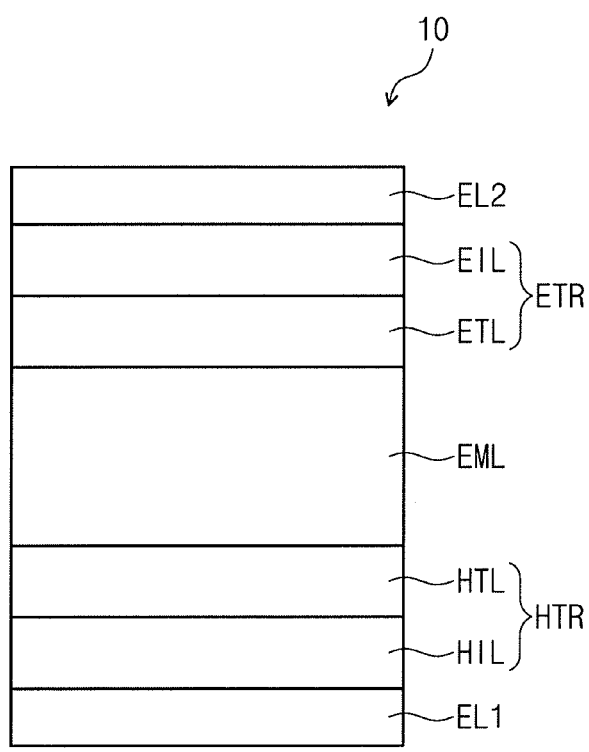
FIG. 2 illustrates a schematic cross-sectional view of an organic electroluminescence device according to an example embodiment.
Figure 3:
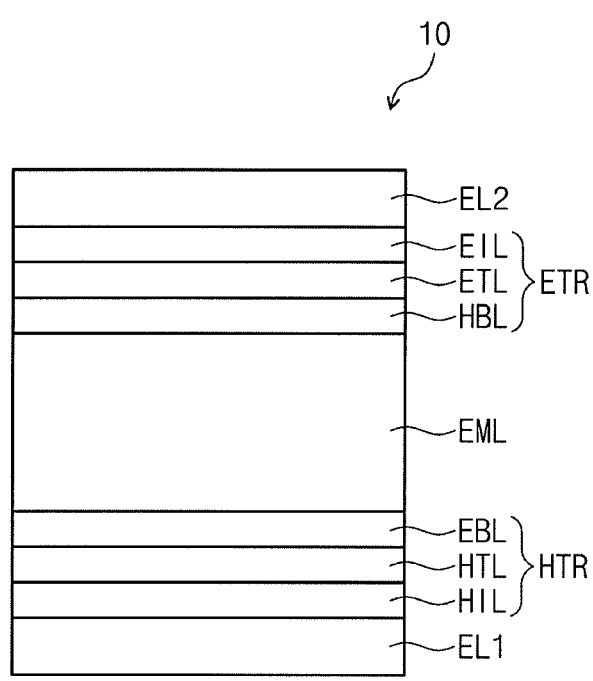
FIG. 3 illustrates a schematic cross-sectional view of an organic electroluminescence device according to an example embodiment.

Referring to FIGS. 1 to 3, an organic electroluminescence device 10 according to an example embodiment may include a first electrode EL1, a hole transport region HTR, an emission layer EML, an electron transport region ETR, and a second electrode EL2.

The first electrode EL1 may have conductivity. The first electrode EL1 may be a pixel electrode or an anode. The first electrode EL1 may be a transmissive electrode, a transflective electrode, or a reflective electrode. In the case that the first electrode EL1 is the transmissive electrode, the first electrode EL1 may include a transparent metal oxide such as indium tin oxide (ITO), indium zinc oxide (IZO), zinc oxide (ZnO), or indium tin zinc oxide (ITZO). In the case that the first electrode EL1 is the transflective electrode or reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). Also, the first electrode EL1 may have a structure including a plurality of layers including a reflective layer or transflective layer formed using the above materials, and a transparent conductive layer formed using ITO, IZO, ZnO, or ITZO. For example, the first electrode EL1 may have a triple-layer structure of ITO/Ag/ITO.

The thickness of the first electrode EL1 may be from about 1,000 Å to about 10,000 Å, for example, from about 1,000 Å to about 3,000 Å.

The hole transport region HTR may be on the first electrode EL1. The hole transport region HTR may include at least one of a hole injection layer HIL, a hole transport layer HTL, a hole buffer layer or an electron blocking layer EBL. The thickness of the hole transport region HTR may be from about 1,000 Å to about 1,500 Å, for example.

The hole transport region HTR may have a single layer formed using a single material, a single layer formed using a plurality of different materials, or a multilayer structure including a plurality of layers formed using a plurality of different materials.

For example, the hole transport region HTR may have a single layer structure of a hole injection layer HIL or a hole transport layer HTL, or may have a single layer structure formed using a hole injection material and a hole transport material. In addition, the hole transport region HTR may have a single layer structure formed using a plurality of different materials, or a laminated structure of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer EBL, laminated in order from the first electrode ELL The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The hole injection layer HIL may include a phthalocyanine compound such as copper phthalocyanine; N,N'-diphenyl-N,N'-bis-[4-(phenyl-m-tolyl-amino)-phenyl]-biphenyl-4,4'-diamine (DNTPD), 4,4',4"-tris(3-methylphenylphenylamino)triphenylamine (m-MTDATA), 4,4',4"-tris(N,N-diphenylamino)triphenylamine (TDATA), 4,4',4"-tris{N-(2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalen-1-yl)-N,N'-diphenyl-benzidine (NPB), triphenylamine-containing polyether ketone (TPAPEK), 4-isopropyl-4'-methyldiphenyliodonium tetrakis(pentafluorophenyl)borate, dipyrazino[2,3-f: 2',3'-h]quinoxaline-2,3,6,7,10,11-hexacarbonitrile (HAT-CN), etc.

The hole transport layer HTL, may include, for example, carbazole derivatives such as N-phenyl carbazole, polyvinyl carbazole, fluorine-based derivatives, N,N'-bis(3-methylphenyl)-N,N'-diphenyl-[1,1-biphenyl]-4,4'-diamine (TPD), triphenylamine-based derivatives such as 4,4',4"-tris(N-carbazolyl)triphenylamine (TCTA), N,N-di(naphthalen-1-yl)-N,N-diphenyl-benzidine (NPB), 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), α-NPD, 1,3-bis(N-carbazolyl)benzene (mCP), etc.

A material for the electron blocking layer EBL may be selected from the above-mentioned materials for the hole transport region HTR and the below-mentioned host materials. For example, when the hole transport region HTR includes an electron blocking layer EBL, mCP may be used as a material for the electron blocking layer EBL.

The thickness of the hole transport region HTR may be from about 100 Å to about 10,000 Å, for example, from about 100 Å to about 1,000 Å. In the case that the hole transport region HTR includes both of the hole injection layer HIL and the hole transport layer HTL, the thickness of the hole injection layer HIL may be from about 100 Å to about 10,000 Å, for example, from about 100 Å to about 1,000 Å, and the thickness of the hole transport layer HTL may be from about 30 Å to about 1,000 Å. In the case that the thicknesses of the hole transport region HTR, the hole injection layer HIL and the hole transport layer HTL satisfy the above-described ranges, satisfactory hole transport properties may be obtained without substantial increase of a driving voltage.

The hole transport region HTR may further include a charge generating material in addition to the above-described materials to improve conductivity. The charge generating material may be dispersed in the hole transport region HTR uniformly or non-uniformly. The charge generating material may be, for example, a p-dopant. The p-dopant may be one of quinone derivatives, metal oxides, or cyano group-containing, compounds. For example, non-limiting examples of the p-dopant may include quinone derivatives such as tetracyanoquinodimethane (TCNQ), and 2,3,5,6-tetrafluoro-tetracyanoquinodimethane (F4-TCNQ), metal oxides such as tungsten oxide and molybdenum oxide.

As described above, the hole transport region HTR may include one or more of a hole buffer layer or an electron blocking layer EBL in addition to the hole injection layer HIL and the hole transport layer HTL. The hole buffer layer may compensate an optical resonance distance according to the wavelength of light emitted from the emission layer EML and increase light emission efficiency. Materials included in the hole transport region HTR may be used as materials included in the hole buffer layer. The electron blocking layer EBL is a layer preventing electron injection from the electron transport region ETR into the hole transport region HTR.

The emission layer EML may be on the hole transport region HTR. The thickness of the emission layer EML may be, for example, from about 100 Å to about 1,000 Å, or from about 100 Å to about 300 Å. The emission layer EML may have a single layer formed using a single material, a single layer formed using a plurality of different materials, or a multilayer structure having a plurality of layers formed using a plurality of different materials.

The emission layer EML may include a nitrogen-containing compound including a heterocyclic moiety and two carbazole moieties.

The heterocyclic moiety may be a substituted pyridine, a substituted pyrimidine, or a substituted 1,3,5-triazine. Each of two carbons among the carbons of 2-, 4-, and 6-positions of the substituted pyridine, the substituted pyrimidine, or the substituted 1,3,5-triazine may be substituted with a phenylene group, and the remaining carbon among the carbons of 2-, 4-, and 6-positions may be substituted with a substituted or unsubstituted aromatic group.

For example, when the carbons of the 2- and 4-positions are substituted with a substituted or unsubstituted phenylene group, the carbon of the 6-position may be substituted with a substituted or unsubstituted aromatic group. For example, when the carbons of the 4- and 6-positions are substituted with a substituted or unsubstituted phenylene group, the carbon of the 2-position may be substituted with a substituted or unsubstituted aromatic group. For example, when the carbons of the 2- and 6-positions are substituted with a substituted or unsubstituted phenylene group, the carbon of the 4-position may be substituted with a substituted or unsubstituted aromatic group.

The heterocyclic moiety may be, for example, a substituted 1,3,5-triazine.

The numbering of the substitution position in the substituted pyridine, the substituted pyrimidine, or the substituted 1,3,5-triazine is as follows.

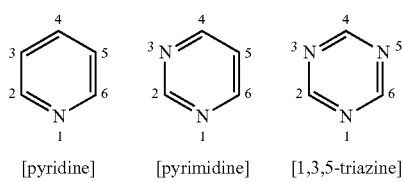

[pyridine]  [pyrimidine]  [1,3,5-triazine]

The aromatic group substituted on the heterocyclic moiety may be a substituted or unsubstituted aryl group or a substituted or unsubstituted heteroaryl group. The substituted or unsubstituted aryl group may be an aryl group having 6 to 30 or 6 to 15 ring carbon atoms. The substituted or unsubstituted heteroaryl group may be a heteroaryl group having 2 to 30 or 2 to 20 ring carbon atoms. The substituted or unsubstituted aryl group may be a monocyclic aryl group. The substituted or unsubstituted heteroaryl group may be a polycyclic heteroaryl group. For example, the aromatic group may be a substituted or unsubstituted phenyl group, a substituted or unsubstituted dibenzofuran group, or a substituted or unsubstituted dibenzothiophene group.

A carbon in an ortho position of each phenylene group may be linked with a nitrogen at a 9-position of a corresponding carbazole moiety.

The carbazole moieties may be linked together by a linker. The linker may be a direct linkage, a substituted or unsubstituted arylene group, or a substituted or unsubstituted heteroarylene group. The substituted or unsubstituted arylene group may be arylene having 6 to 30 or 6 to 15 ring carbon atoms. The substituted or unsubstituted heteroarylene group may be heteroarylene having 2 to 30 or 2 to 20 ring carbon atoms. The substituted or unsubstituted arylene group may be a monocyclic arylene group. The substituted or unsubstituted heteroarylene group may be a polycyclic heteroarylene group. For example, the linker may be a substituted or unsubstituted phenylene group, a substituted or unsubstituted dibenzofuranylene group, or a substituted or unsubstituted dibenzothiophenylene group.

The nitrogen-containing compound may be represented by the following Formula 1, for example.

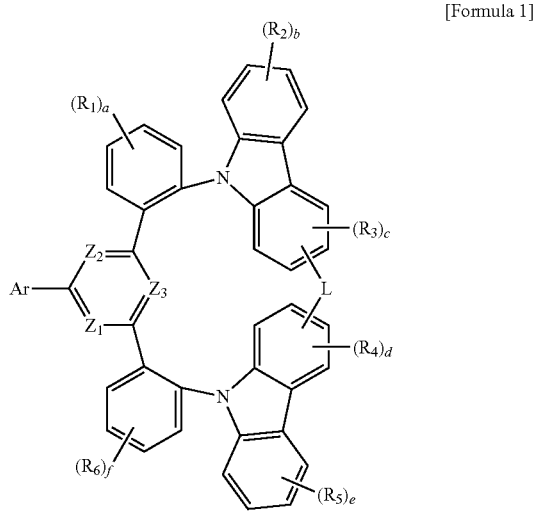

[Formula 1]

In Formula 1, $Z_1$ to $Z_3$ may each independently be C—$R_7$ or N, and at least one of $Z_1$ to $Z_3$ may be N. In an example embodiment, at least two of $Z_1$ to $Z_3$ may be N. In an example embodiment, all of $Z_1$ to $Z_3$ may be N, that is, the heterocyclic moiety may be 1,3,5-triazine.

In Formula 1, Ar may be a substituted or unsubstituted aryl group, or a substituted or unsubstituted heteroaryl group. The substituted or unsubstituted aryl group may be aryl having 6 to 30 or 6 to 15 ring carbon atoms. The substituted or unsubstituted heteroaryl group may be heteroaryl having 2 to 30 or 2 to 20 ring carbon atoms. The substituted or unsubstituted aryl group may be a monocyclic aryl group. The substituted or unsubstituted heteroaryl group may be a polycyclic heteroaryl group. For example, Ar may be a substituted or unsubstituted phenyl group, a substituted or unsubstituted dibenzofuran group, or a substituted or unsubstituted dibenzothiophene group.

In an example embodiment, in Formula 1, a carbon in the ortho position of each phenylene group is directly linked with a nitrogen of the 9-position of each carbazole moiety, and two carbazole moieties are linked together by a linker L to form a ring.

L may be a direct linkage, a substituted or unsubstituted arylene group, or a substituted or unsubstituted heteroarylene group. The substituted or unsubstituted arylene group may be arylene having 6 to 30 or 6 to 15 ring carbon atoms. The substituted or unsubstituted heteroarylene group may be heteroarylene having 2 to 30 or 2 to 20 ring carbon atoms. The substituted or unsubstituted arylene group may be a monocyclic arylene group. The substituted or unsubstituted heteroarylene group may be a polycyclic heteroarylene group. For example, L may be a substituted or unsubstituted phenylene group, a substituted or unsubstituted dibenzofuranylene group, or a substituted or unsubstituted dibenzothiophenylene group.

$R_1$ to $R_7$ may be each independently be a hydrogen atom, a deuterium atom, a halogen atom, a cyano group, a substituted or unsubstituted amino group, a substituted or unsubstituted silyl group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms. For example, $R_1$ to $R_7$ may be each independently a methyl group, a t-butyl group, or an unsubstituted phenyl group.

In an example embodiment, a, b, e and f are each independently an integer of 0 to 4, and c and d are each independently an integer of 0 to 3. For example, at least one of a to f may be 1. For example, all of a to f may be 0. In a case where any of a to f is 0, it will be understood that a hydrogen atom is bonded at the corresponding bond site. In case where a to f is 1. $R_1$ to $R_7$ may not be a hydrogen atom. In case where a is 2 or more, a plurality of $R_1$ may be the same or different from each other. In case where b is 2 or more, a plurality of $R_2$ may be the same or different from each other. In case where c is 2 or more, a plurality of $R_3$ may be the same or different from each other. In case where d is 2 or more, a plurality of $R_4$ may be the same or different from each other. In case where e is 2 or more, a plurality of $R_5$ may be the same or different from each other. In case where f is 2 or more, a plurality of $R_6$ may be the same or different from each other.

In an example embodiment, Formula 1 may be represented by, for example, one of the following Formulae 1-1 to 1-3.

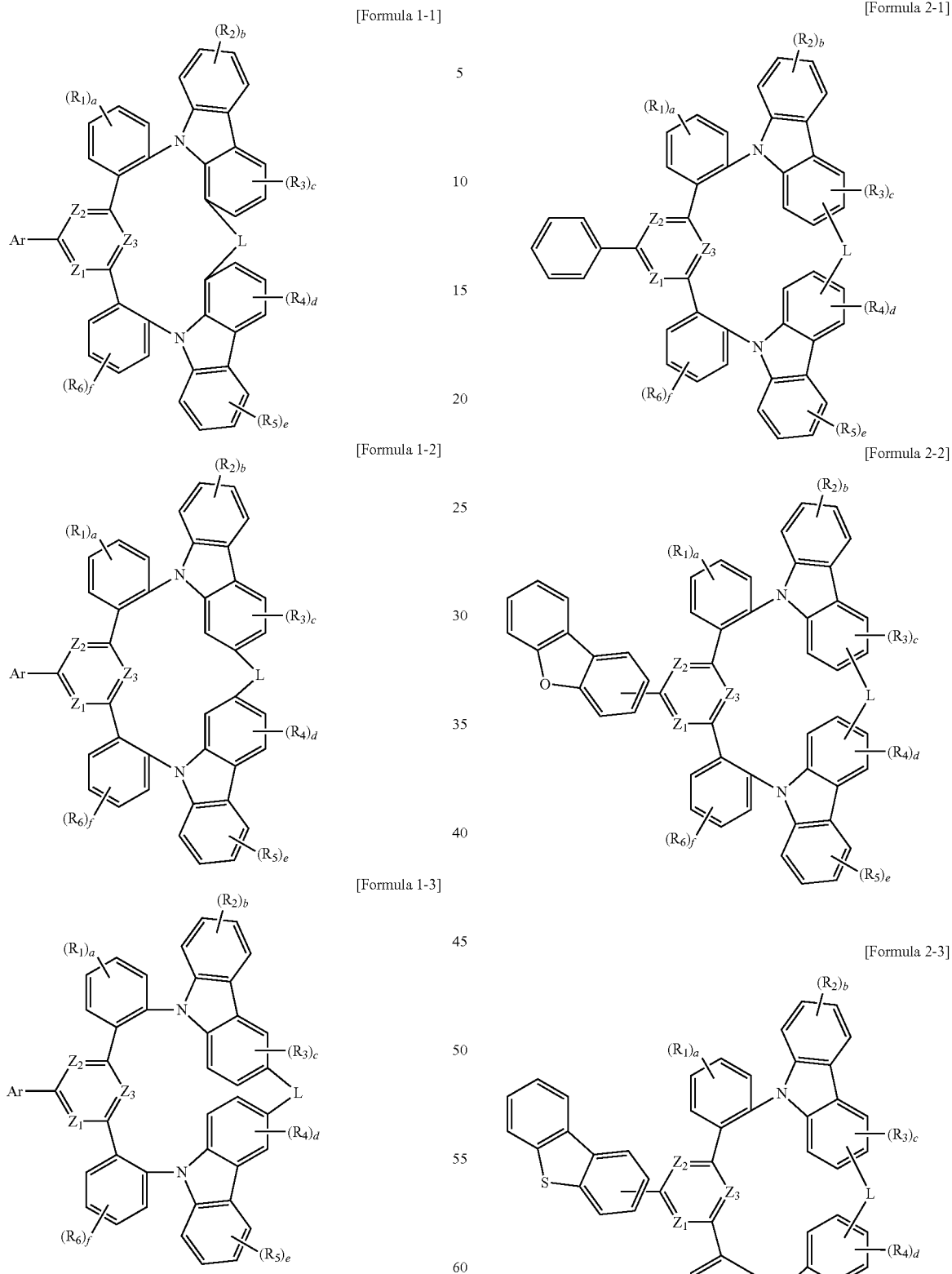
[Formula 1-1]
[Formula 1-2]
[Formula 1-3]
[Formula 2-1]
[Formula 2-2]
[Formula 2-3]
In Formulae 1-1 to 1-3, $Z_1$ to $Z_3$, Ar, L, $R_1$ to $R_7$ and a to f may be the same as defined in Formula 1.
In an example embodiment, Formula 1 may be represented by, for example, one of the following Formulae 2-1 to 2-3.

In Formulae 2-1 to 2-3, $Z_1$ to $Z_3$ may be $CR_7$ or N. In an example embodiment, at least two of $Z_1$ to $Z_3$ may be N. In an example embodiment, all of $Z_1$ to $Z_3$ may be N. In an example embodiment, at least one of a to f may be 1. In an example embodiment, all of a to f may be 0. L and $R_1$ to $R_7$ may be the same as defined in Formula 1.

In an example embodiment, Formula 1 may be represented by, for example, one of the following Formulae 3-1 to 3-4.

[Formula 3-1]

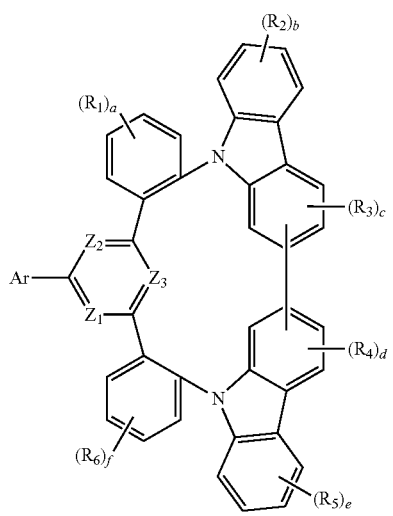

[Formula 3-2]

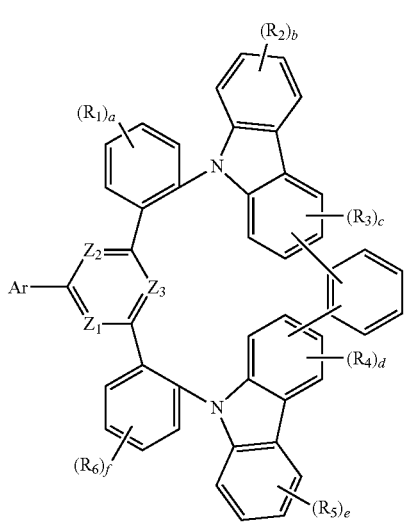

[Formula 3-3]

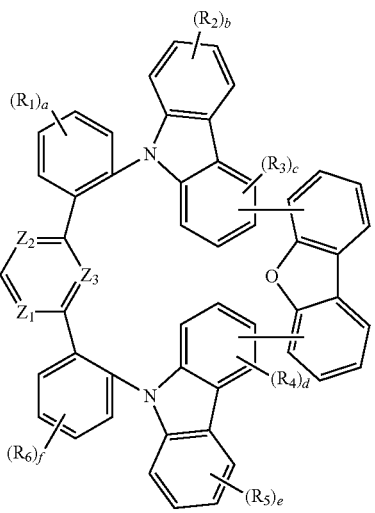

[Formula 3-4]

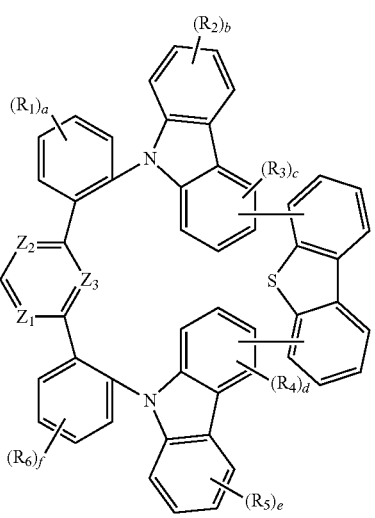

In Formulae 3-1 to 3-4, $Z_1$ to $Z_3$ may be $CR_7$ or N. In an example embodiment, at least two of $Z_1$ to $Z_3$ may be N. In an example embodiment, all of $Z_1$ to $Z_3$ may be N. In an example embodiment, at least one of a to f may be 1. In an example embodiment, all of a to f may be 0. Ar and $R_1$ to $R_7$ may be the same as defined in Formula 1.

In an example embodiment, Formulae 3-3 and 3-4 may be represented by the following Formulae 4-1 and 4-2, respectively.

[Formula 4-1]

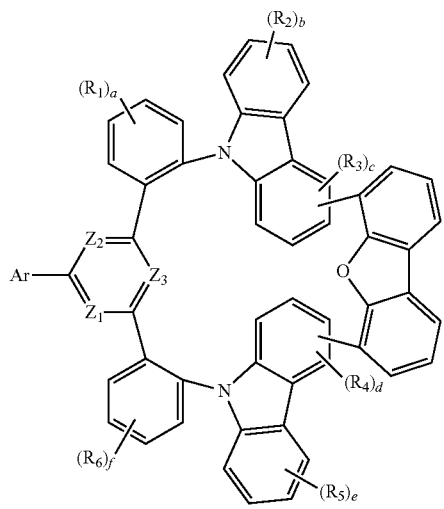

[Formula 4-2]

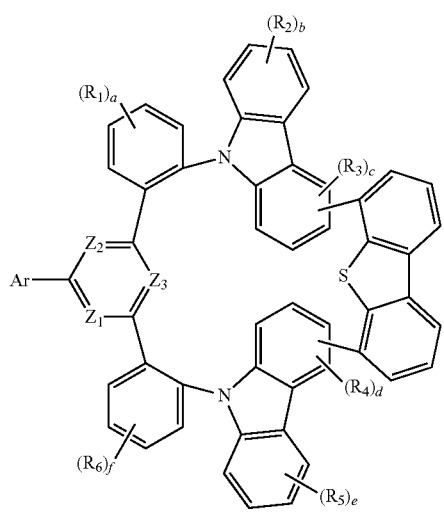

In Formulae 4-1 and 4-2, $Z_1$ to $Z_3$ may be $CR_7$ or N. In an example embodiment, at least two of $Z_1$ to $Z_3$ may be N. In an example embodiment, all of $Z_1$ to $Z_3$ may be N. In an example embodiment, at least one of a to f may be 1. In an example embodiment, all of a to f may be 0. Ar and $R_1$ to $R_7$ may be the same as defined in Formula 1.

In an example embodiment, the nitrogen-containing compound, e.g., a compound represented by Formula 1, may be selected from compounds in the following Compound Group 1.

[Compound Group 1]

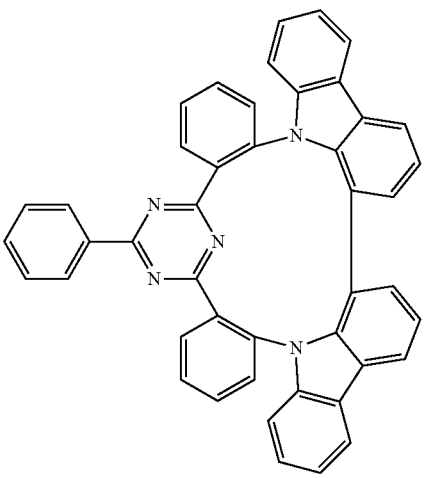

1

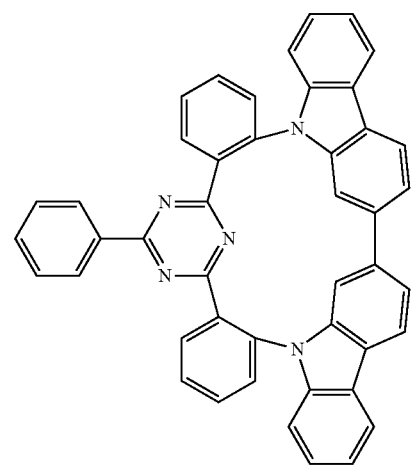

2

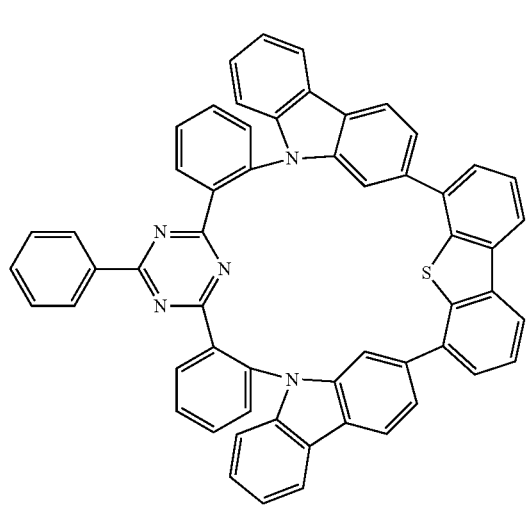

3

4
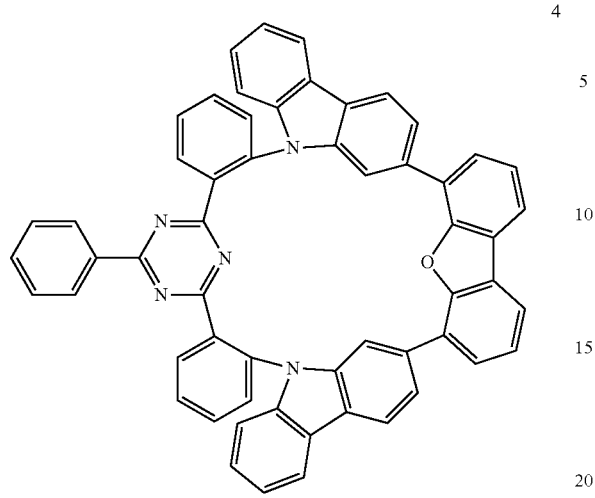
5
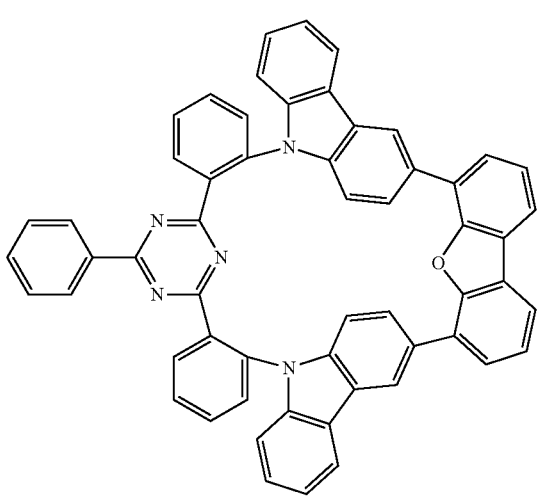
6
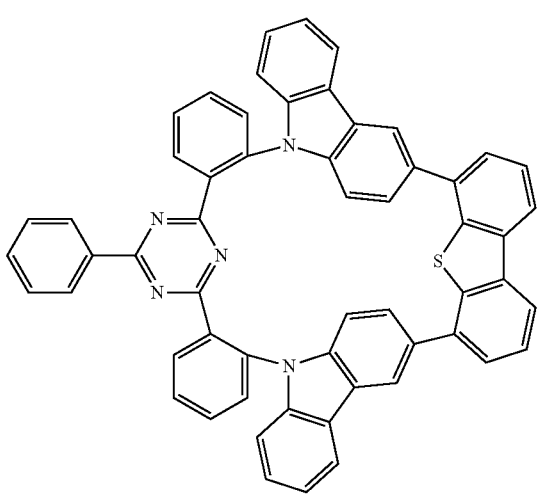
7
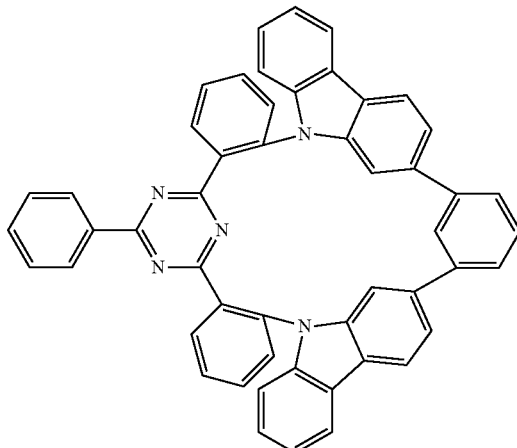
8
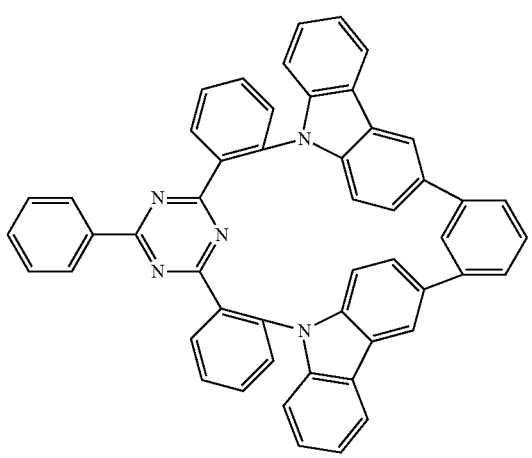
9
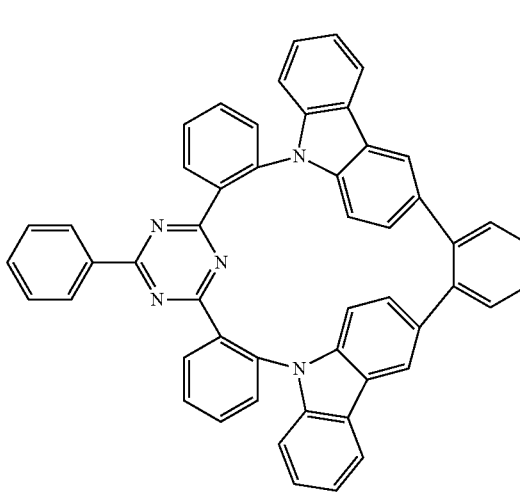

10
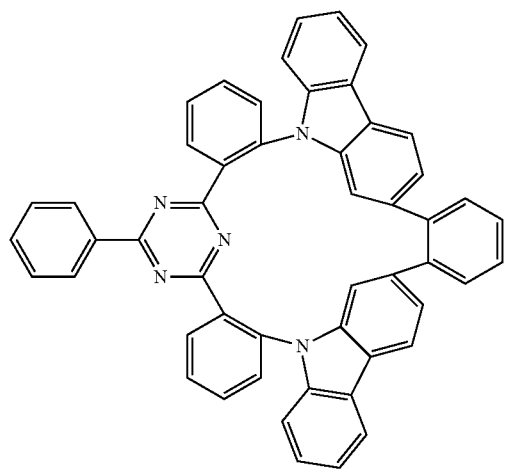
11
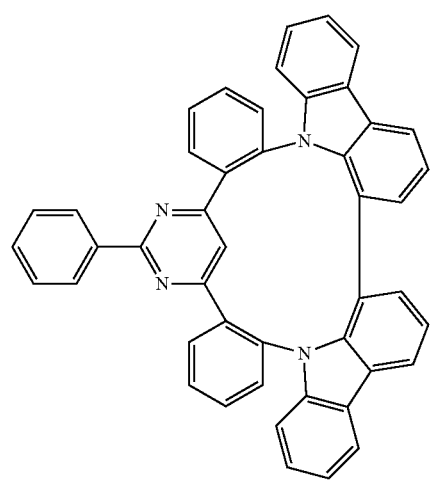
12
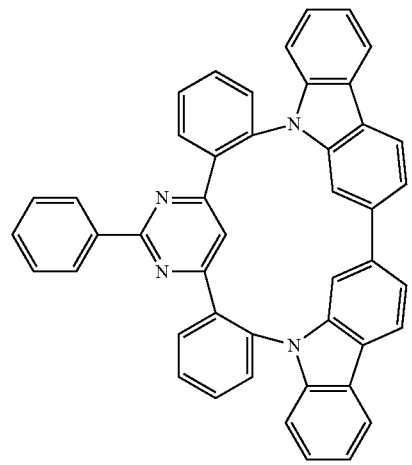
13
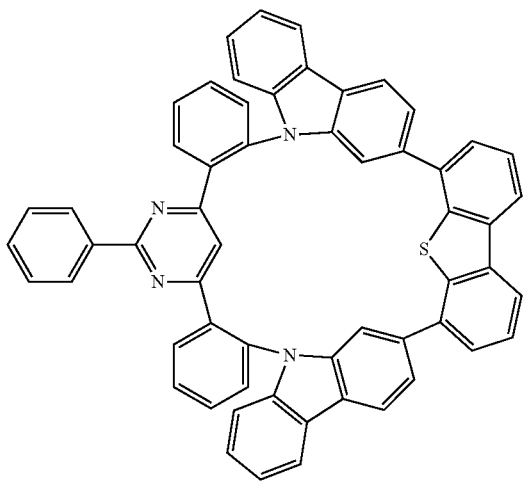
14
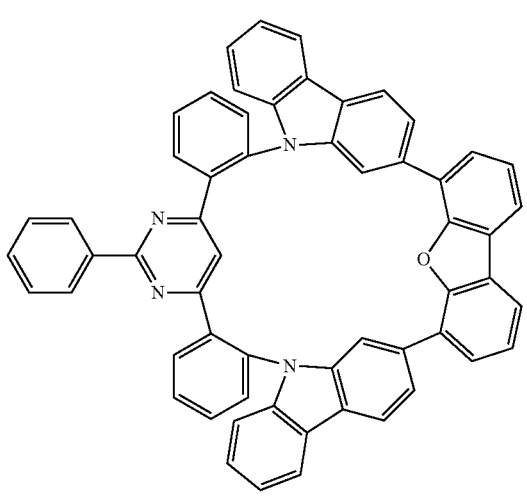
15
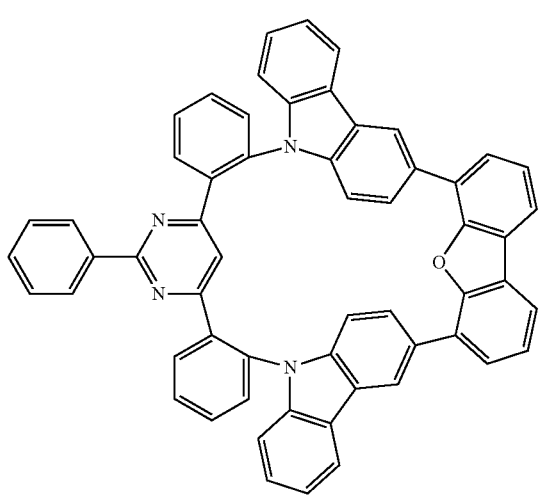

16
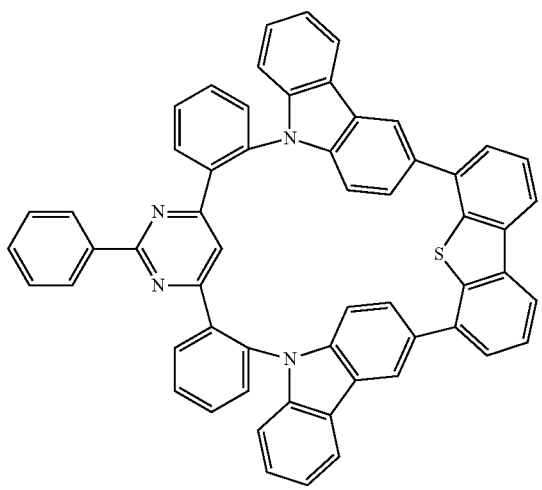
19
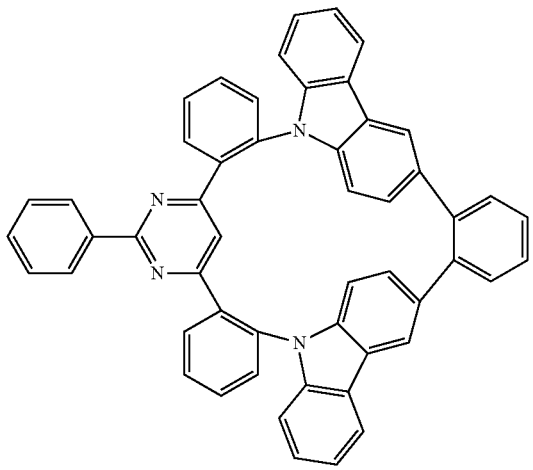
17
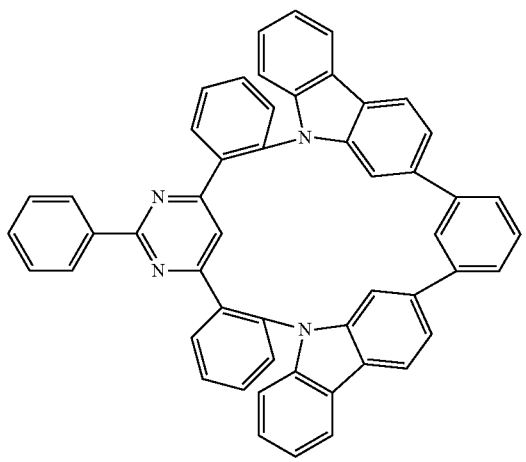
20
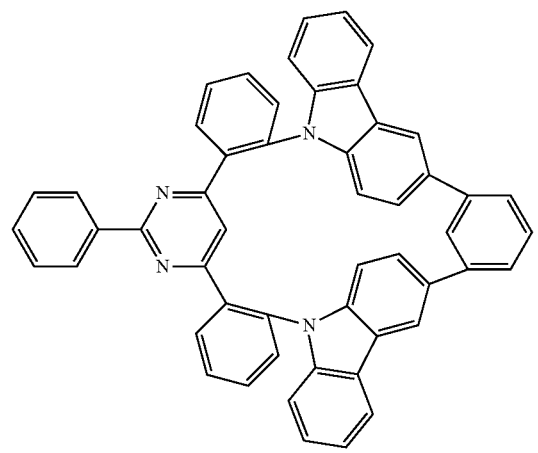
18
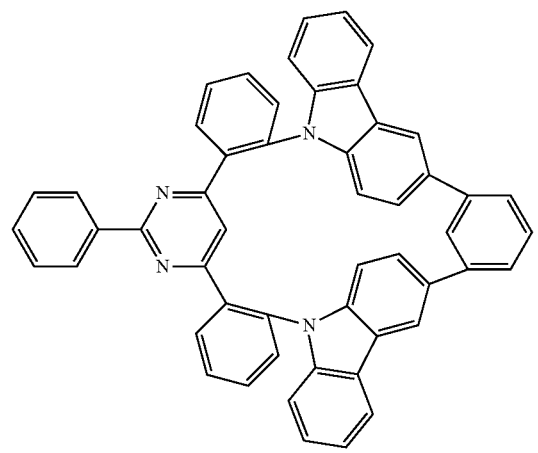
21
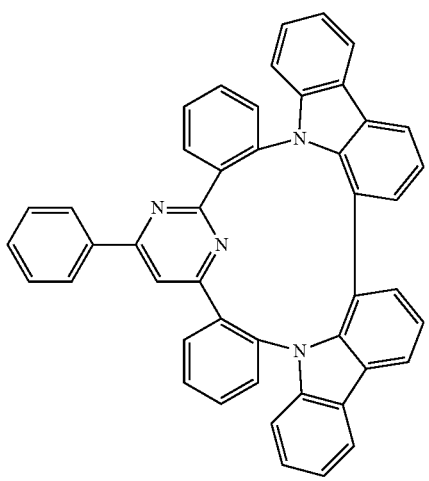

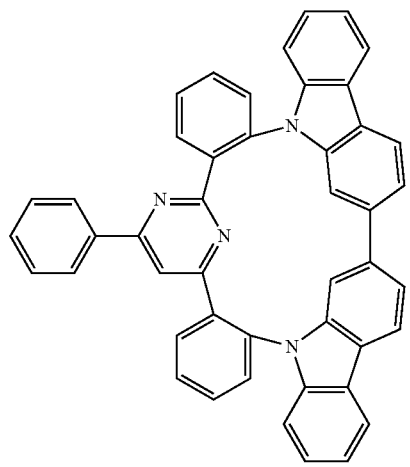
22
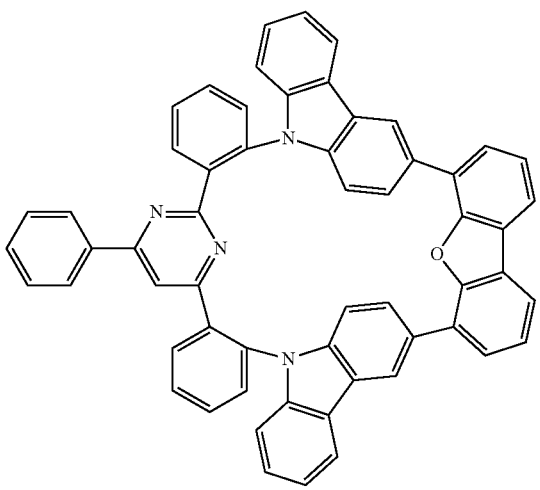
25
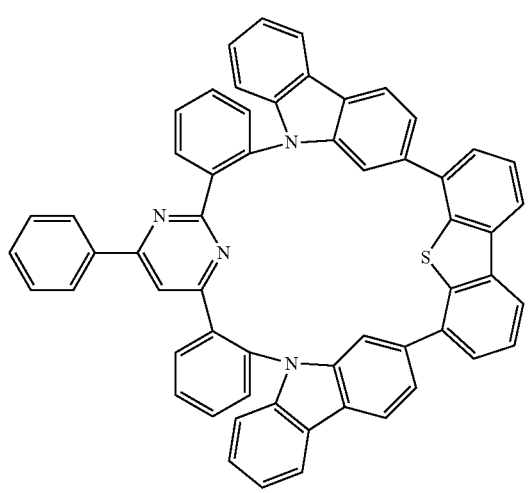
23
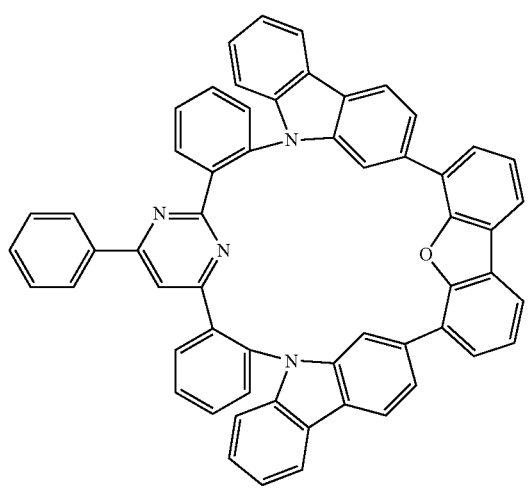
24
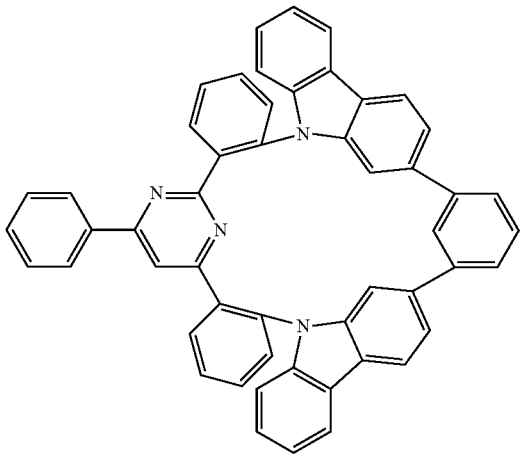
26
27

28
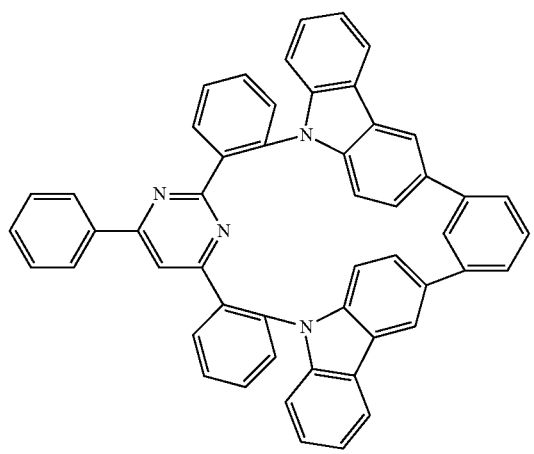
31
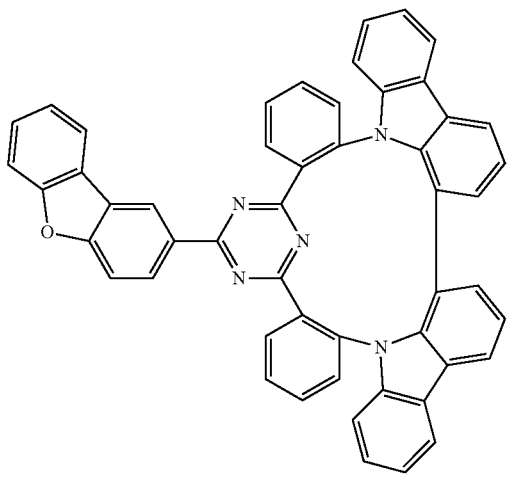
29
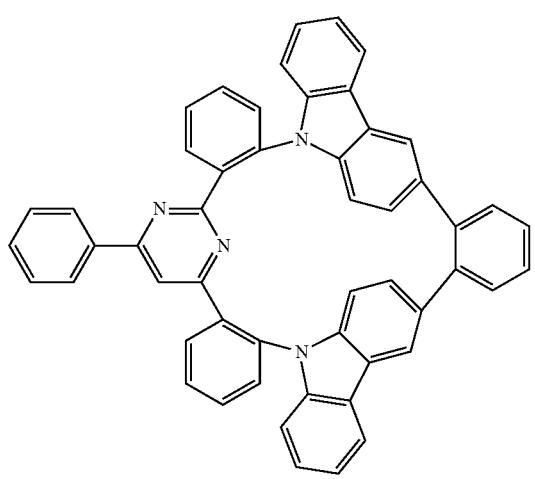
32
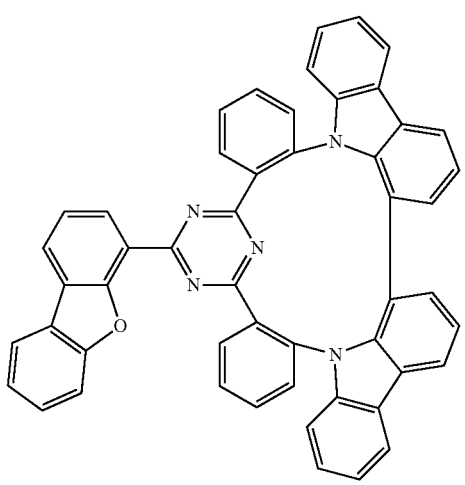
30
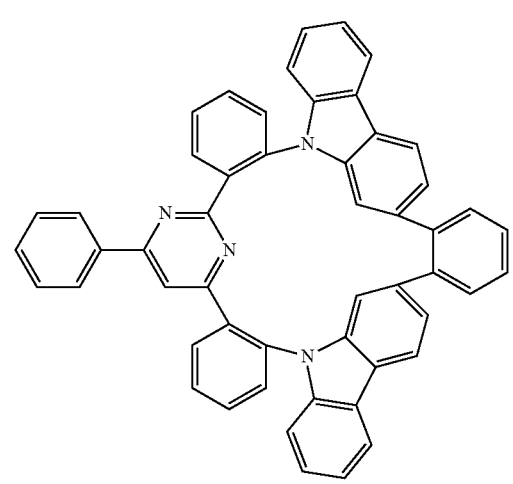
33
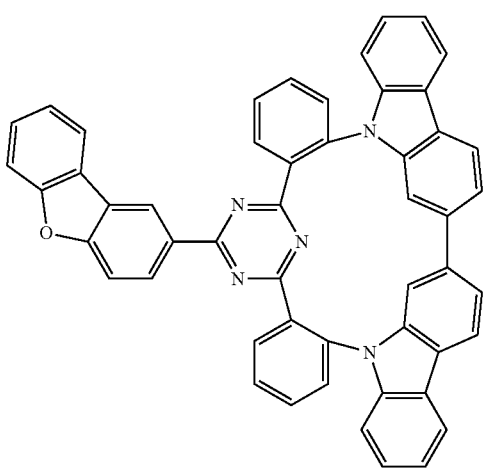

34
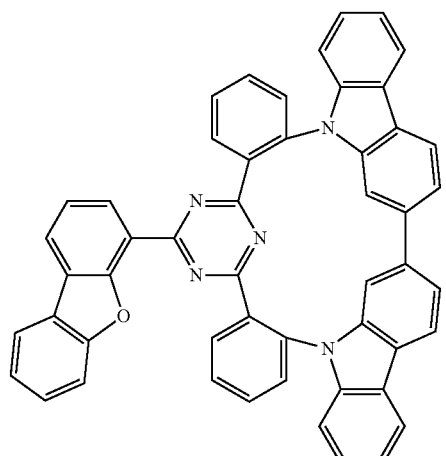
35
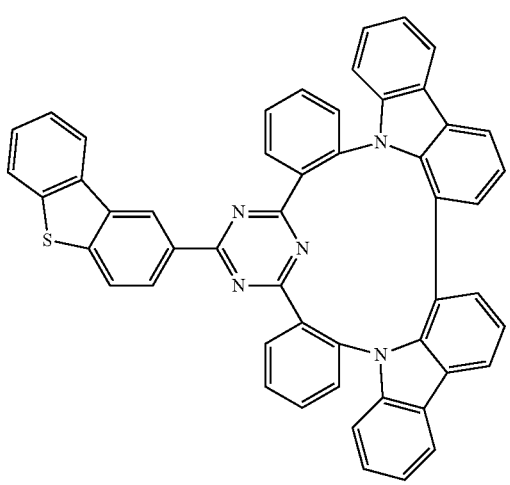
36
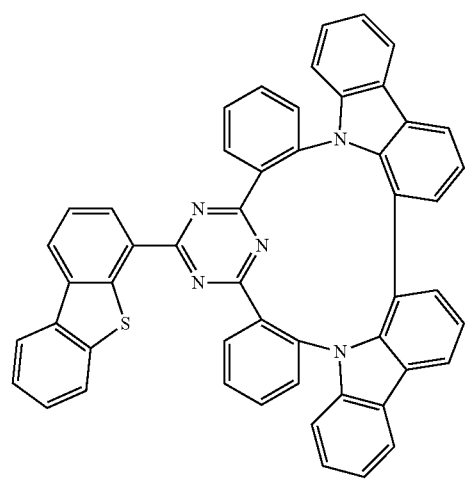
37
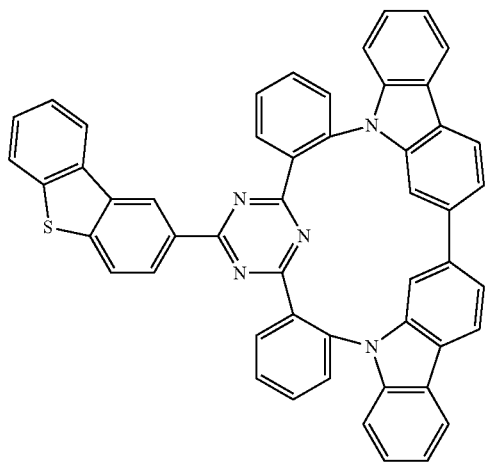
38
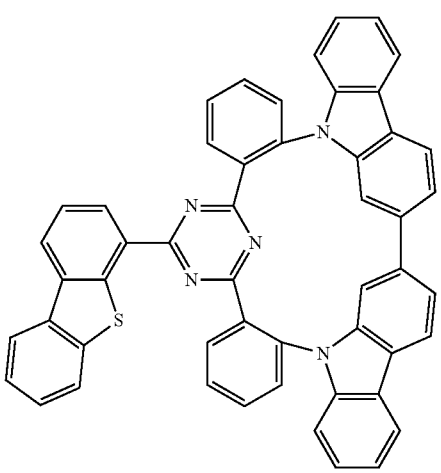
39
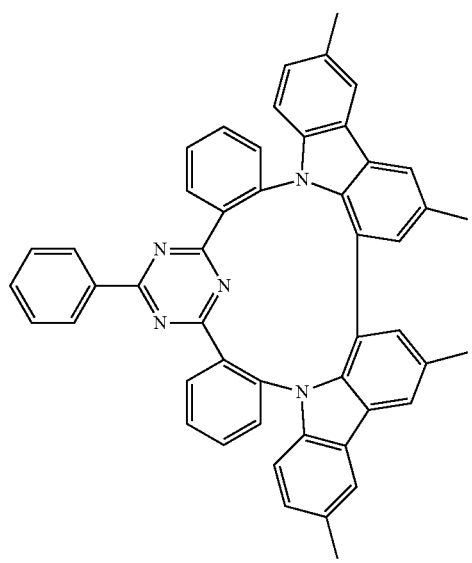

40
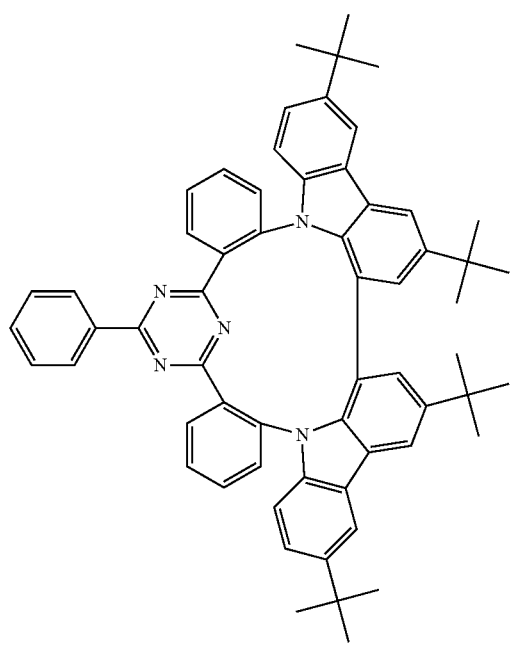
42
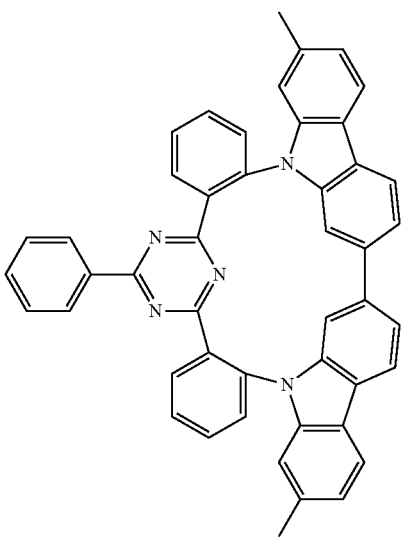
41
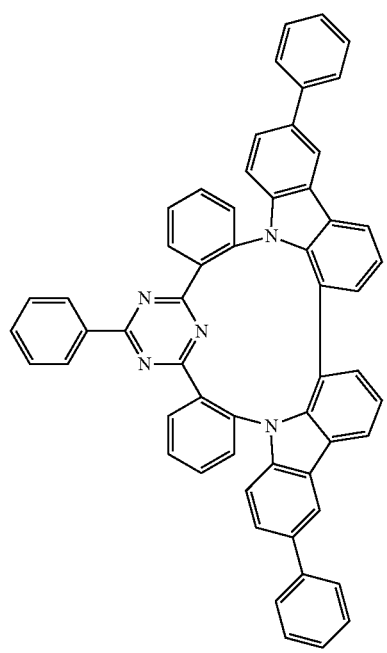
43
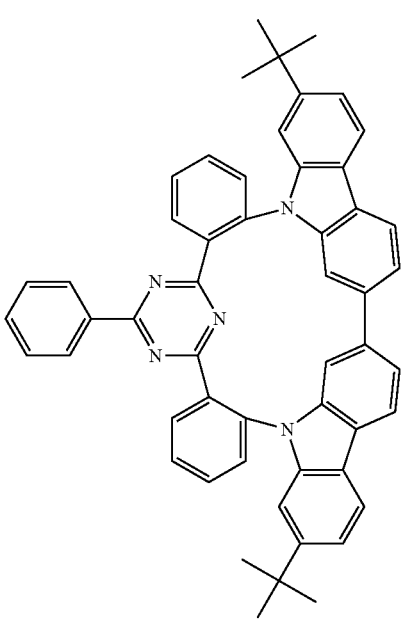

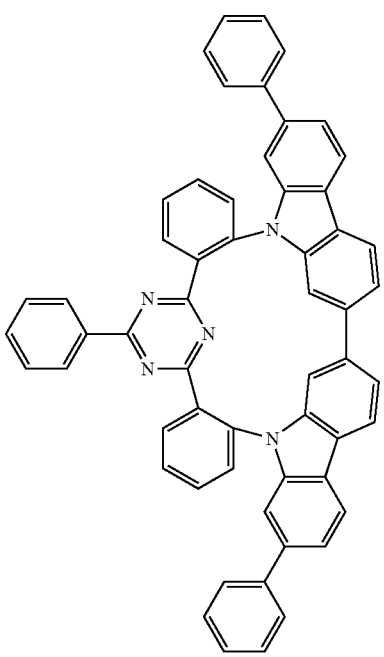

The emission layer EML may include one or more nitrogen-containing compounds, for example, one or more different compounds represented by Formula 1. The emission layer EML may further include a material in addition to the nitrogen-containing compound.

The emission layer EML may include a host and a dopant, and the dopant may include the nitrogen-containing compound. The nitrogen-containing compound represented by Formula 1 may be included in the emission layer EML as a dopant. The nitrogen-containing compound represented by Formula 1 may be included in the emission layer EML as a dopant for thermally activated delayed fluorescence. The emission layer EML including the nitrogen-containing compound may emit blue light having a wavelength range shorter than about 490 nm. For example, the nitrogen-containing compound may be included in the emission layer EML as a dopant for emitting blue light having a wavelength range of about 440 nm to about 490 nm, or about 465 nm to about 485 nm.

The emission layer EML may include a host and a dopant, and the host may include the nitrogen-containing compound.

In another example embodiment, the emission layer EML may employ a suitable host material, for example, one or more of bis[2-(diphenylphosphino)phenyl] ether oxide (DPEPO), 4,4'-bis(carbazol-9-yl)biphenyl (CBP), 1,3-bis(carbazol-9-yl)benzene (mCP), 2,8-bis(diphenylphosphoryl)dibenzo[b,d]furan (PPF), 4,4',4''-tris(carbazol-9-yl)-triphenylamine (TcTa), or 1,3,5-tris(N-phenylbenzimidazole-2-yl)benzene (TPBi). For example, the emission layer EML may further include, as a host material, tris(8-hydroxyquinolino)aluminum (Alq3), 4,4'-bis(N-carbazolyl)-1,1'-biphenyl (CBP), poly(N-vinylcarbazole) (PVK), 9,10-di(naphthalen-2-yl)anthracene (ADN), 4,4',4''-tris(carbazol-9-yl)-triphenylamine (TCTA), 1,3,5-tris(N-phenylbenzimidazol-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), bis[2-(diphenylphosphino)phenyl]ether oxide (DPEPO), hexaphenyl cyclotriphosphazene (CP1), 1,4-bis(triphenylsilyl)benzene (UGH2), hexaphenylcyclotrisiloxane (DPSiO$_3$), octaphenylcyclotetrasiloxane (DPSiO$_4$), 2,8-bis(diphenylphosphoryl)dibenzofuran (PPF), etc.

For example, the emission layer EML may further include, as a dopant material, at least one of N,N,N',N'-tetraphenyl-pyrene-1,6-diamine (TPD), 4,4'-bis(2-(9-ethyl-9H-carbazol-3-yl)vinyl)-1,1'-biphenyl (BCzVBi), 4,4'-bis(9-ethyl-3-carbazovinylene)-1,1'-biphenyl, 10-phenyl-10H, 10'H-spiro[acridine-9,9'-anthracene]-10'-one (ACRSA), 3,4,5,6-tetra-9H-carbazol-9-yl-1,2-benzenedicarbonitrile (4CzPN), 2,4,5,6-tetra-9H-carbazol-9-yl-isophthalonitrile (4CzIPN), bis[4-(9,9-dimethyl-9,10-dihydroacridine)phenyl]sulfone (DMAC-DPS), or 2-phenoxazine-4,6-diphenyl-1,3,5-triazine (PSZ-TRZ). The emission layer EML may further include, as a known dopant material, styryl derivatives (for example, 1,4-bis[2-(3-N-ethylcarbazolyl)vinyl]benzene (BCzVB), 4-(di-p-tolylamino)-4'-[(di-p-tolylamino)styryl]stilbene (DPAVB), N-(4-((E)-2-(6-((E)-4-(diphenylamino)styryl)naphthalen-2-yl)vinyl)phenyl)-N-phenylbenzenamine (N-BDAVBi)), perylene and the derivatives thereof (for example, 2,5,8,11-tetra-t-butylperylene (TBP)), pyrene and the derivatives thereof (for example, 1,1-dipyrene, 1,4-dipyrenylbenzene, 1,4-bis(N,N-diphenylamino)pyrene), etc.

The emission layer EML may emit blue light. The emission layer EML may emit fluorescent light. The emission layer EML may emit light by thermally activated delayed fluorescence.

The electron transport region ETR may be provided on the emission layer EML. The electron transport region ETR may include one or more of a hole blocking layer HBL, an electron transport layer ETL, or an electron injection layer EIL.

The electron transport region ETR may have a single layer formed using a single material, a single layer formed using a plurality of different materials, or a multilayer structure having a plurality of layers formed using a plurality of different materials. For example, the electron transport region ETR may have a single layer structure of an electron injection layer EIL or an electron transport layer ETL, or a single layer structure formed using an electron injection material and an electron transport material. For example, the electron transport region ETR may have a single layer structure having a plurality of different materials, or a laminated structure of electron transport layer ETL/electron injection layer EIL, or hole blocking layer HBL/electron transport layer ETL/electron injection layer EIL, laminated in order from the emission layer EML. The thickness of the electron transport region ETR may be, for example, from about 300 Å to about 1,500 Å, or from about 350 Å to about 500 Å.

The electron transport region ETR may be formed using various methods such as a vacuum deposition method, a spin coating method, a cast method, a Langmuir-Blodgett (LB) method, an inkjet printing method, a laser printing method, and a laser induced thermal imaging (LITI) method.

In the case that the electron transport region ETR includes the electron transport layer ETL, the electron transport region ETR may include anthracene derivatives. The electron transport region may include, for example, tris(8-hydroxyquinolinato)aluminum (Alq$_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-yl)phenyl)-9,10-dinaphthylanthracene, 1,3,5-tri(1-phenyl-1H-benzo[d]imidazol-2-yl)phenyl (TPBi), 2,9-dimethyl-4,7-diphenyl-1,10-phenanthroline (BCP), 4,7-diphenyl-1,10- phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-Biphenyl-4-olato) aluminum (BAlq), beryllium bis(benzoquinolin-10-olate) (Bebq$_2$), 9,10-di(naphthalen-2-yl)anthracene (ADN) and a mixture thereof. The thickness of the electron transport layer ETL may be, for example, from about 100 Å to about 1,000 Å, or from about 150 Å to about 500 Å. When the thickness of the electron transport layer ETL satisfies the above-described range, satisfactory electron transport properties may be obtained without substantial increase of a driving voltage.

When the electron transport region ETR includes the electron injection layer EIL, the electron transport region ETR may use LiF, lithium quinolate (LIQ), Li$_2$O, BaO, NaCl, CsF, a metal in lanthanides such as Yb, or a metal halide such as RbCl and RbI. The electron injection layer EIL may be formed using a mixture material of an electron transport material and an insulating organo-metal salt. The organo-metal salt may be a material having an energy band gap of about 4 eV or more. For example, the organo-metal salt may include, for example, a metal acetate, a metal benzoate, a metal acetoacetate, a metal acetylacetonate, or a metal stearate. The thickness of the electron injection layer EIL may be from about 1 Å to about 100 Å, for example, from about 3 Å to about 90 Å. In the case that the thickness of the electron injection layer EIL satisfies the above described range, satisfactory electron injection properties may be obtained without inducing a substantial increase in driving voltage.

The electron transport region ETR may include a hole blocking layer HBL, as described above. The hole blocking layer HBL may include, for example, one or more of 2,9-dimethyl-4,7-diphenyl-1,10-phenanthroline (BCP) or 4,7-diphenyl-1,10-phenanthroline (Bphen).

The second electrode EL2 may be on the electron transport region ETR. The second electrode EL2 may be a common electrode or a cathode. The second electrode EL2 may be a transmissive electrode, a transflective electrode or a reflective electrode. In the case that the second electrode EL2 is the transmissive electrode, the second electrode EL2 may be formed using transparent metal oxides, for example, ITO, IZO, ZnO, ITZO, etc. In the case that the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). The second electrode EL2 may have a multilayer structure including a reflective layer or a transflective layer formed using the above-described materials and a transparent conductive layer formed using ITO, IZO, ZnO, ITZO, etc.

The second electrode EL2 may be connected with an auxiliary electrode. In the case that the second electrode EL2 is connected with the auxiliary electrode, the resistance of the second electrode EL2 may be decreased.

In the organic electroluminescence device 10, according to the application of a voltage to each of the first electrode EL1 and the second electrode EL2, holes injected from the first electrode EL1 may move via the hole transport region HTR to the emission layer EML, and electrons injected from the second electrode EL2 may move via the electron transport region ETR to the emission layer EML. The electrons and the holes may recombine in the emission layer EML to generate excitons, and light may be emitted via the transition of the excitons from an excited state to a ground state.

In an example embodiment, the organic electroluminescence device 10 including the nitrogen-containing compound as a material for the emission layer may exhibit excellent emission efficiency.

According to an example embodiment, a nitrogen-containing compound is represented by Formula 1. For example, the nitrogen-containing compound according to an example embodiment may be a compound in Compound Group 1. In an example embodiment, the nitrogen-containing compound may be utilized as a material for an organic electroluminescence device.

In an example embodiment, the nitrogen-containing compound may have an absolute value of the difference between the singlet energy level and the triplet energy level of about 0.2 eV or less, about 0.1 eV or less, or about 0.05 eV or less. In an example embodiment, the nitrogen-containing compound may be used as a material for thermally activated delayed fluorescence. The nitrogen-containing compound according to an example embodiment may be used as a material for an organic electroluminescence device exhibiting increased emission efficiency.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Synthesis Examples

A nitrogen-containing compound according to an example embodiment may be synthesized, for example, as follows.

1. Synthesis of Compound 1

Compound 1, a nitrogen-containing compound according to an example embodiment, may be synthesized, for example, as follows.

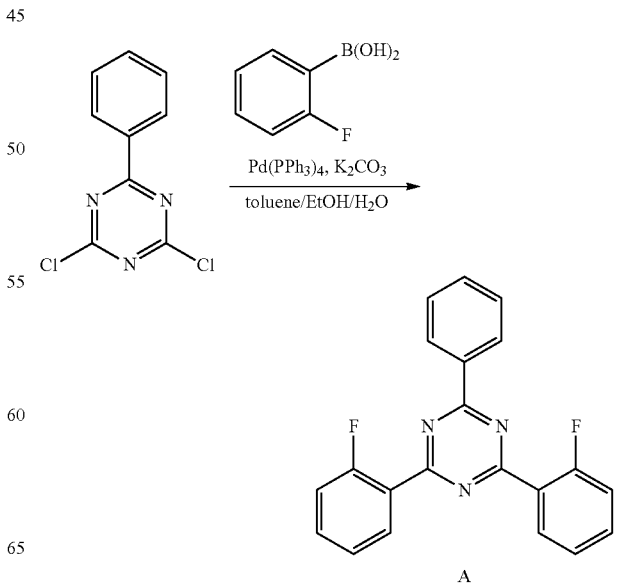

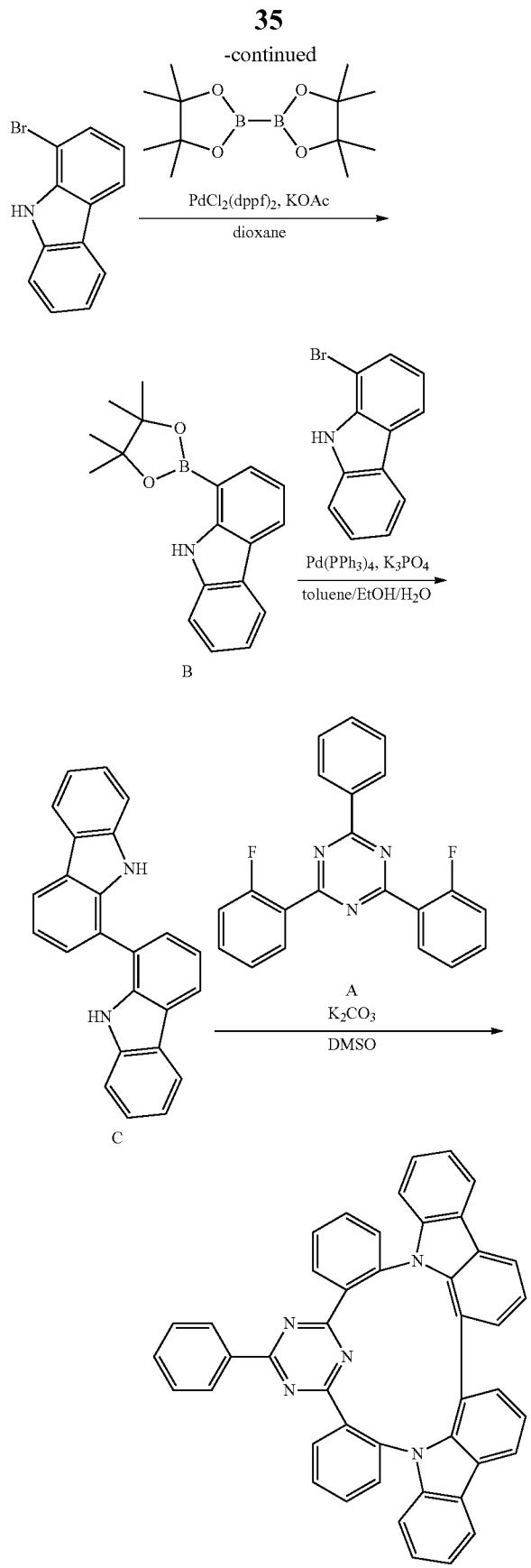

(Synthesis of Intermediate A)

Under an argon (Ar) atmosphere, 2,4-dichloro-6-phenyl-1,3,5-triazine (10.00 g), 2-fluorophenylboronic acid (12.38 g), Pd(PPh$_3$)$_4$ (2.56 g) and potassium carbonate (24.46 g) were dissolved in a deaerated solvent mixture of toluene/ethanol/water (10:1:2) (250 mL) in an 1 L three neck flask, and the mixture was heated and stirred at about 80° C. for about 10 hours. After adding water to the reactant, the mixture was extracted with CH$_2$Cl$_2$. Organic layers were combined and dried over MgSO$_4$, and solvents were evaporated under reduced pressure. The crude product thus obtained was purified by recrystallization to obtain 10.69 g (yield 70%) of Intermediate A. The molecular weight of Intermediate A measured by FAB-MS was 345.

(Synthesis of Intermediate B)

Under an argon (Ar) atmosphere, 1-bromo-9H-carbazole (5.00 g), bis(pinacolato)diboron (5.16 g), PdCl$_2$(dppf) (1.66 g) and potassium acetate (3.99 g) were dissolved in a deaerated 1,4-dioxane (100 mL) in a 500 mL three neck flask, and the mixture was heated and stirred at about 90° C. for about 8 hours. After cooling in the air, water was added and the mixture was extracted with CH$_2$Cl$_2$. Organic layers were combined and dried over MgSO$_4$, and solvents were evaporated under reduced pressure. The crude product thus obtained was purified by silica gel column chromatography to obtain 4.65 g (yield 78%) of Intermediate B. The molecular weight of Intermediate B measured by FAB-MS was 293.

(Synthesis of Intermediate C)

Under an argon (Ar) atmosphere, Intermediate B (4.00 g), 1-bromo-9H-carbazole (3.35 g), Pd(PPh$_3$)$_4$ (0.79 g) and tripotassium phosphate (5.79 g) were dissolved in a deaerated solvent mixture of toluene/ethanol/water (10:1:2) (70 mL) in a 200 mL three neck flask, and the mixture was heated and stirred at about 80° C. for about 12 hours. After adding water to the reactant, the mixture was extracted with CH$_2$Cl$_2$. Organic layers were combined and dried over MgSO$_4$, and solvents were evaporated under reduced pressure. The crude product thus obtained was purified by silica gel column chromatography to obtain 3.72 g (yield 82%) of Intermediate C. The molecular weight of Intermediate C measured by FAB-MS was 332.

(Synthesis of Compound 1)

Under an argon (Ar) atmosphere, Intermediate C (3.00 g), Intermediate A (3.12 g) and K$_2$CO$_3$ (6.24 g) were dissolved in a deaerated DMSO (500 mL) in an 1 L three-neck flask, and the mixture was stirred at about 150° C. for about 36 hours. After cooling to room temperature, the reactant was concentrated to a volume of about 50 mL and the concentrated reactant was added to water (1,000 mL), followed by stirring. The resulting precipitate was recovered by suction filtration, and then dissolved in CH$_2$Cl$_2$ (500 mL). The resultant was dried over MgSO$_4$, and solvents were evaporated under reduced pressure. The crude product thus obtained was purified by recrystallization to obtain 1.61 g (yield 28%) of Compound 1. The molecular weight of Compound 1 measured by FAB-MS was 637.

2. Synthesis of Compound 4

Compound 4, the nitrogen-containing compound according to an example embodiment, may be synthesized, for example, as follows.

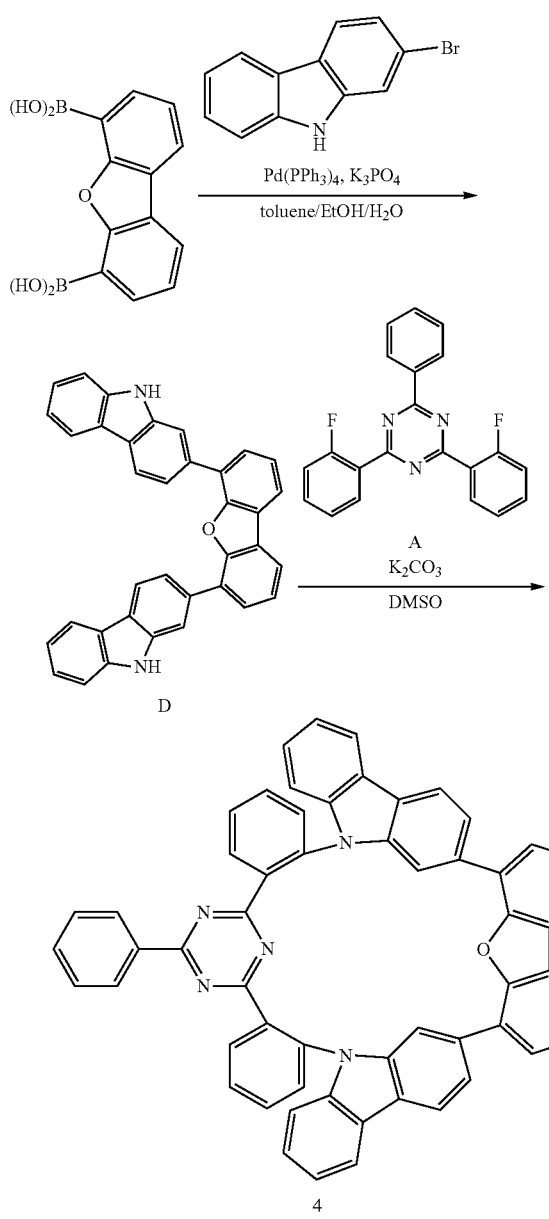

4

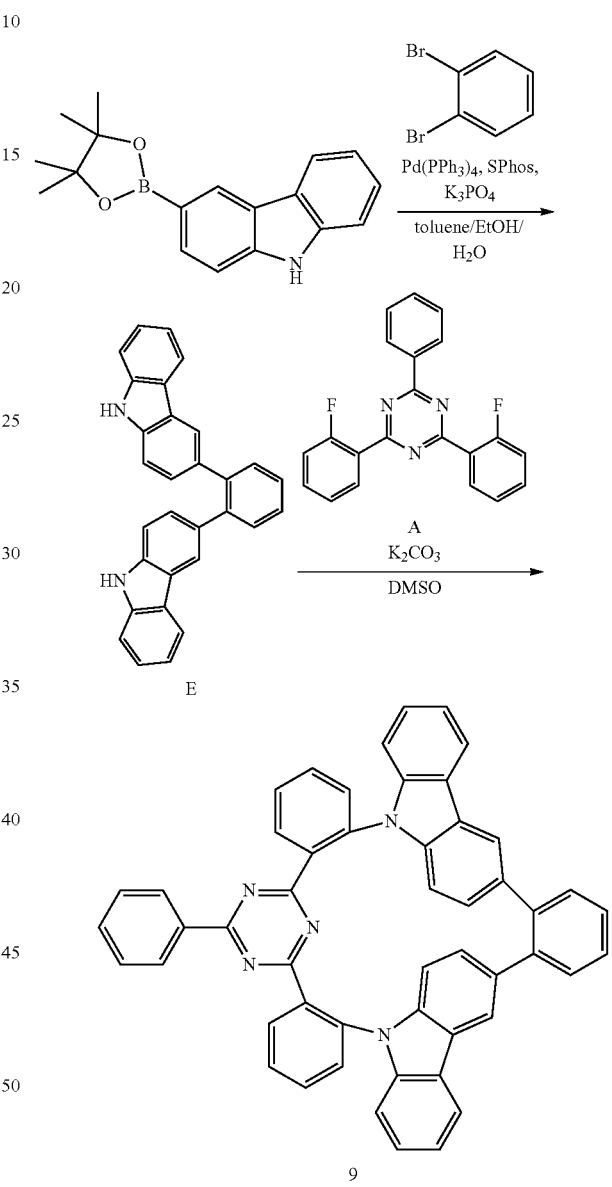

9 followed by stirring. The resulting precipitate was recovered by suction filtration and purified by recrystallization to obtain 1.11 g (yield 23%) of Compound 4. The molecular weight of Compound 4 measured by FAB-MS was 803.

3. Synthesis of Compound 9

Compound 9, the nitrogen-containing compound according to an example embodiment, may be synthesized, for example, as follows.

(Synthesis of Intermediate D)

Under an argon (Ar) atmosphere, dibenzo[b,d]furan-4,6-diyldiboronic acid (3.00 g), 2-bromo-9H-carbazole (5.77 g), Pd(PPh$_3$)$_4$ (0.68 g) and K$_3$PO$_4$ (9.96 g) were dissolved in a deaerated solvent mixture of toluene/ethanol/water (10:1:2) (70 mL) in a 200 mL three-neck flask, and the mixture was heated and stirred at about 80° C. for about 12 hours. After the reaction, the resulting precipitate was recovered by suction filtration and purified by recrystallization to obtain 3.57 g (yield 61%) of Intermediate D. The molecular weight of Intermediate D measured by FAB-MS was 498.

(Synthesis of Compound 4)

Under an argon (Ar) atmosphere, Intermediate D (3.00 g), Intermediate A (2.08 g) and K$_2$CO$_3$ (4.16 g) were dissolved in a deaerated DMSO (300 mL) in an 1 L three-neck flask, and the mixture was heated and stirred at about 150° C. for about 36 hours. After cooling to room temperature, the reactant was concentrated to a volume of about 30 mL and the concentrated reactant was added to water (500 mL), (Synthesis of Intermediate E)

Under an argon (Ar) atmosphere, (9H-carbazol-3-yl)boronic acid pinacol ester (10.00 g), 1,2-dibromobenzene (4.02 g), Pd(PPh$_3$)$_4$ (1.97 g), 2-dicyclohexylphosphino-2',6'-dimethoxybiphenyl (1.40 g) and K$_3$PO$_4$ (14.48 g) were dissolved in a deaerated solvent mixture of toluene/ethanol/water (10:1:2) (170 mL) in a 500 mL three-neck flask, and the mixture was heated and stirred at about 80° C. for about 20 hours. After adding water to the reactant, the mixture was extracted with CH$_2$Cl$_2$. Organic layers were combined and dried over MgSO$_4$, and solvents were evaporated under reduced pressure. The crude product thus obtained was purified by silica gel column chromatography to obtain 4.53 g (yield 65%) of Intermediate E. The molecular weight of Intermediate E measured by FAB-MS was 408.

(Synthesis of Compound 9)

Under an argon (Ar) atmosphere, Intermediate E (4.00 g), Intermediate A (3.38 g) and K$_2$CO$_3$ (6.77 g) were dissolved in a deaerated DMF (500 mL) in an 1 L three-neck flask, and the mixture was heated and stirred at about 150° C. for about 36 hours. After cooling to room temperature, the reactant was concentrated to a volume of about 50 mL and the concentrated reactant was added to water (500 mL), followed by stirring. The resulting precipitate was recovered by suction filtration and purified by recrystallization to obtain 1.75 g (yield 25%) of Compound 9. The molecular weight of Compound 9 measured by FAB-MS was 713.

4. Synthesis of Compound 21

Compound 21 was synthesized by conducting the same synthetic method of Compound 1 except for using 2,4-dichloro-6-phenylpyrimidine instead of 2,4-dichloro-6-phenyl-1,3,5-triazine in the synthetic method of Compound 1.

5. Synthesis of Compound 32

Compound 32 was synthesized by conducting the same synthetic method of Compound 1 except for using 2,4-dichloro-6-(dibenzofuran-4-yl)-1,3,5-triazine instead of 2,4-dichloro-6-phenyl-1,3,5-triazine in the synthetic method of Compound 1.

6. Synthesis of Compound 40

Compound 40 was synthesized by conducting the same synthetic method of Compound 1 except for using 1-bromo-3,6-di-tert-butyl-9H-carbazole instead of 1-bromo-9H-carbazole in the synthetic method of Compound 1.

Examples

S1 energy level and T1 energy level of Example Compounds 1, 4, 9, 21, 32 and 40 and Comparative Compounds X1 and X2 were measured by a nonempirical molecular orbital method. Specifically. calculation was made using Gaussian 09 (Gaussian, Inc.) for B3LYP as functional, and 6-31G(d) as basis function.

[Example Compounds]

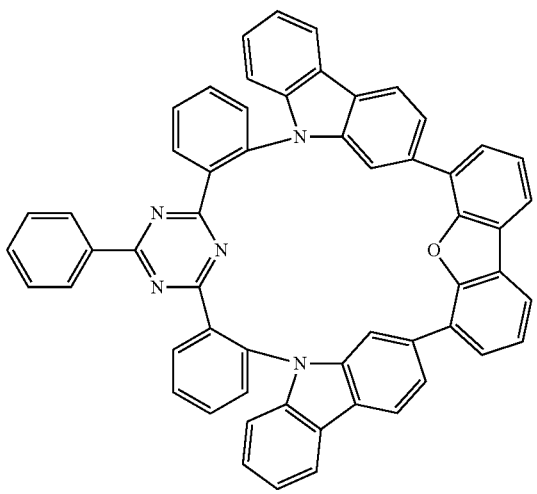

4

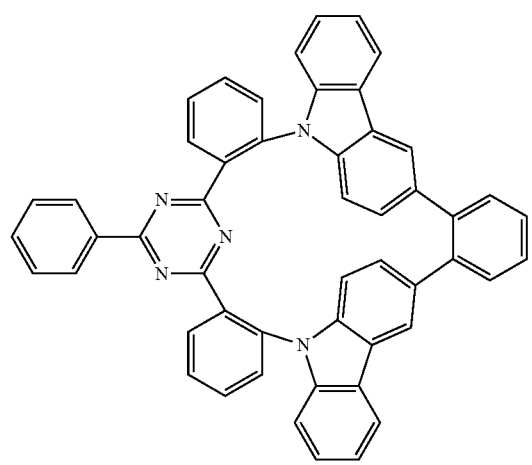

9

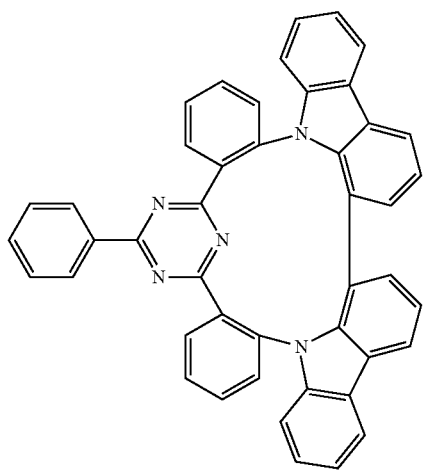

1

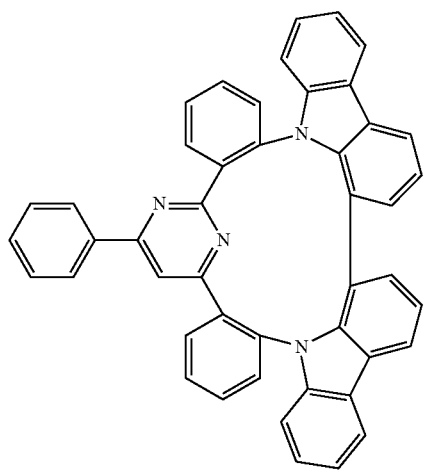

21

-continued

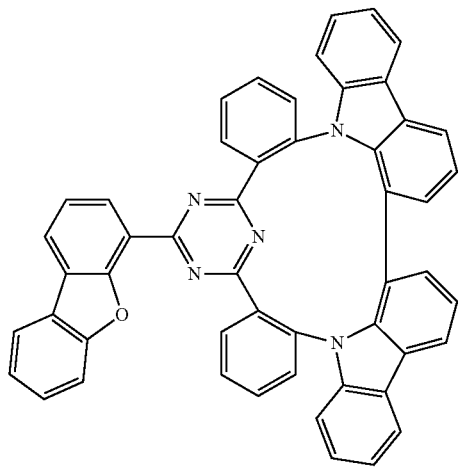

32

[Comparative Compounds]

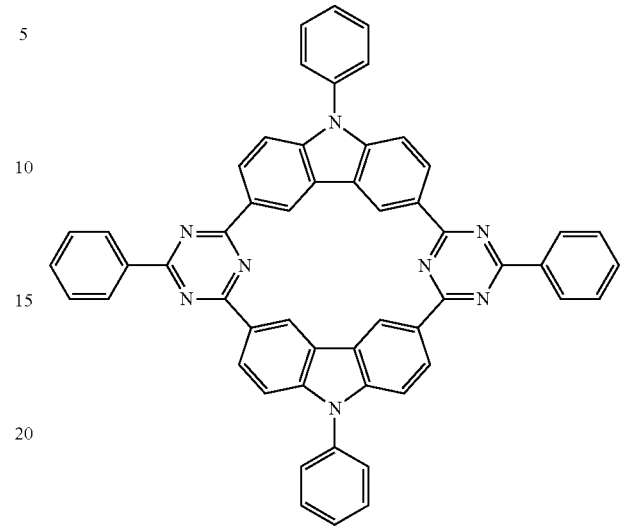

X-1

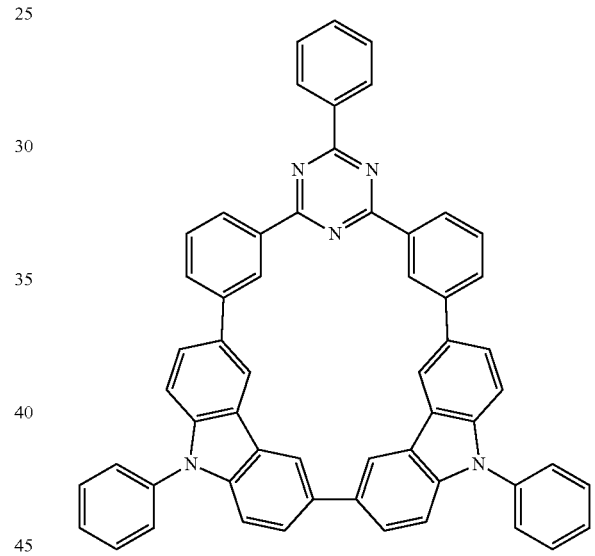

X-2

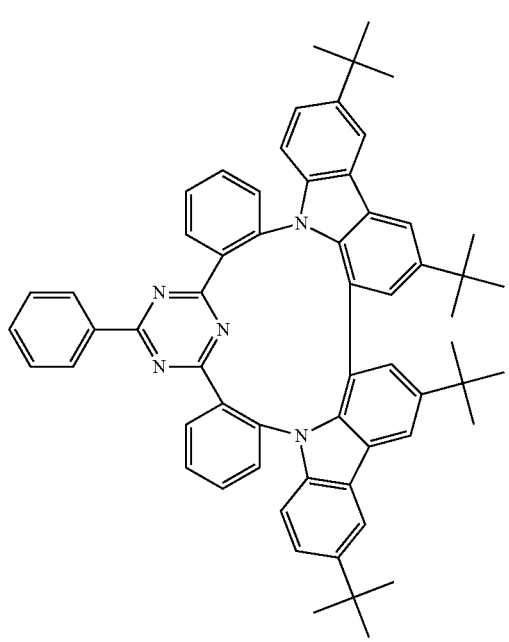

S1 energy level, T1 energy level and $\Delta E_{ST}$ values of Example Compounds 1, 4, 9, 21, 32, and 40 and Comparative Compounds X1 and X2 are shown in the following Table 1.

TABLE 1

| Compounds | S1 energy level | T1 energy level | $\Delta E_{ST}$ |
|---|---|---|---|
| Example Compound 1 | 2.76 | 2.74 | 0.02 |
| Example Compound 4 | 2.90 | 2.89 | 0.01 |
| Example Compound 9 | 2.72 | 2.71 | 0.01 |
| Example Compound 21 | 2.84 | 2.75 | 0.09 |
| Example Compound 32 | 2.74 | 2.68 | 0.06 |
| Example Compound 40 | 2.68 | 2.65 | 0.03 |
| Comparative Compound X-1 | 3.20 | 2.76 | 0.44 |
| Comparative Compound X-2 | 2.99 | 2.80 | 0.19 |

In Table 1, $\Delta E_{ST}$ is a value of the difference between the singlet energy level and the triplet energy level. The unit of S1 and T1 energy level is eV.

Referring to Table 1, it can be seen that all the example compounds have a $\Delta E_{ST}$ value significantly lower than 0.2 (which may be an upper limit of $\Delta E_{ST}$ value for emission by thermally activated delayed fluorescence), and therefore the example compounds may be used as a material for thermally activated delayed fluorescence.

In Table 1, the $\Delta E_{ST}$ value of Comparative Compound X-1 exceeds 0.2 and the compound may not be suitable for use as a material for thermally activated delayed fluorescence. In Table 1, the $\Delta E_{ST}$ value of Comparative Compound X-2 is 0.19, which is higher than those of example compounds.

(Device Manufacturing Example)

Organic electroluminescence devices of Examples 1 to 6 and Comparative Examples 1 and 2 were manufactured by using respective Example Compounds 1, 4, 9, 21, 32, and 40 and Comparative Compounds X-1 and X-2 as a dopant material in the emission layer.

The organic electroluminescence devices according to Examples 1 to 6 and Comparative Examples 1 and 2 were manufactured by forming a first electrode EL1 using ITO to a thickness of about 150 nm, a hole injection layer HIL using HAT-CN to a thickness of about 10 nm, a hole transport layer HTL using α-NPD to a thickness of about 80 nm, an electron blocking layer EBL using mCP to a thickness of about 5 nm, an emission layer using bis{2-[di(phenyl)phosphino]phenyl}ether oxide (DPEPO) doped with the example compounds or the comparative compounds in an amount of 18% to a thickness of about 20 nm, a hole blocking layer HBL using DPEPO to a thickness of about 10 nm, an electron transport layer ETL using TPBi to a thickness of about 30 nm, an electron injection layer EIL using LiF to a thickness of about 0.5 nm, and a second electrode EL2 using Al to a thickness of about 100 nm. Each layer was formed by a vacuum deposition method. The light emitting property of the manufactured organic electroluminescence devices was evaluated by using a brightness light distribution characteristics measurement system C9920-11 (Hamamatsu Photonics, Japan).

Emission wavelength and external quantum efficiency of the organic electroluminescence devices using the example compounds and the comparative compounds as a dopant material in the emission layer are shown in the following Table 2.

TABLE 2

| Device manufacturing examples | Dopant material in emission layer | Emission wavelength (nm) | External quantum efficiency (%) |
|---|---|---|---|
| Example 1 | Example Compound 1 | 474 | 11 |
| Example 2 | Example Compound 4 | 465 | 12 |
| Example 3 | Example Compound 9 | 475 | 10 |
| Example 4 | Example Compound 21 | 458 | 10 |
| Example 5 | Example Compound 32 | 478 | 10 |
| Example 6 | Example Compound 40 | 480 | 11 |
| Comparative Example 1 | Comparative Compound X-1 | 454 | 2 |
| Comparative Example 2 | Comparative Compound X-2 | 460 | 3 |

Referring to the results in Table 2, it can be seen that the organic electroluminescence devices of Examples 1 to 6 had enhanced efficiency when compared with those of Comparative Examples 1 and 2. The organic electroluminescence devices of Examples 1 to 6 had external quantum efficiency of 10% or higher, indicating high efficiency. The organic electroluminescence device of Comparative Example 1, which used Comparative Compound X-1 having a relatively high DEBT value of 0.44, had an external quantum efficiency of 2%, showing that Comparative Compound X-1 did not function as a material for thermally activated delayed fluorescence. The organic electroluminescence device of Comparative Example 2, which used Comparative Compound X-2 having an $\Delta E_{ST}$ value of 0.19 (higher than those of example compounds), had an external quantum efficiency of 3%, showing that Comparative Compound X-2 did not function as a material for thermally activated delayed fluorescence.

By way of summation and review, an organic electroluminescence device may include, for example, a first electrode, a hole transport layer on the first electrode, an emission layer on the hole transport layer, an electron transport layer on the emission layer, and a second electrode on the electron transport layer. During operation, holes are injected from the first electrode, and the injected holes move via the hole transport layer to be injected into the emission layer. Meanwhile, electrons are injected from the second electrode, and the injected electrons move via the electron transport layer to be injected into the emission layer. By recombining the holes and electrons injected into the emission layer, excitons may be generated in the emission layer, and the organic electroluminescence device may thus emit light using light emitted during the transition of the excitons back to a ground state.

In an application of an organic electroluminescence device to a display, decrease of a driving voltage, increase of emission efficiency and extension of life for the organic electroluminescence device are desired, and development of materials which may stably implement these requirements in the organic electroluminescence device is also desired.

As described above, an organic electroluminescence device using a nitrogen-containing compound according to an example embodiment as a dopant material in an emission layer may attain high efficiency and emit blue light. Without being bound by theory, it is believed that the nitrogen-containing compound according to an example embodiment has a heterocyclic moiety that functions as an electron accepting group and two carbazole moieties that function as electron donating groups, and the heterocyclic moiety (electron accepting group) is linked with each of the carbazole moieties (electron donating groups) via a phenylene group bonded in the ortho position, which results in distortion of molecular structure and separation of highest occupied molecular orbital (HOMO) and lowest unoccupied molecular orbital (LUMO). It is believed that the separation of HOMO and LUMO decreases $\Delta E_{ST}$, which enables reverse intersystem crossing such that the nitrogen-containing compound according to an example embodiment may function as a material for thermally activated delayed fluorescence.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. An organic electroluminescence device, comprising:
a first electrode;
a hole transport region on the first electrode;
an emission layer on the hole transport region, the emission layer including a nitrogen-containing compound;
an electron transport region on the emission layer; and
a second electrode on the electron transport region,
wherein the first electrode and the second electrode each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, and Zn, a compound of two or more thereof, a mixture of two or more thereof, and oxides thereof, and
wherein:
the nitrogen-containing compound includes a heterocyclic moiety and two carbazole moieties,
the heterocyclic moiety is a substituted pyridine, a substituted pyrimidine, or a substituted 1,3,5-triazine,
each of two carbons among carbons of 2-, 4-, and 6-positions of the substituted pyridine, the substituted pyrimidine, or the substituted 1,3,5-triazine is substituted with a phenylene group, a carbon in an ortho position of each phenylene group being linked with a nitrogen at a 9-position of one of the carbazole moieties, and
the remaining carbon among the carbons of the 2-, 4-, and 6-positions is substituted with a substituted or unsubstituted aromatic group, and
the carbazole moieties are linked together by a linker.

2. The organic electroluminescence device as claimed in claim 1, wherein
the aromatic group is a substituted or unsubstituted aryl group having 6 to 30 ring carbon atoms, or a substituted or unsubstituted heteroaryl group having 2 to 30 ring carbon atoms, and
the linker is a direct linkage, a substituted or unsubstituted arylene group having 6 to 30 ring carbon atoms, or a substituted or unsubstituted heteroarylene group having 2 to 30 ring carbon atoms.

3. The organic electroluminescence device as claimed in claim 1, wherein
the aromatic group is a substituted or unsubstituted phenyl group, a substituted or unsubstituted dibenzofuran group, or a substituted or unsubstituted dibenzothiophene group, and
the linker is a direct linkage, a substituted or unsubstituted phenylene group, a substituted or unsubstituted dibenzofuranylene group, or a substituted or unsubstituted dibenzothiophenylene group.

4. The organic electroluminescence device as claimed in claim 1, wherein
the heterocyclic moiety is a substituted pyrimidine or a substituted 1,3,5-triazine.

5. The organic electroluminescence device as claimed in claim 1, wherein
the emission layer includes a host and a dopant, and
the dopant includes the nitrogen-containing compound.

6. The organic electroluminescence device as claimed in claim 1, wherein
the nitrogen-containing compound is represented by Formula 1:

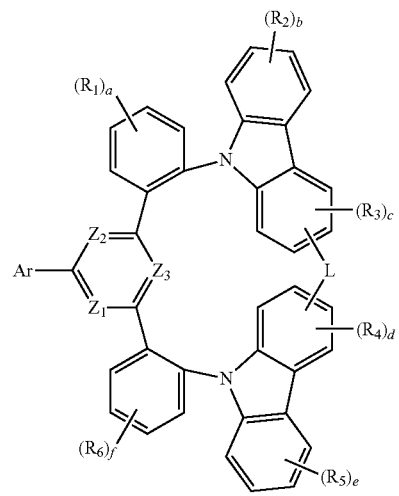

[Formula 1]

the heterocyclic moiety includes $Z_1$ to $Z_3$, where $Z_1$ to $Z_3$ are each independently C-$R_7$ or N, provided that at least one of $Z_1$ to $Z_3$ are N, the substituted or unsubstituted aromatic group is Ar, and Ar is a substituted or unsubstituted aryl group having 6 to 30 ring carbon atoms, or a substituted or unsubstituted heteroaryl group having 2 to 30 ring carbon atoms, the linker is L, and L is a direct linkage, a substituted or unsubstituted arylene group having 6 to 30 ring carbon atoms, or a substituted or unsubstituted heteroarylene group having 2 to 30 ring carbon atoms, $R_1$ to $R_7$ are each independently a hydrogen atom, a deuterium atom, a halogen atom, a cyano group, a substituted or unsubstituted amino group, a substituted or unsubstituted silyl group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, a, b, e and f are each independently an integer of 0 to 4, and c and d are each independently an integer of 0 to 3.

7. The organic electroluminescence device as claimed in claim 6, wherein Formula 1 is represented by any one of Formulae 1-1 to 1-3:

[Formula 1-1]

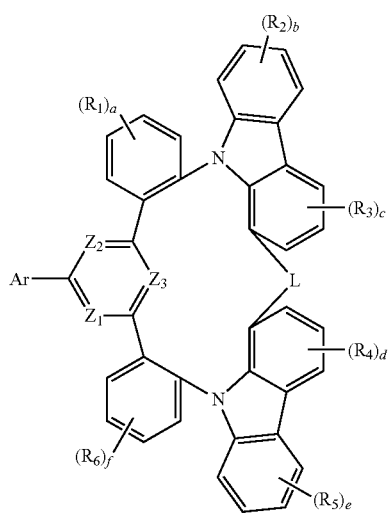

[Formula 1-2]

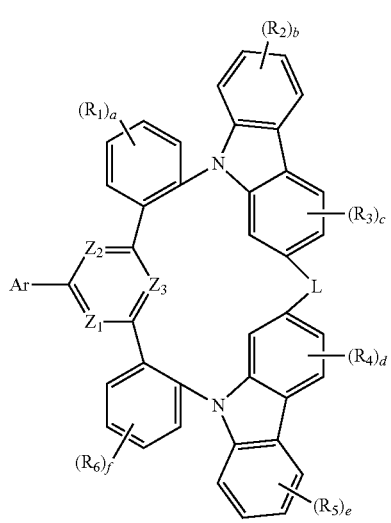

[Formula 1-3]

where $Z_1$ to $Z_3$, Ar, L, $R_1$ to $R_7$ and a to f are the same as defined in Formula 1.

8. The organic electroluminescence device as claimed in claim 6, wherein Ar is a substituted or unsubstituted phenyl group, a substituted or unsubstituted dibenzofuran group, or a substituted or unsubstituted dibenzothiophene group, and L is a direct linkage, a substituted or unsubstituted phenylene group, a substituted or unsubstituted dibenzofuranylene group, or a substituted or unsubstituted dibenzothiophenylene group.

9. The organic electroluminescence device as claimed in claim 6, wherein at least two of $Z_1$ to $Z_3$ are N.

10. The organic electroluminescence device as claimed in claim 1, wherein the nitrogen-containing compound is at least one of compounds in Compound Group 1:

[Compound Group 1]

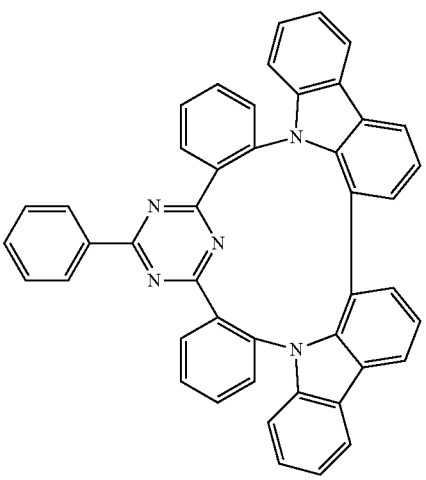

1

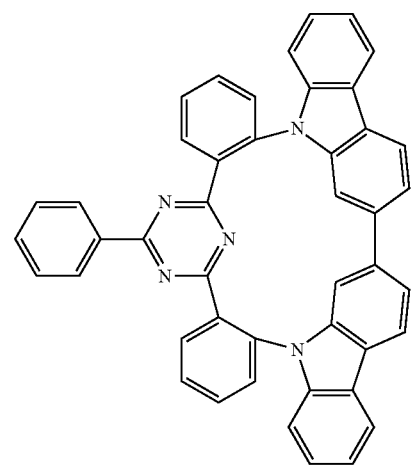

2

-continued
3
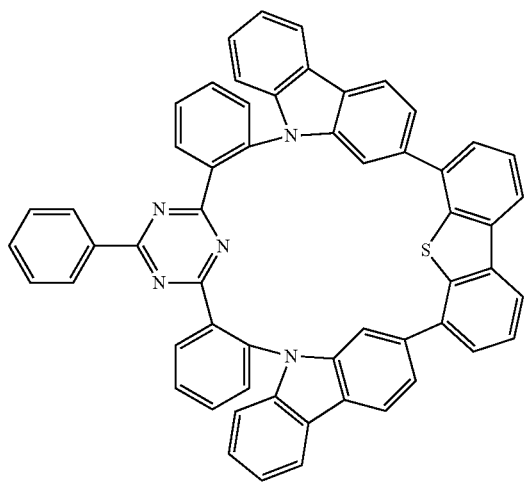
4
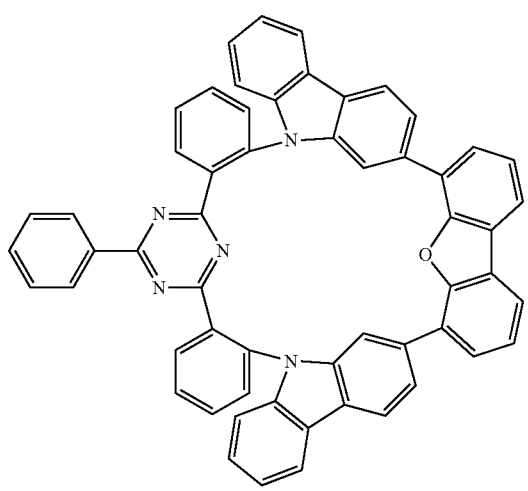
5
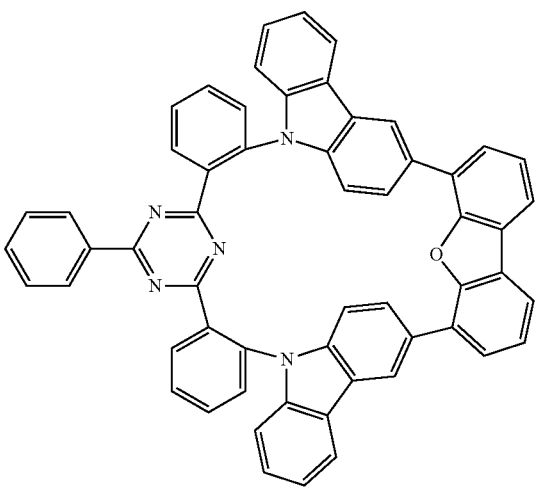
-continued
6
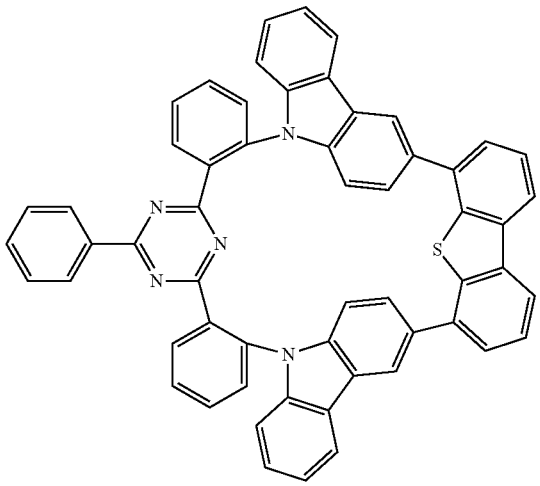
7
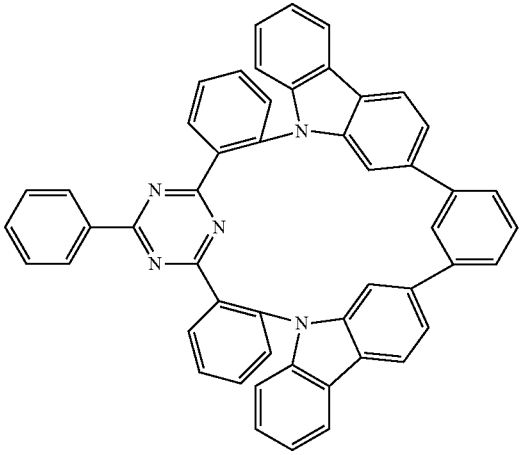
8
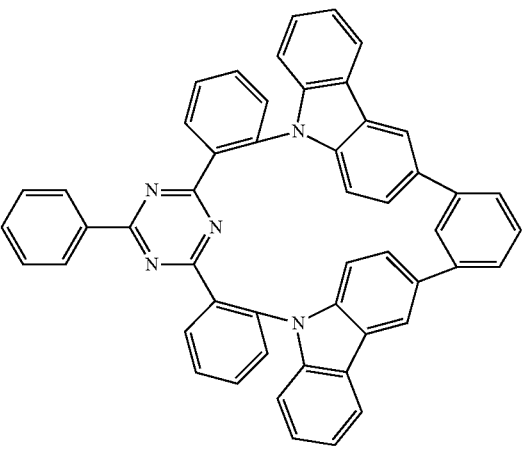

9
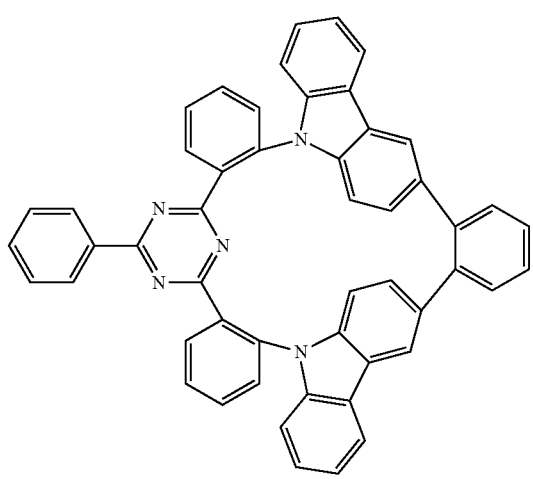
10
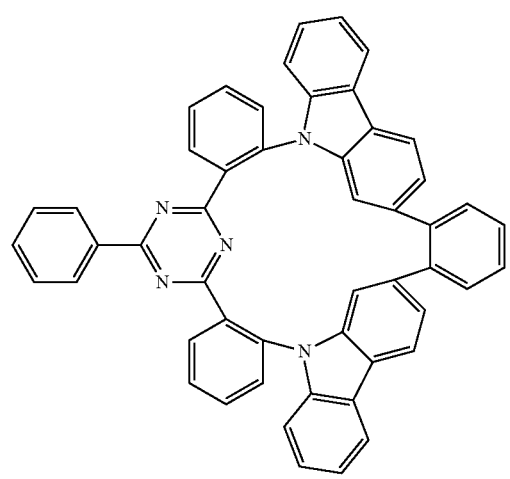
11
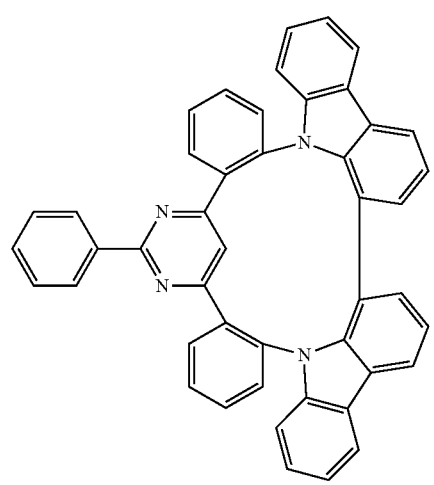
12
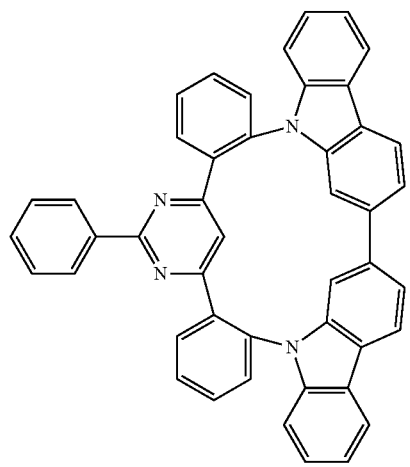
13
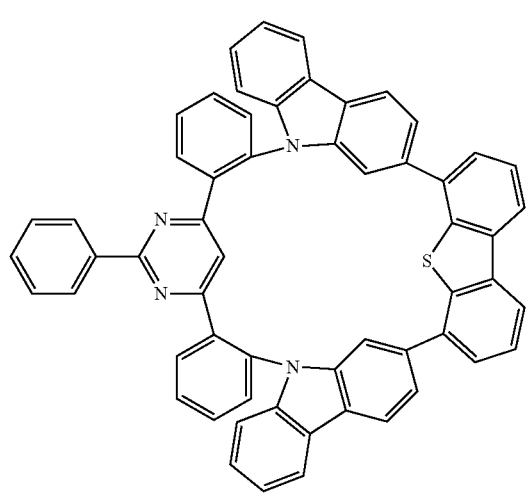
14
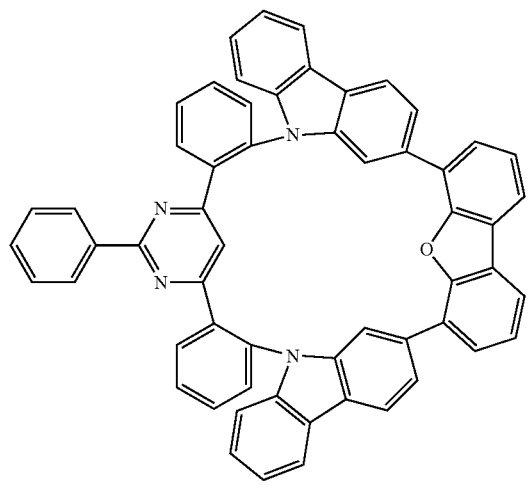

15
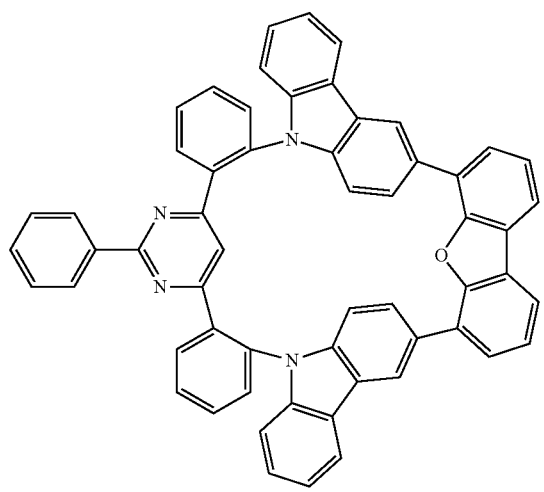
16
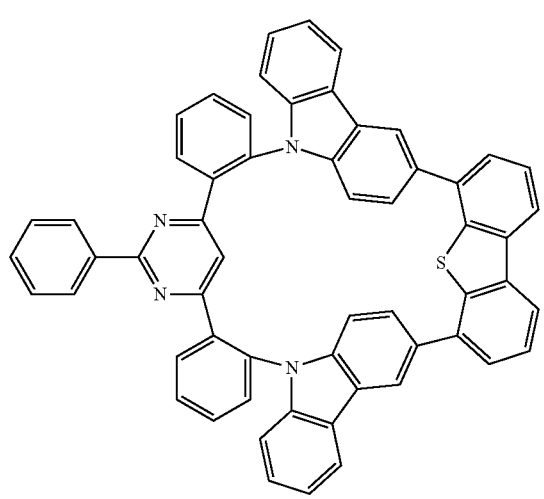
17
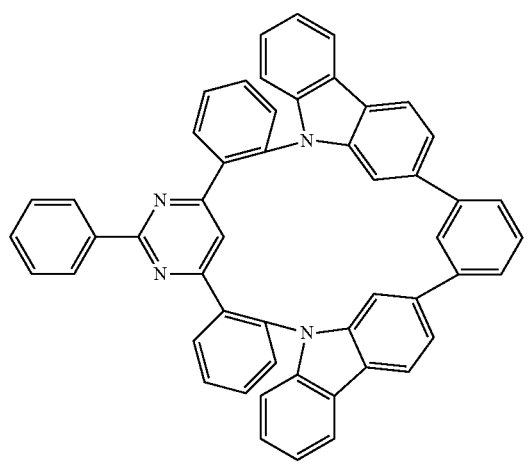
18
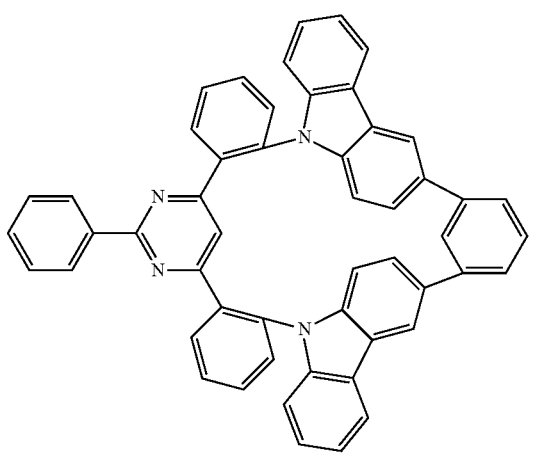
19
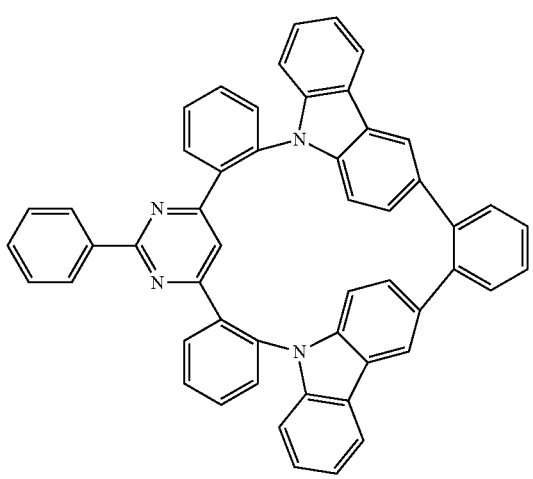
20
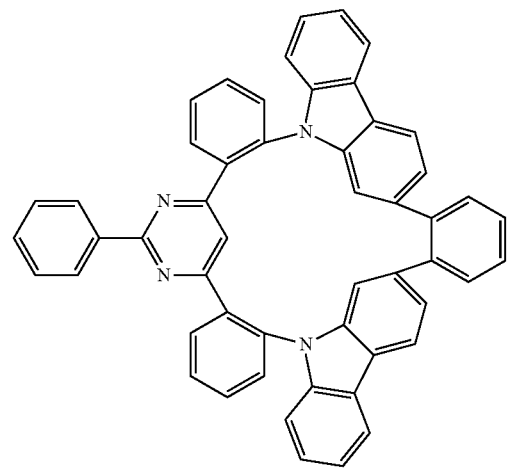

21
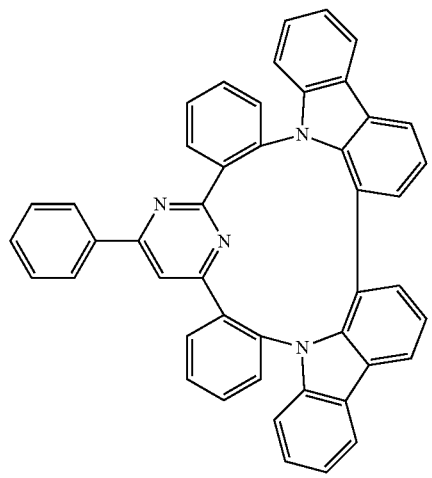
22
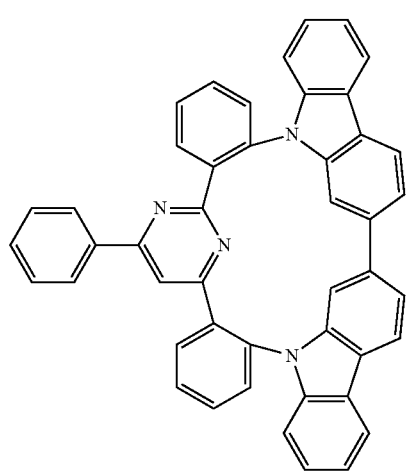
23
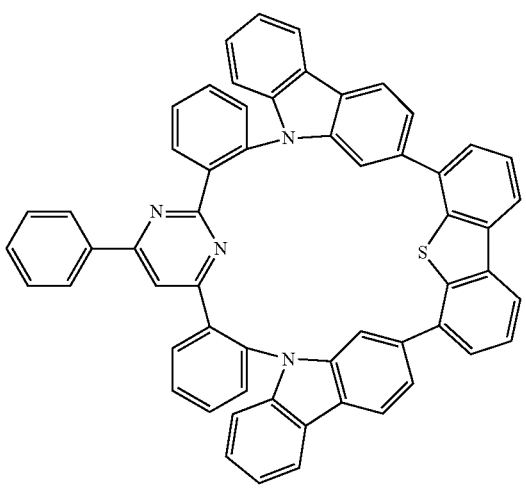
24
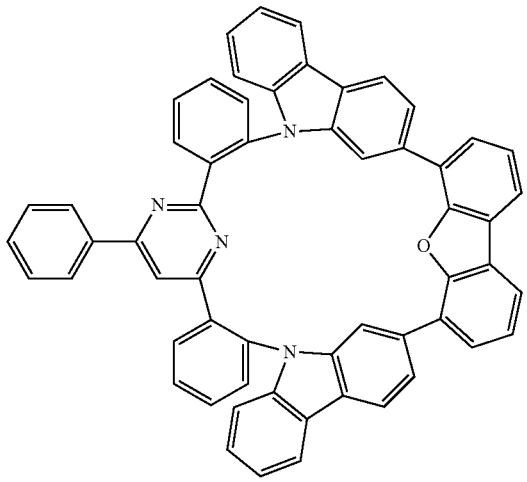
25
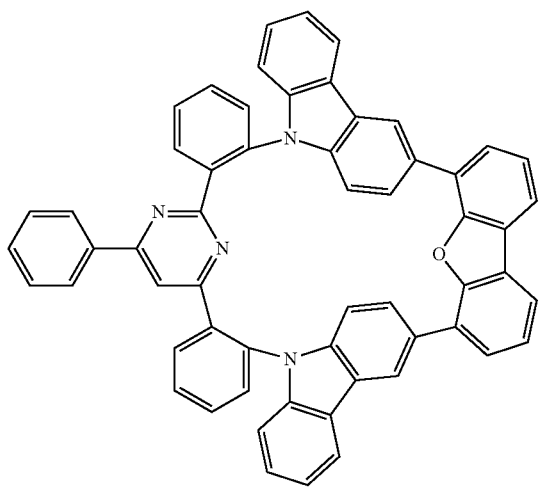
26
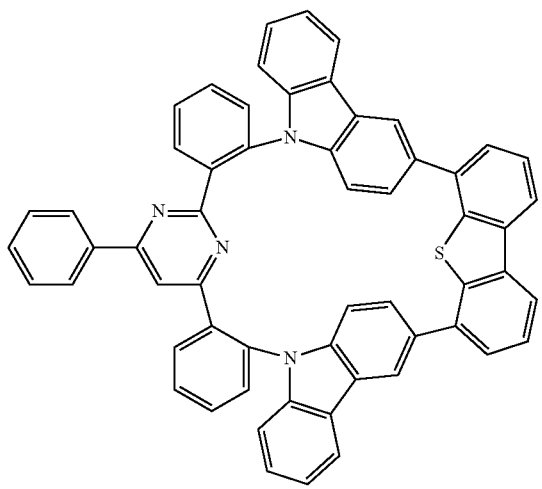

27
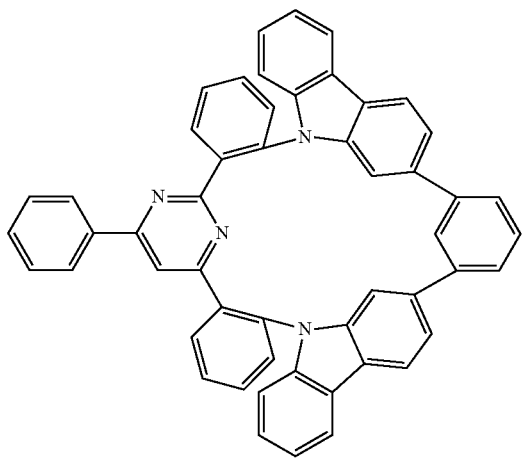
28
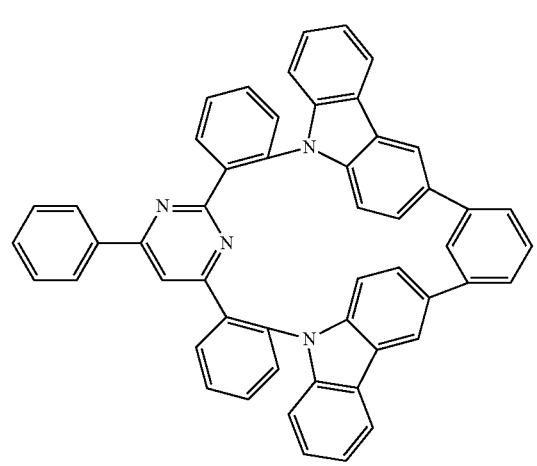
29
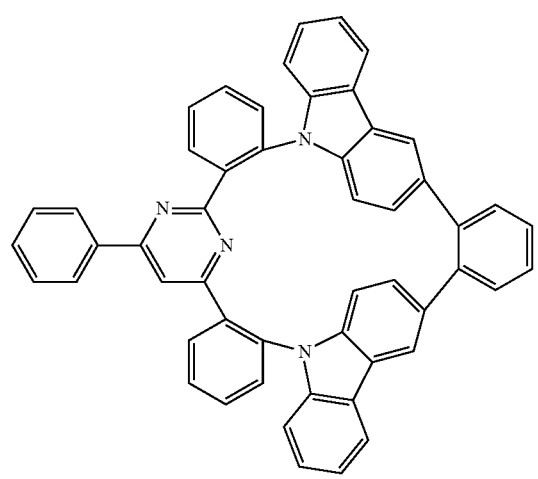
30
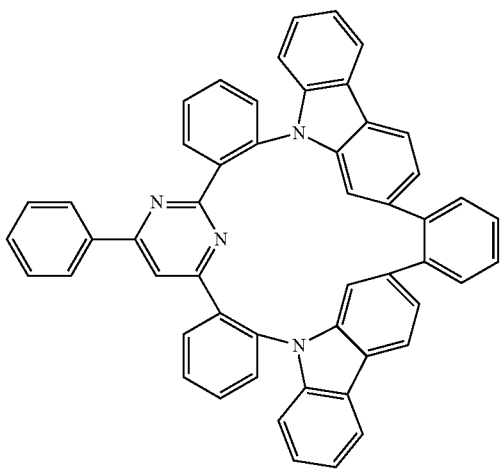
31
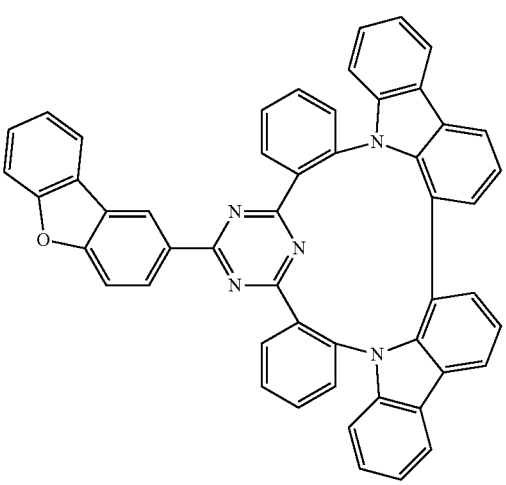
32
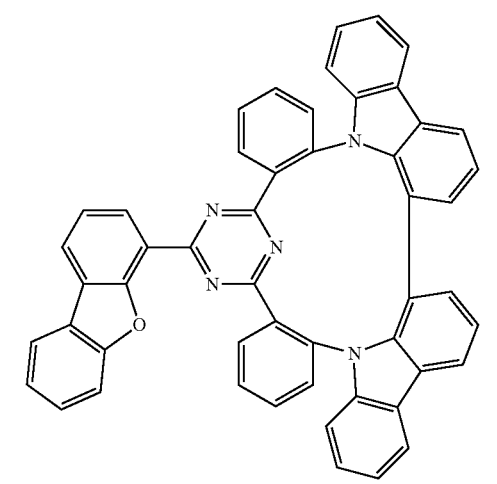

33
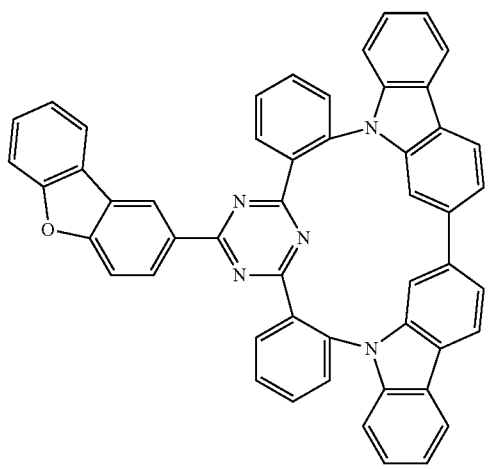
34
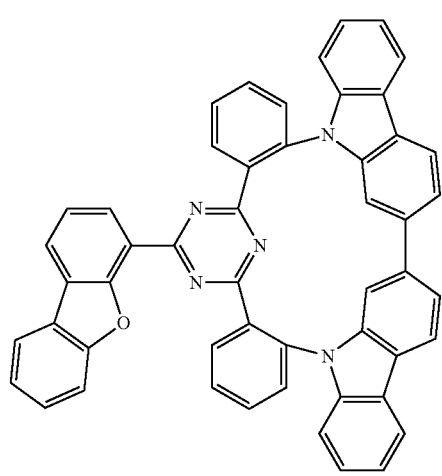
35
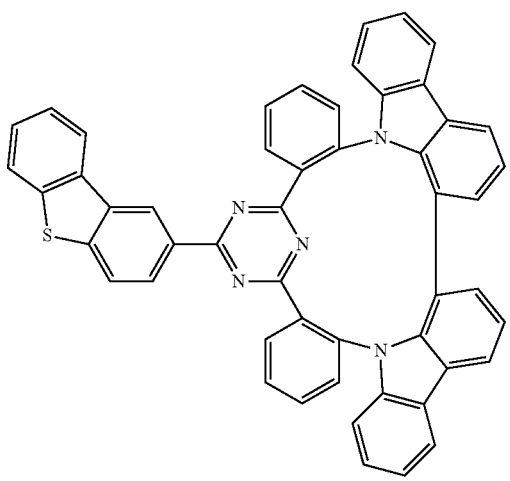
36
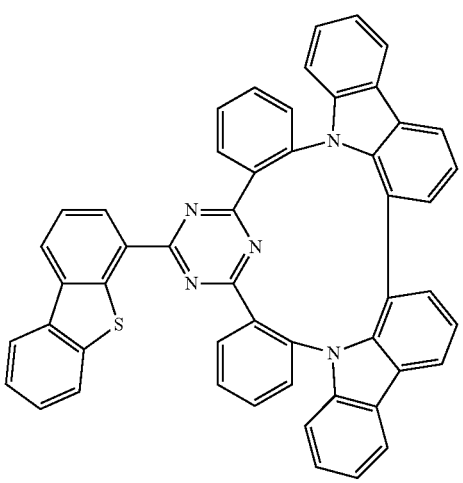
37
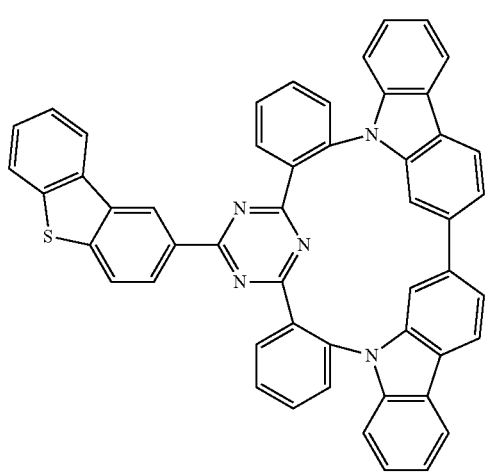
38
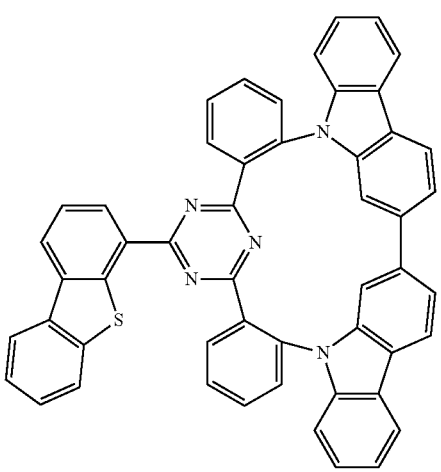

39
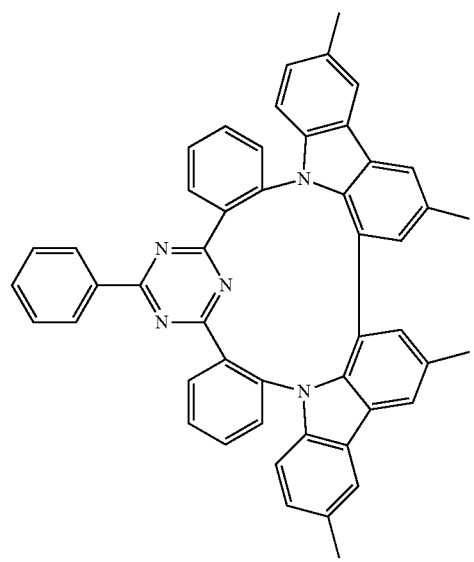
41
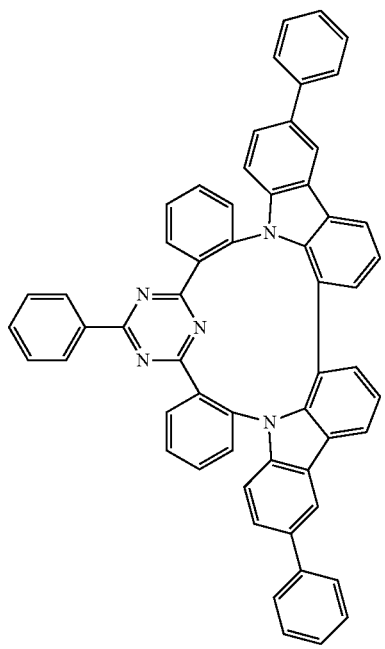
40
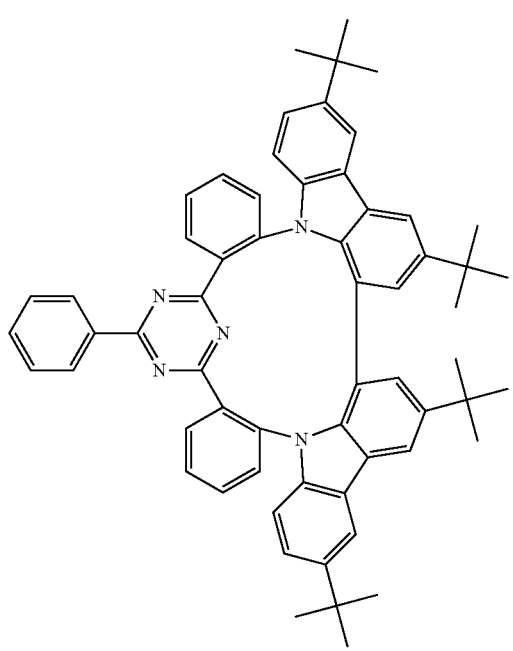
42
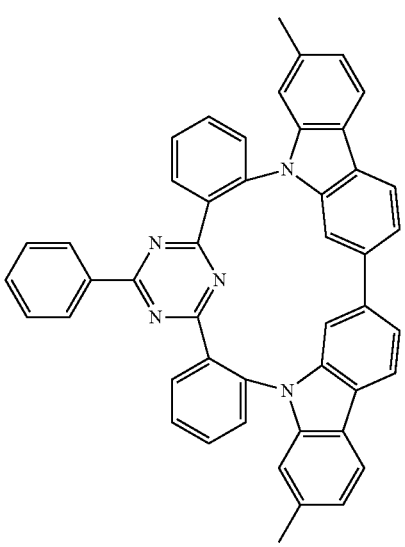

-continued

43

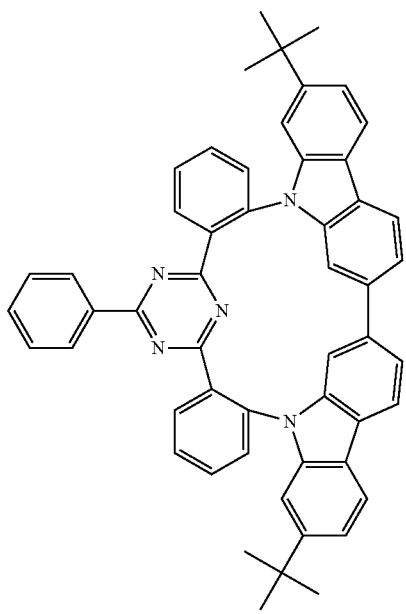

44

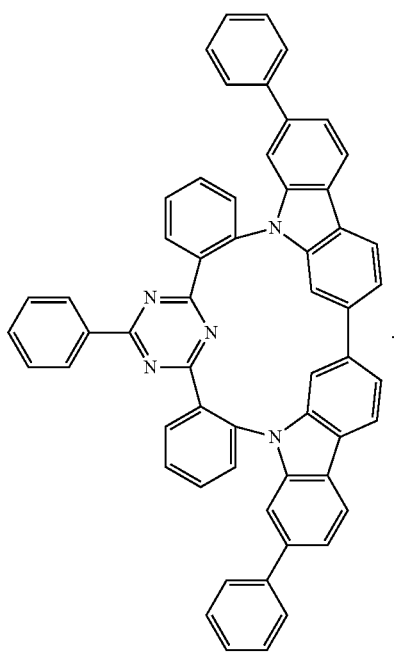

11. An organic electroluminescence device, comprising:

a first electrode;

a hole transport region on the first electrode;

an emission layer on the hole transport region, the emission layer including a nitrogen-containing compound represented by Formula 1; and an electron transport region on the emission layer, wherein the first electrode and the second electrode each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, and Zn, a compound of two or more thereof, a mixture of two or more thereof, and oxides thereof,

[Formula 1]

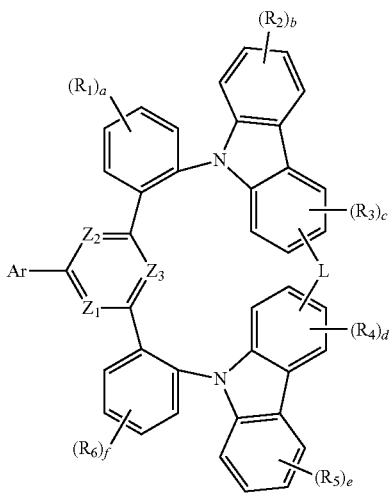

where $Z_1$ to $Z_3$ are each independently C-$R_7$ or N, provided that at least one of $Z_1$ to $Z_3$ are N, Ar is a substituted or unsubstituted aryl group having 6 to 30 ring carbon atoms, or a substituted or unsubstituted heteroaryl group having 2 to 30 ring carbon atoms, L is a direct linkage, a substituted or unsubstituted arylene group having 6 to 30 ring carbon atoms, or a substituted or unsubstituted heteroarylene group having 2 to 30 ring carbon atoms, $R_1$ to $R_7$ are each independently a hydrogen atom, a deuterium atom, a halogen atom, a cyano group, a substituted or unsubstituted amino group, a substituted or unsubstituted silyl group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, a, b, e and f are each independently an integer of 0 to 4, and c and d are each independently an integer of 0 to 3.

12. The organic electroluminescence device as claimed in claim 11, wherein Formula 1 is represented by any one of Formulae 1-1 to 1-3:

[Formula 1-1]

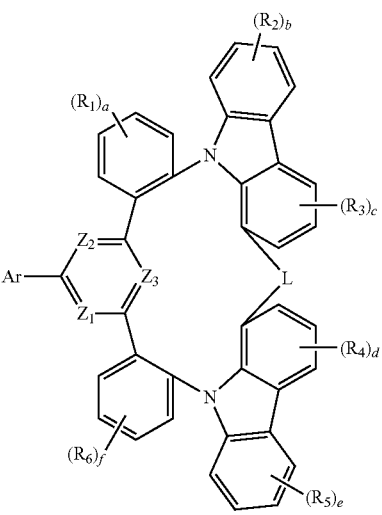

[Formula 1-2]

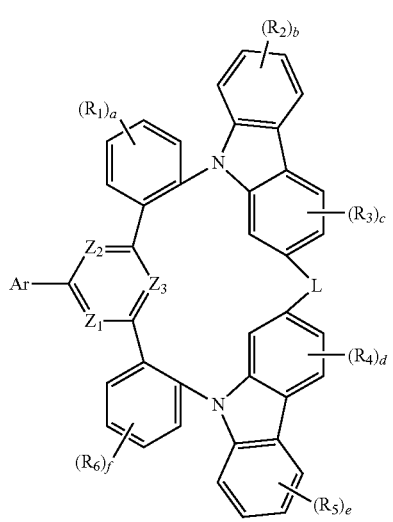

[Compound Group 1]

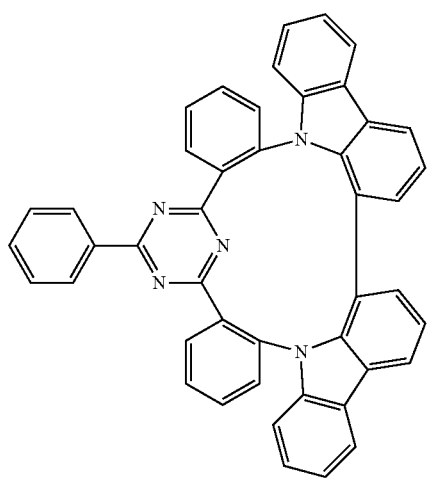

1

[Formula 1-3]

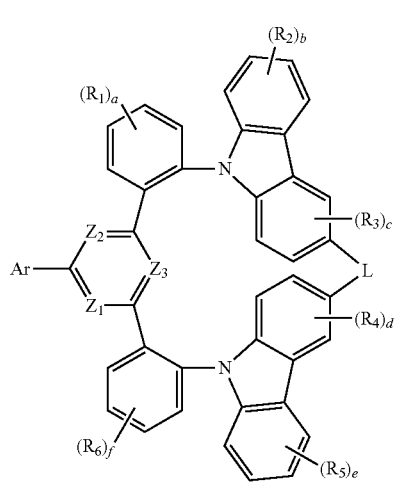

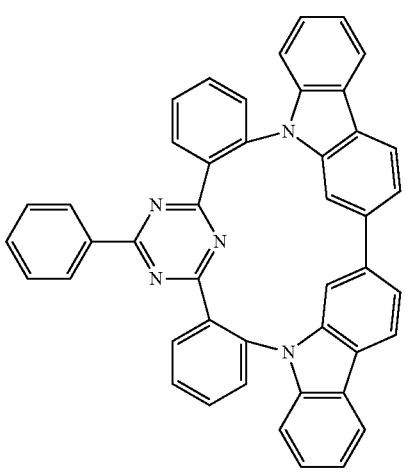

2 where $Z_1$ to $Z_3$, Ar, L, $R_1$ to $R_7$ and a to f are the same as defined in Formula 1.

13. The organic electroluminescence device as claimed in claim 11, wherein

Ar is a substituted or unsubstituted phenyl group, a substituted or unsubstituted dibenzofuran group, or a substituted or unsubstituted dibenzothiophene group, and L is a direct linkage, a substituted or unsubstituted phenylene group, a substituted or unsubstituted dibenzofuranylene group, or a substituted or unsubstituted dibenzothiophenylene group.

14. The organic electroluminescence device as claimed in claim 11, wherein at least two of $Z_1$ to $Z_3$ are N.

15. The organic electroluminescence device as claimed in claim 11, wherein the nitrogen-containing compound is at least one of compounds in Compound Group 1:

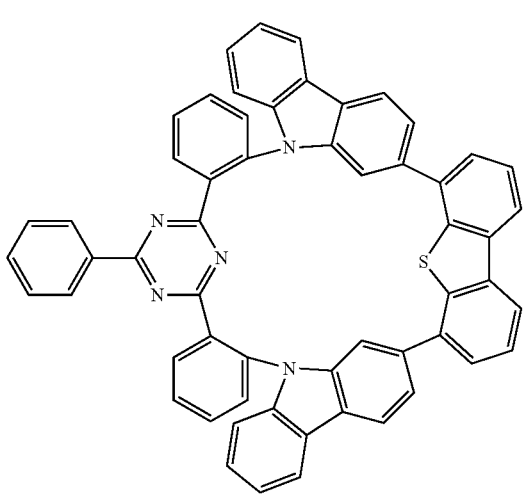

3

4
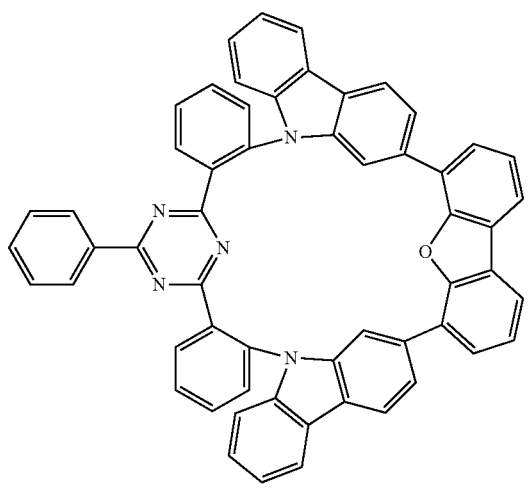
5
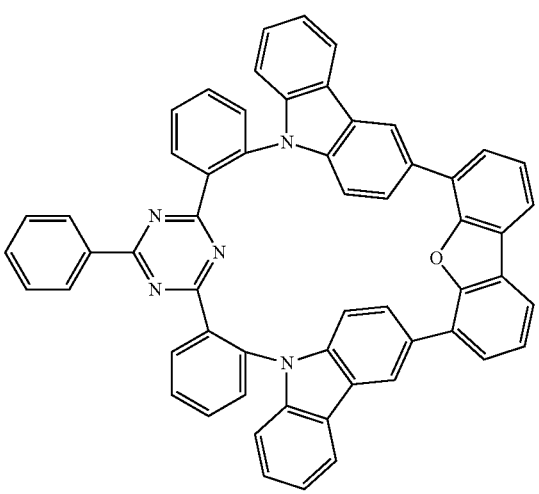
6
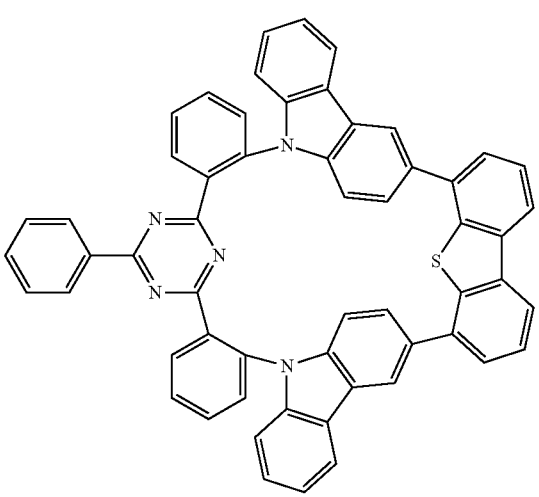
7
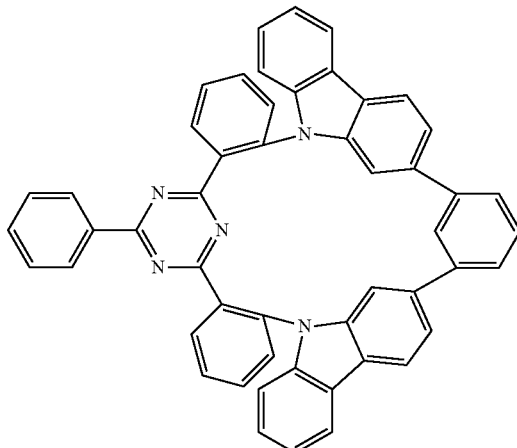
8
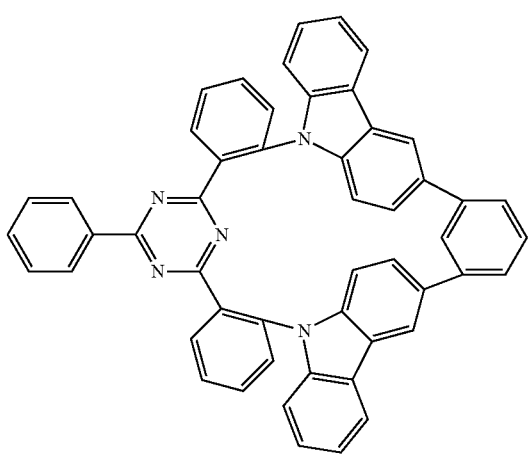
9
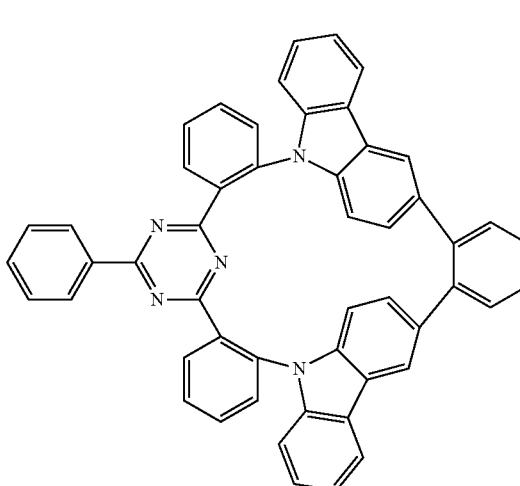

10
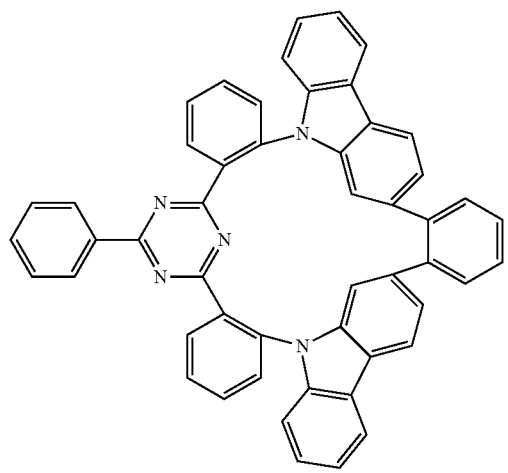
11
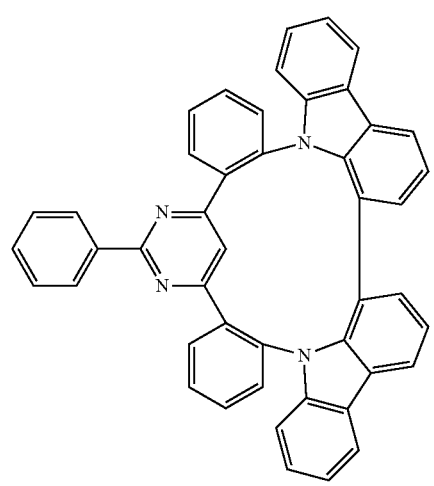
12
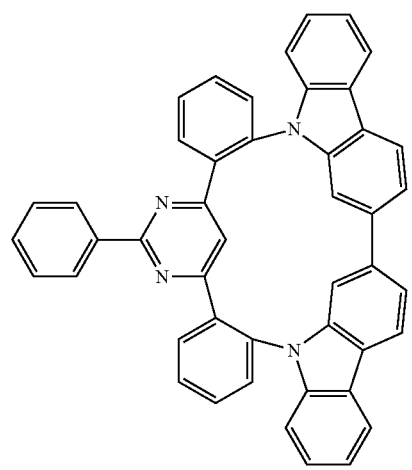
13
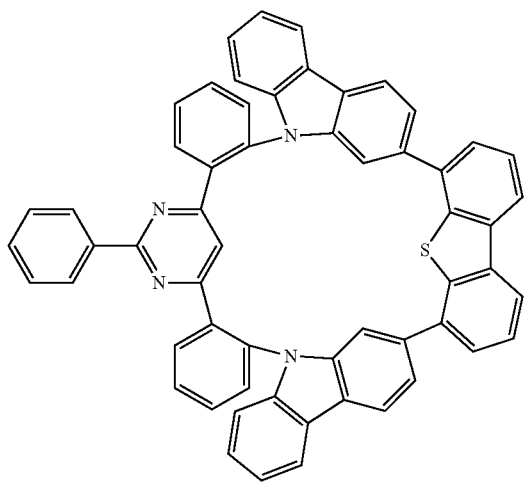
14
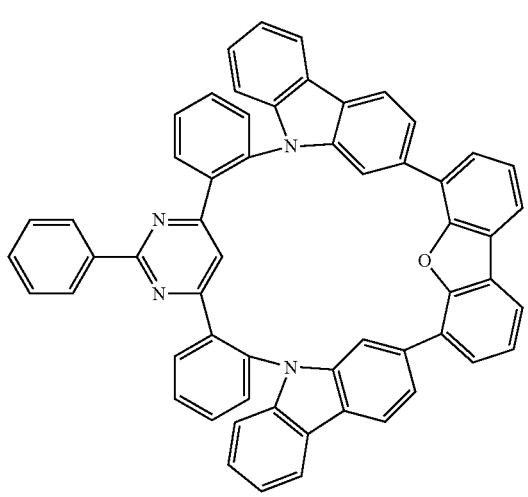
15
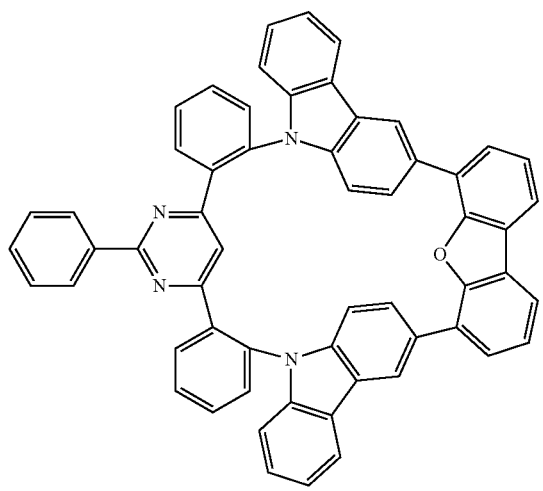

16
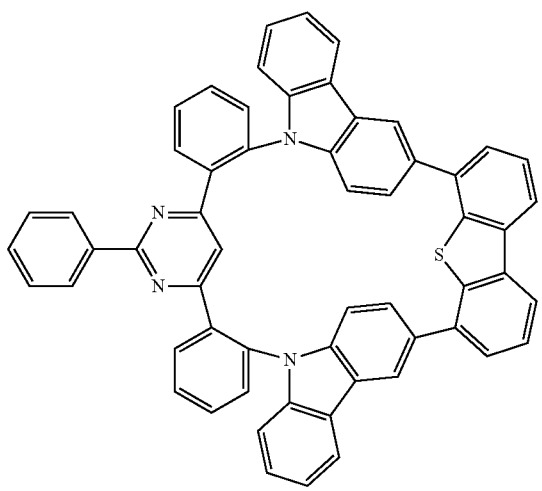
17
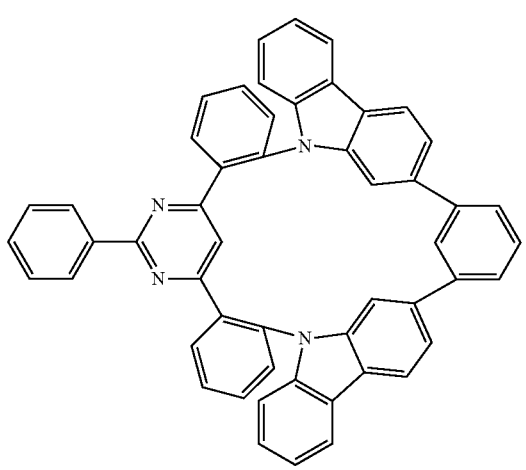
18
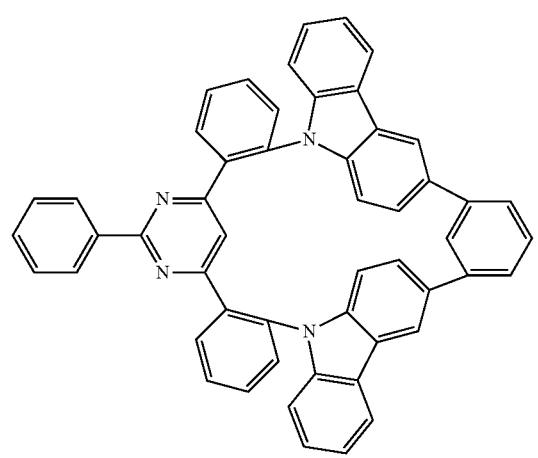
19
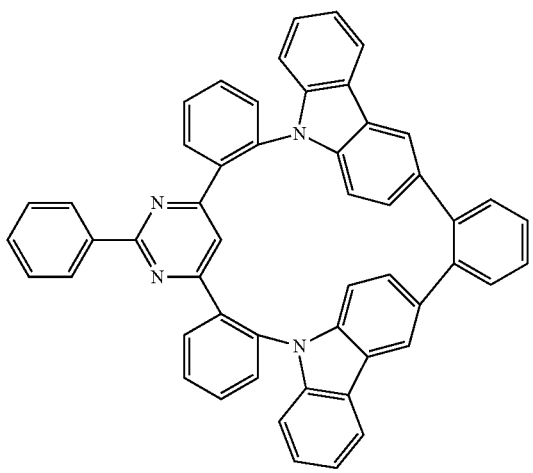
20
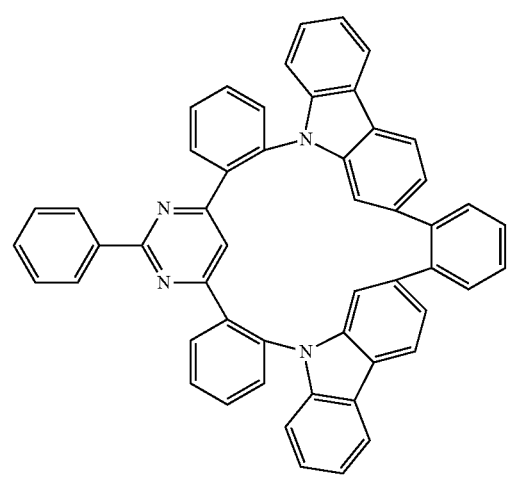
21
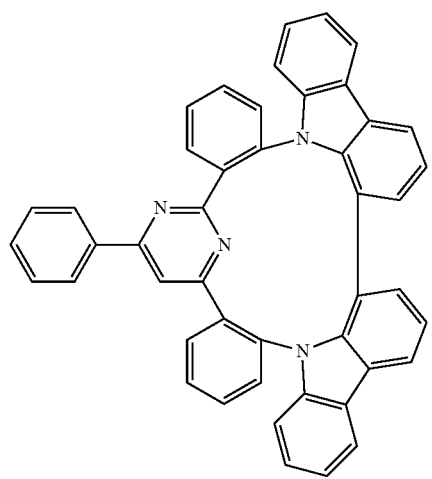

73
-continued
22
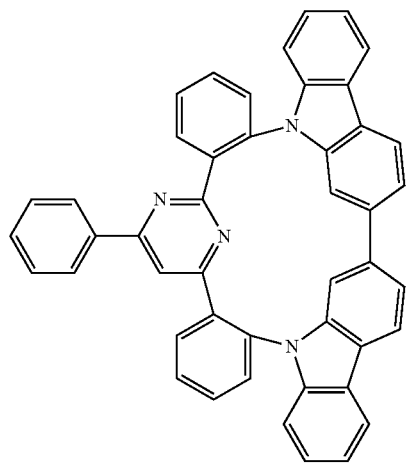
74
-continued
25
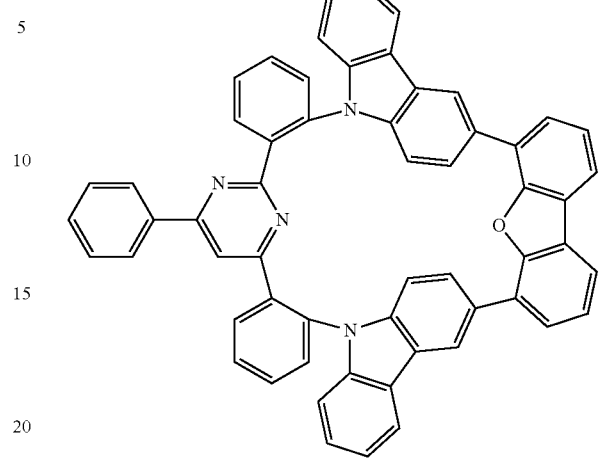
23
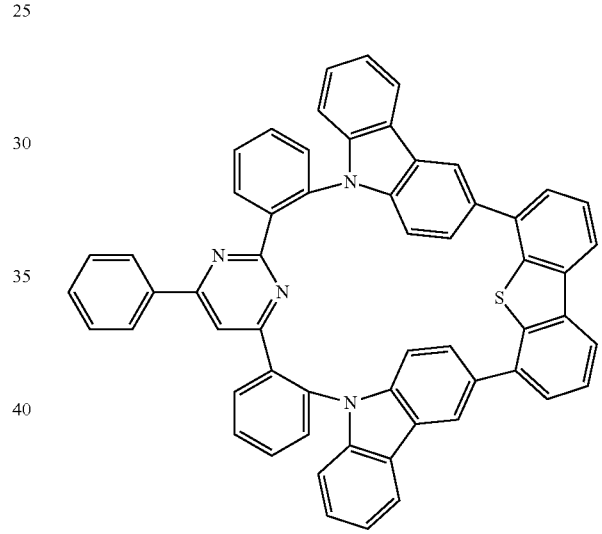
26
24
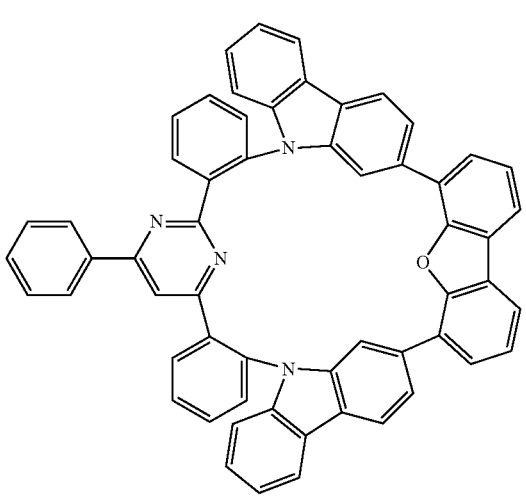
27
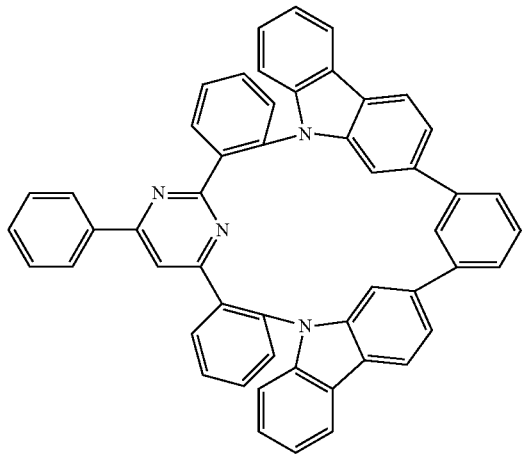

28
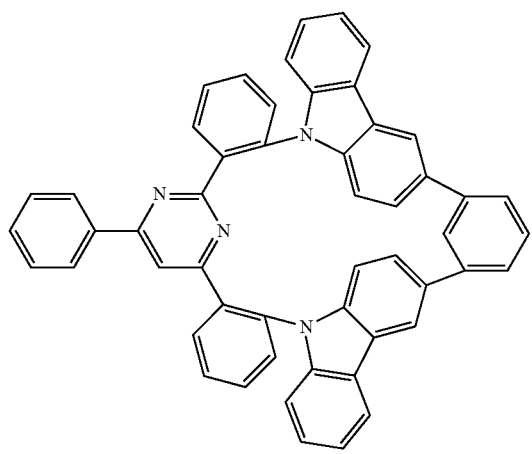
29
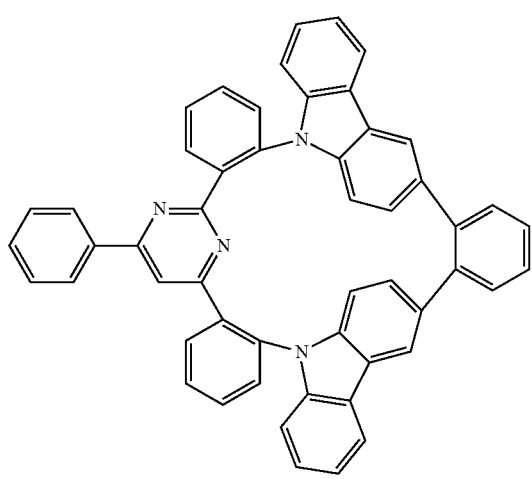
30
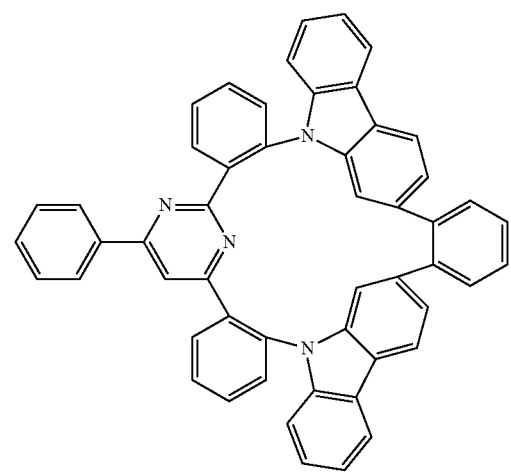
31
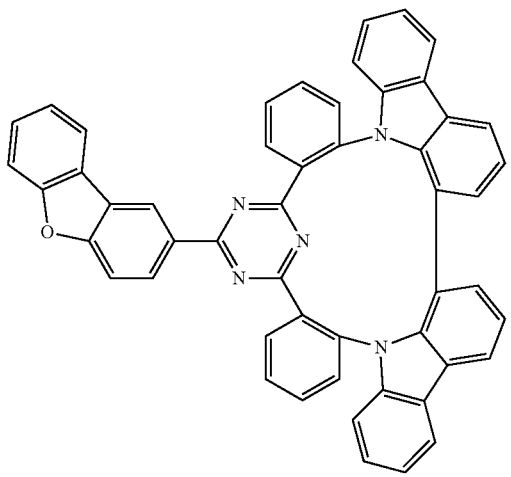
32
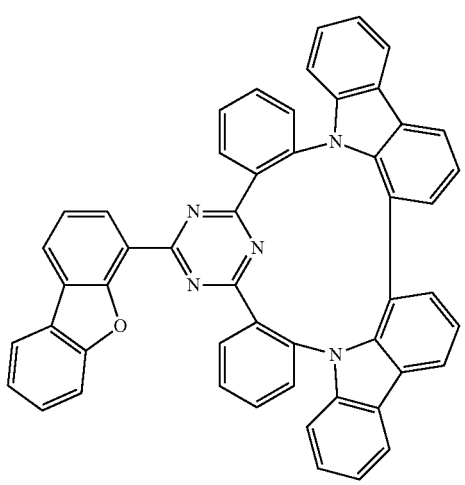
33
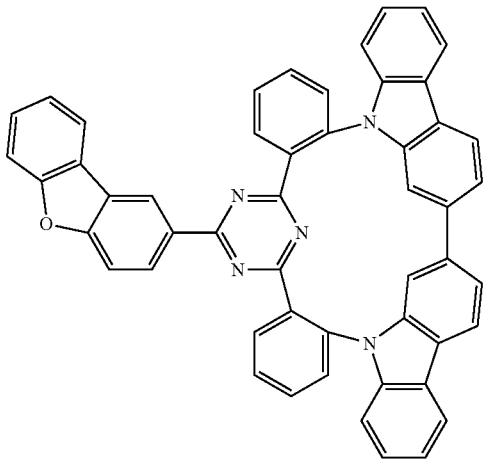

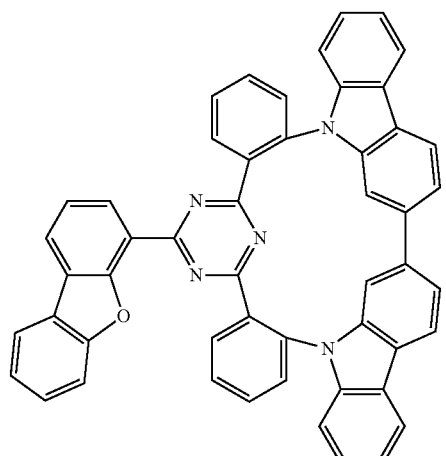
34
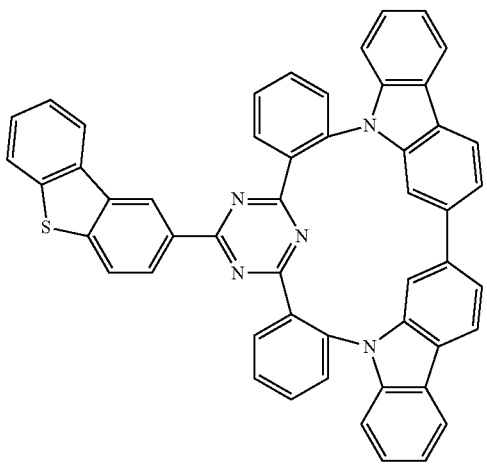
37
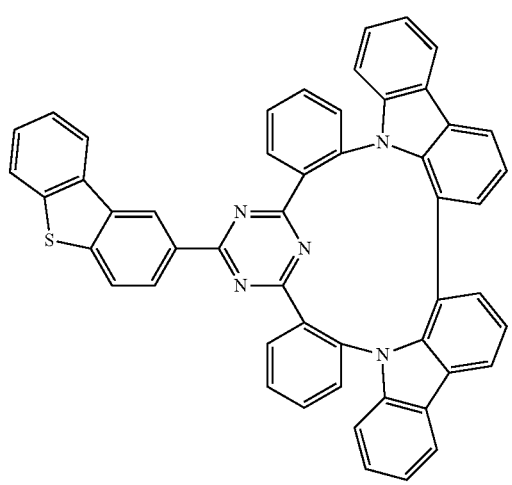
35
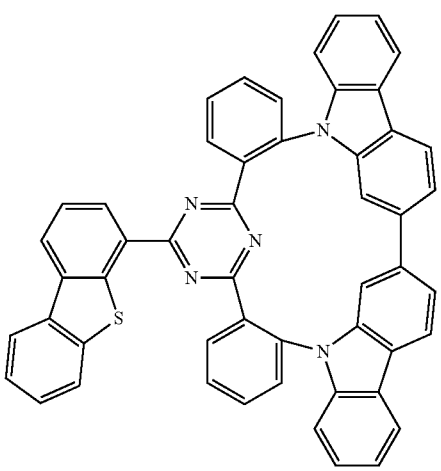
38
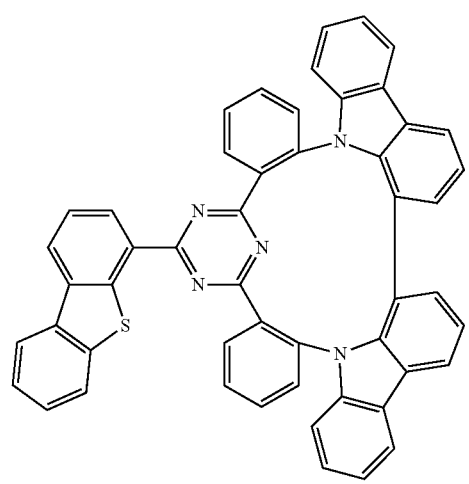
36
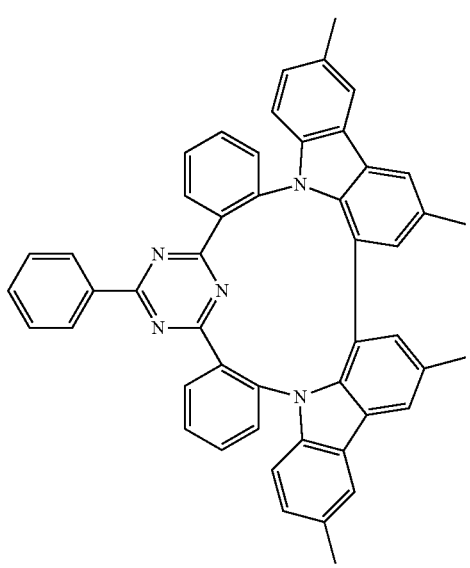
39

40
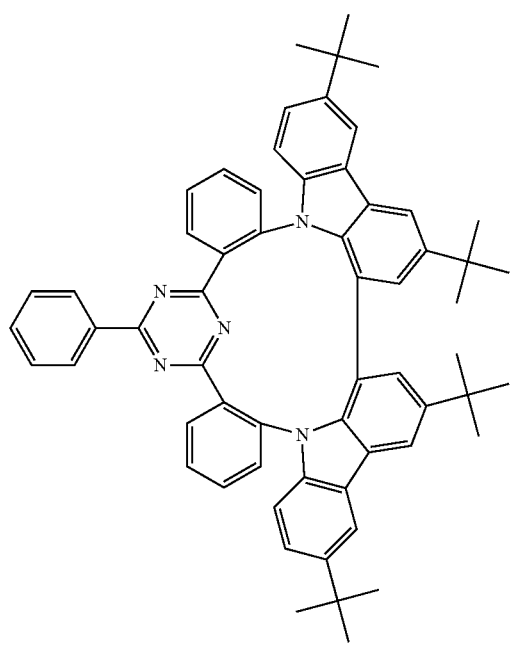
42
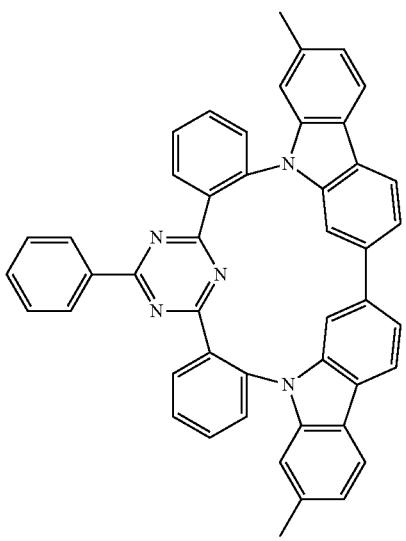
41
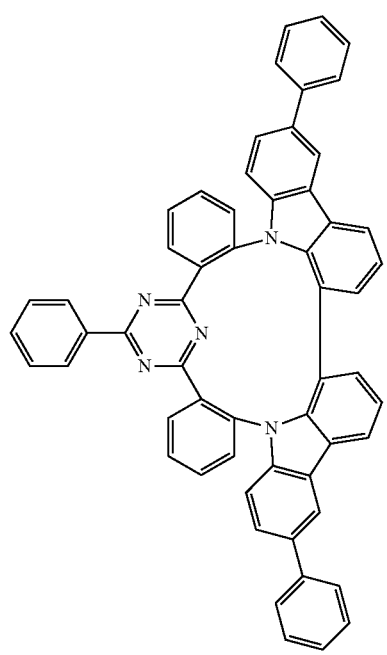
43
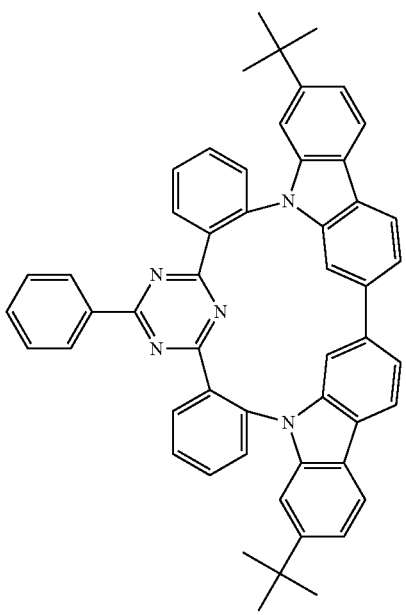

-continued

44

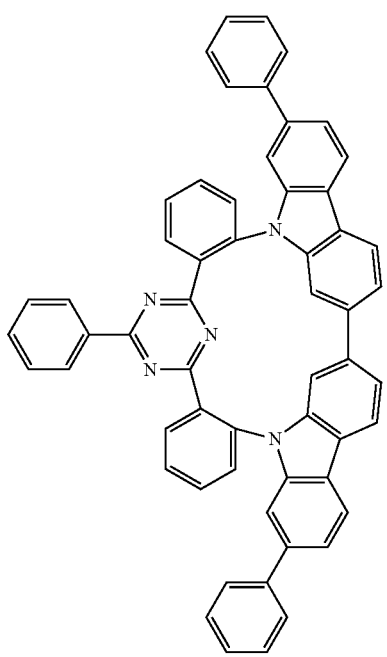

16. A nitrogen-containing compound represented by Formula 1:

[Formula 1]

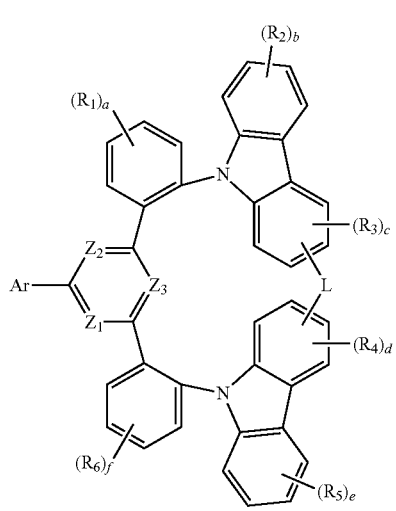

where $Z_1$ to $Z_3$ are each independently C-$R_7$ or N, provided that at least one of $Z_1$ to $Z_3$ are N, Ar is a substituted or unsubstituted aryl group having 6 to 30 ring carbon atoms, or a substituted or unsubstituted heteroaryl group having 2 to 30 ring carbon atoms, L is a direct linkage, a substituted or unsubstituted arylene group having 6 to 30 ring carbon atoms, or a substituted or unsubstituted heteroarylene group having 2 to 30 ring carbon atoms, $R_1$ to $R_7$ are each independently a hydrogen atom, a deuterium atom, a halogen atom, a cyano group, a substituted or unsubstituted amino group, a substituted or unsubstituted silyl group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, a, b, e and f are each independently an integer of 0 to 4, and c and d are each independently an integer of 0 to 3.

17. The nitrogen-containing compound as claimed in claim 16, wherein Formula 1 is represented by any one of Formulae 1-1 to 1-3:

[Formula 1-1]

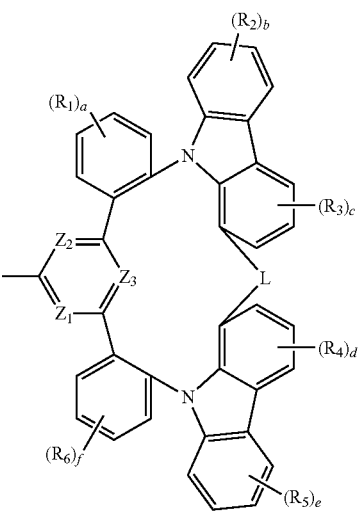

[Formula 1-2]

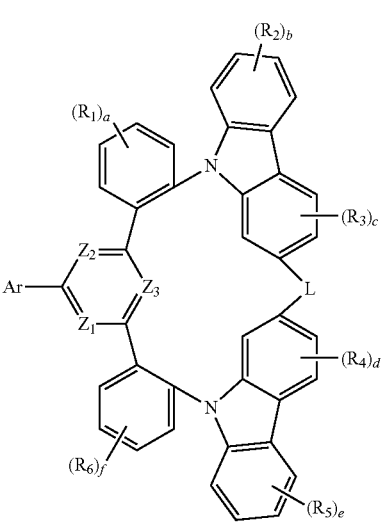

[Formula 1-3]

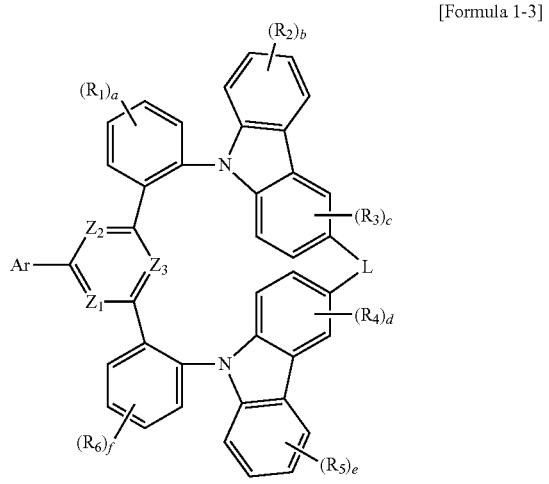

where $Z_1$ to $Z_3$, Ar, L, $R_1$ to $R_7$ and a to f are the same as defined in Formula 1.

18. The nitrogen-containing compound as claimed in claim 16, wherein

Ar is a substituted or unsubstituted phenyl group, a substituted or unsubstituted dibenzofuran group, or a substituted or unsubstituted dibenzothiophene group, and L is a direct linkage, a substituted or unsubstituted phenylene group, a substituted or unsubstituted dibenzofuranylene group, or a substituted or unsubstituted dibenzothiophenylene group.

19. The nitrogen-containing compound as claimed in claim 16, wherein at least two of $Z_1$ to $Z_3$ are N.

20. The nitrogen-containing compound as claimed in claim 16, wherein the nitrogen-containing compound is at least one of compounds in Compound Group 1:

[Compound Group 1]

1
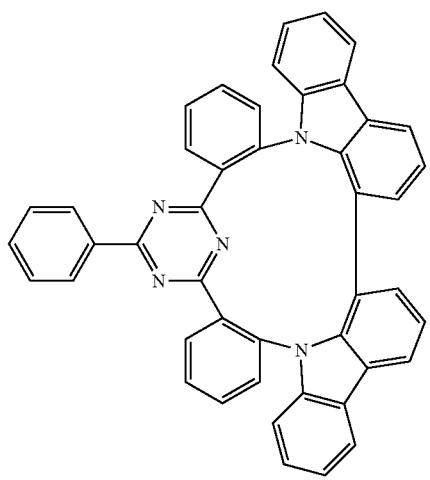

2
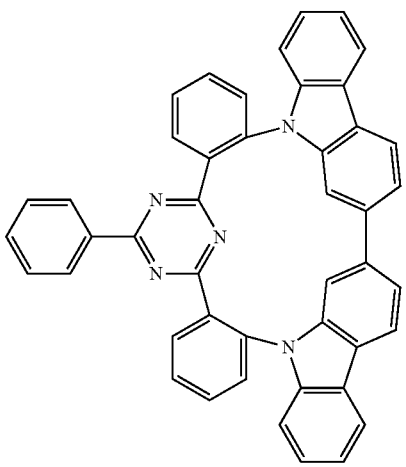

3
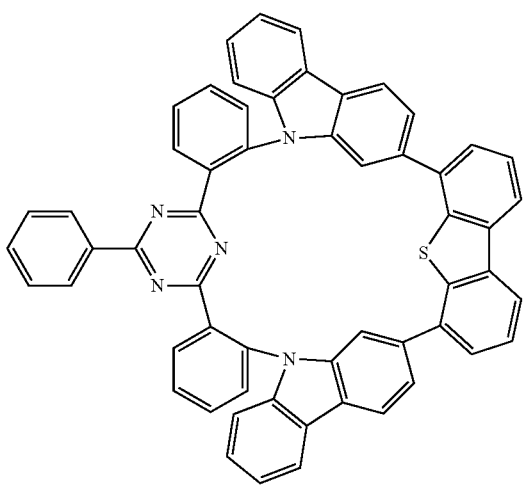

4
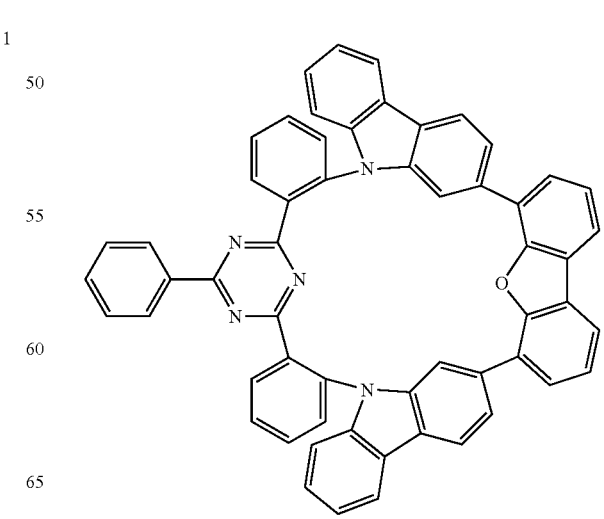

5
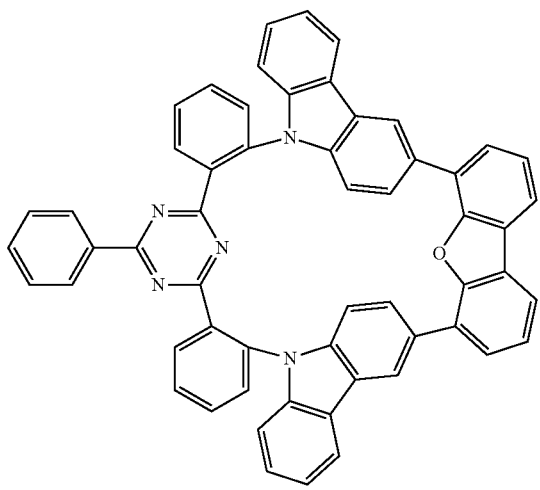
6
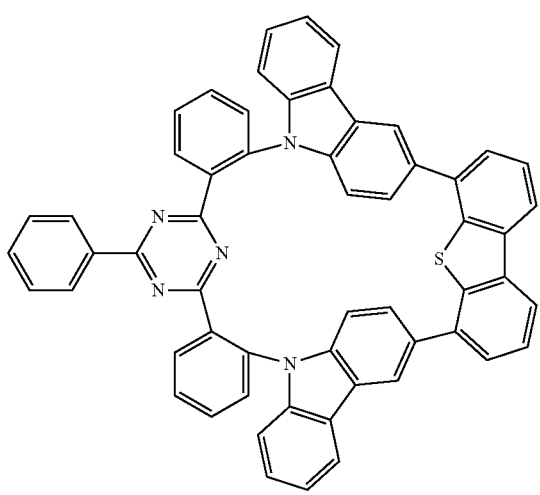
7
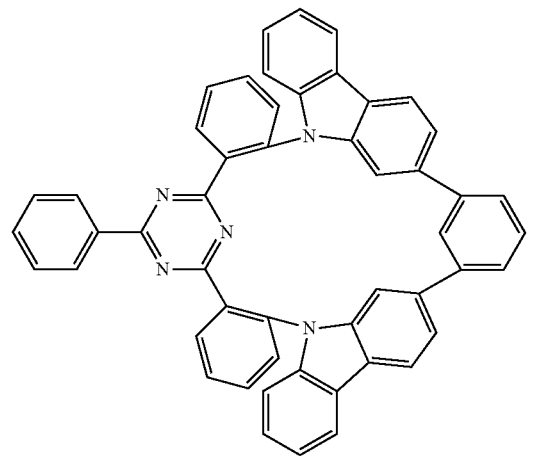
8
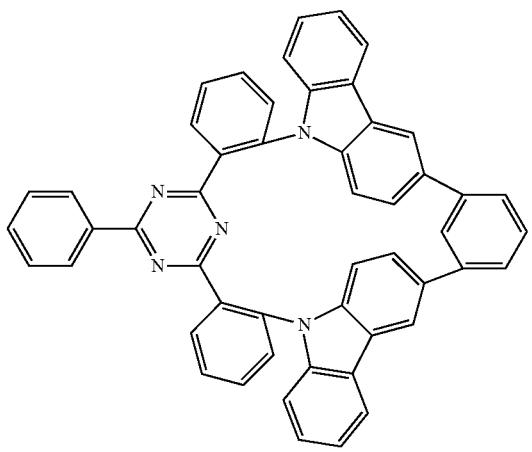
9
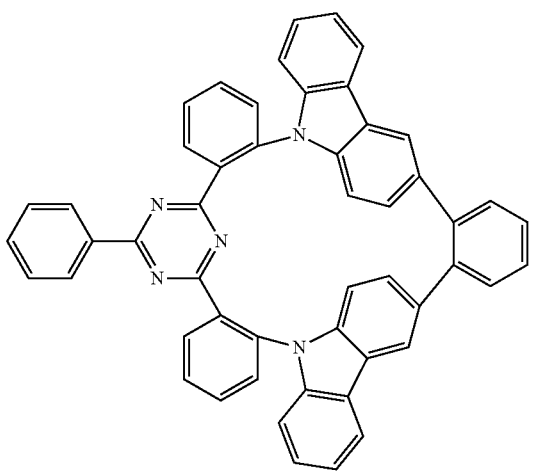
10
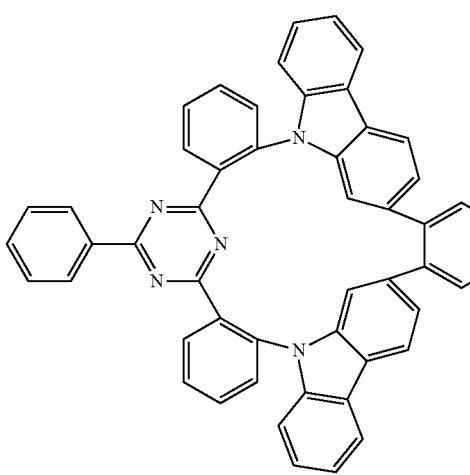

11
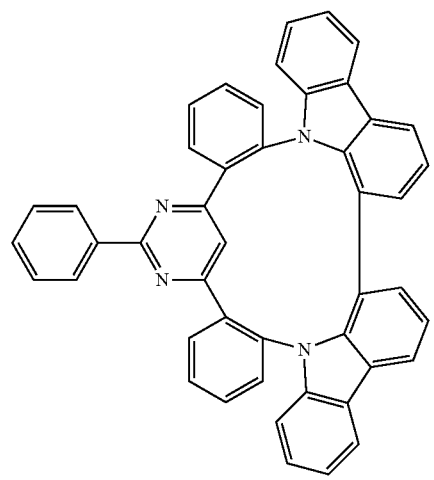
12
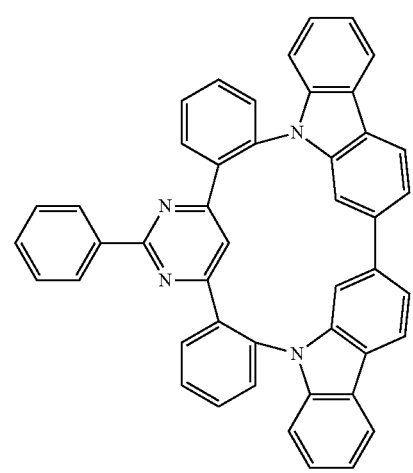
13
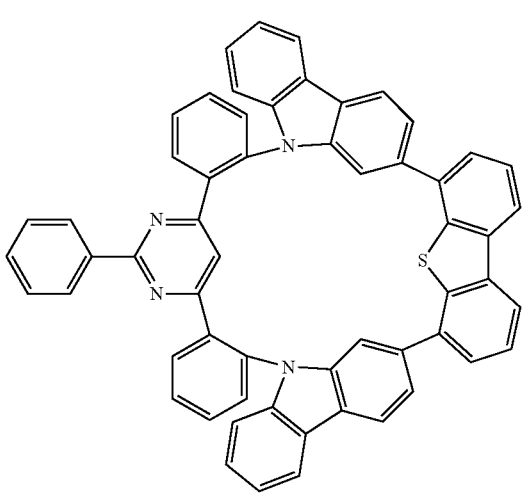
14
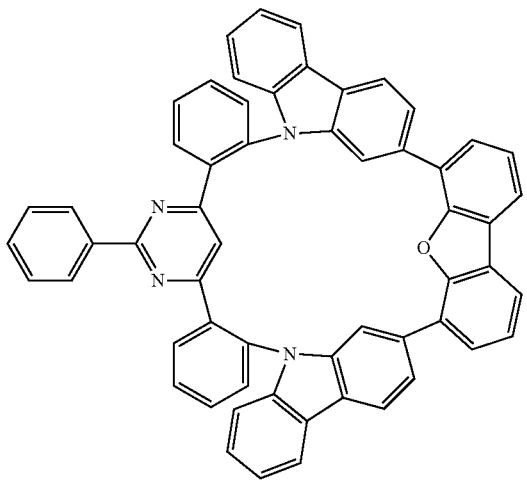
15
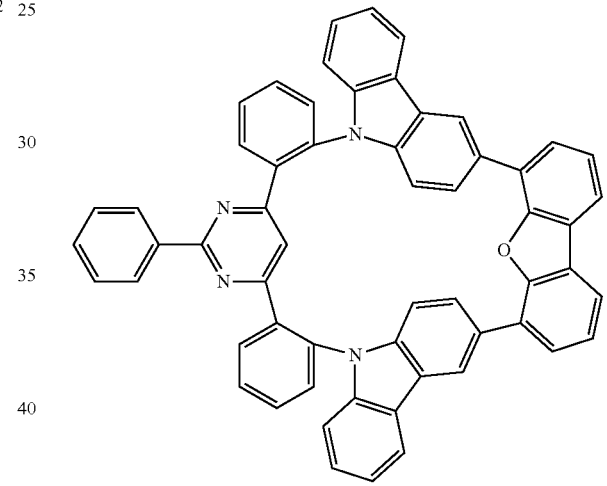
16
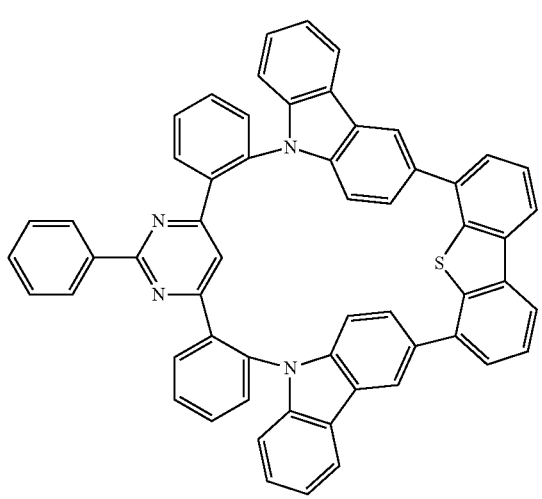

17
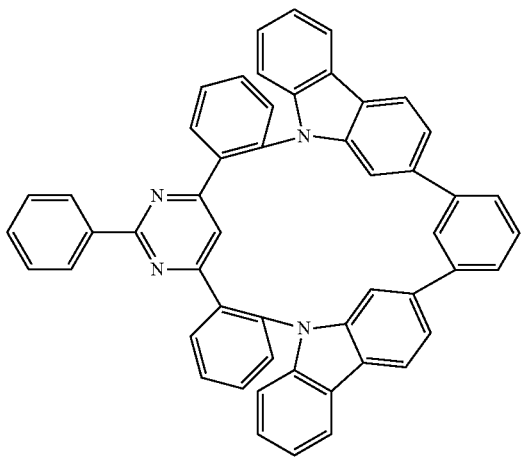
18
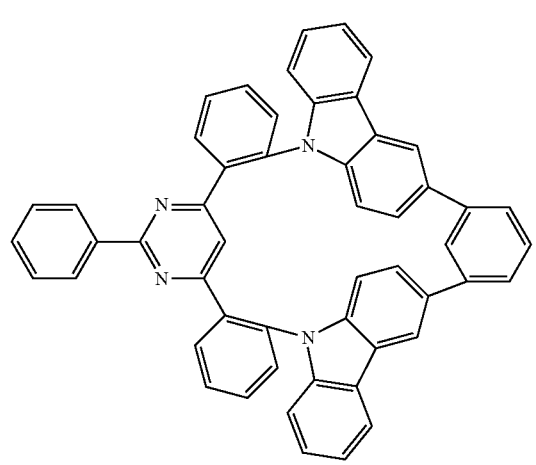
19
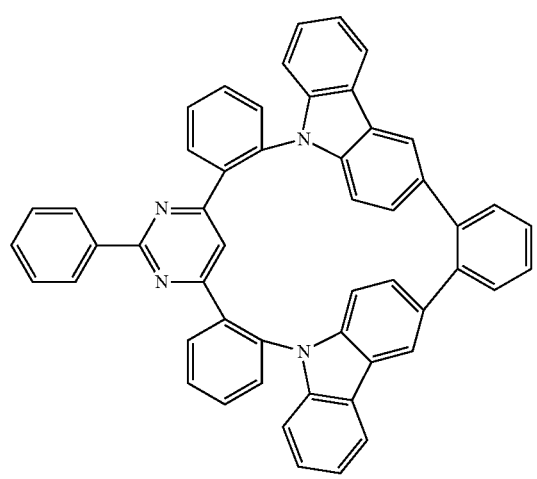
20
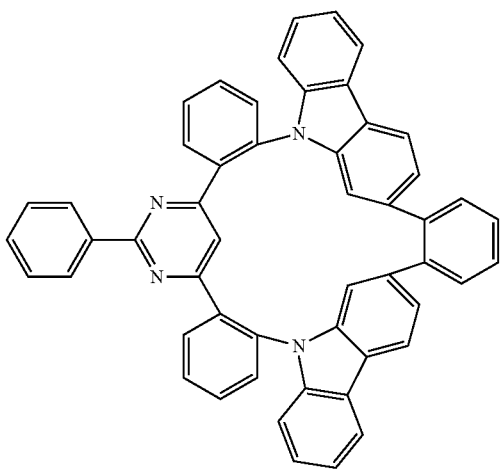
21
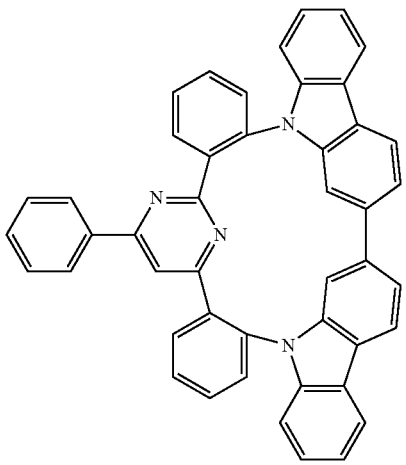
22

23
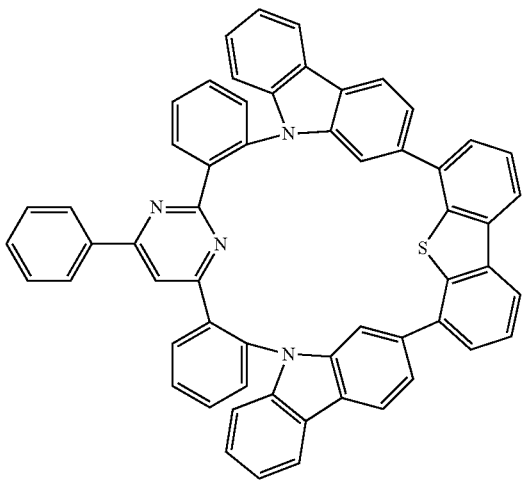
24
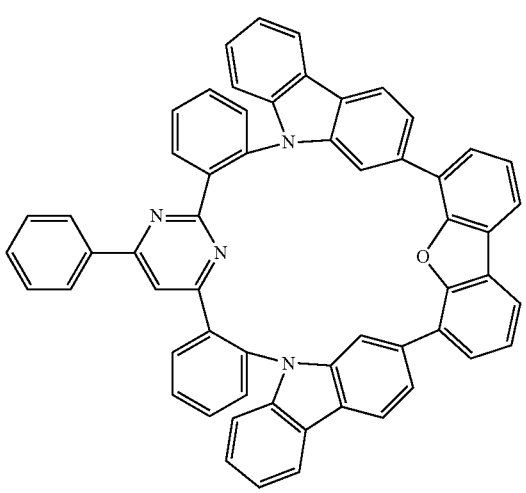
25
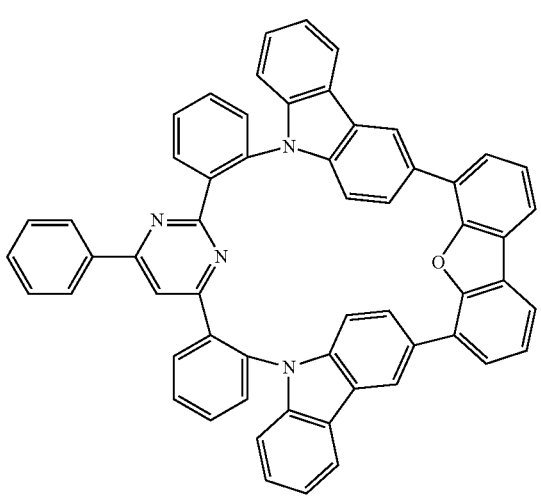
26
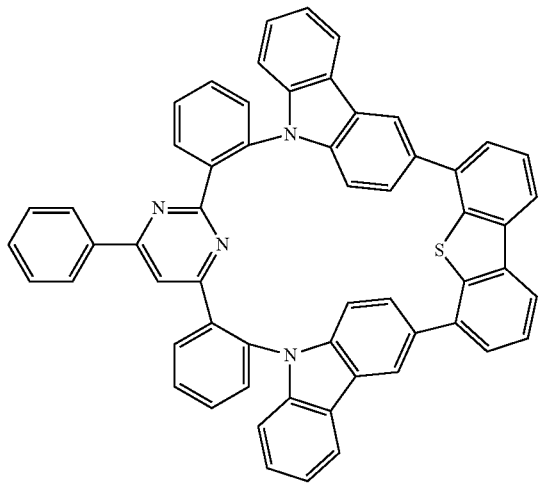
27
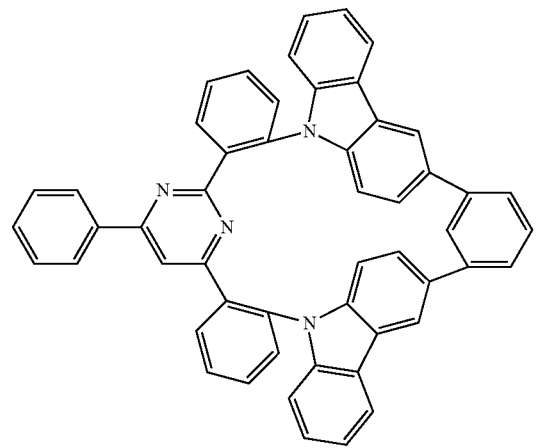

29
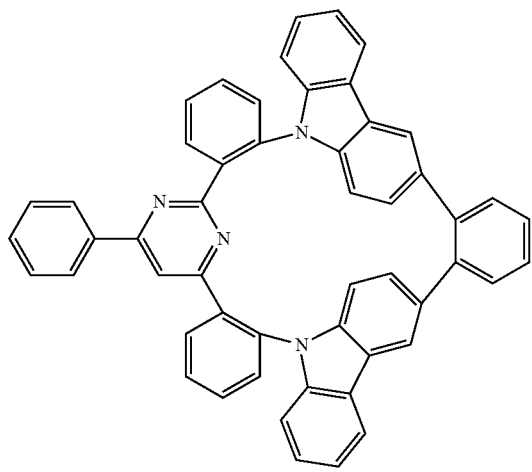
30
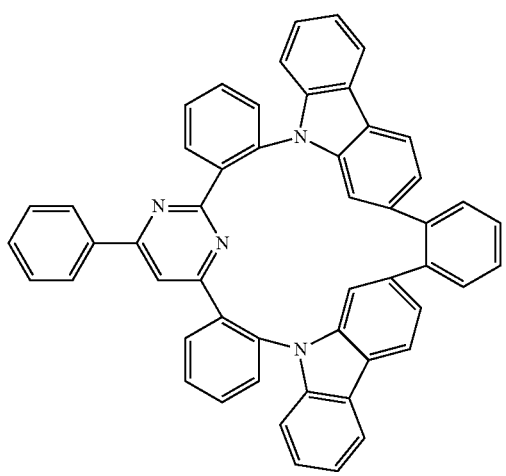
31
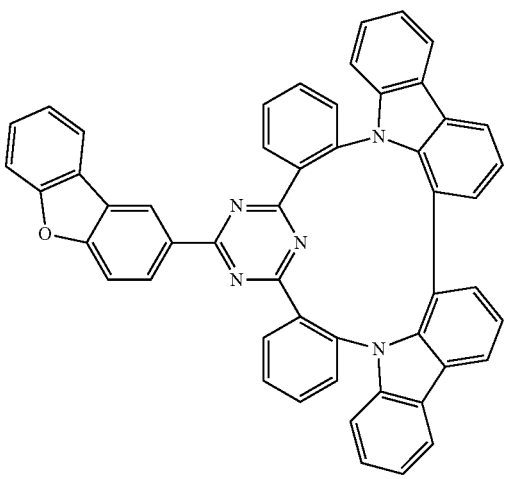
32
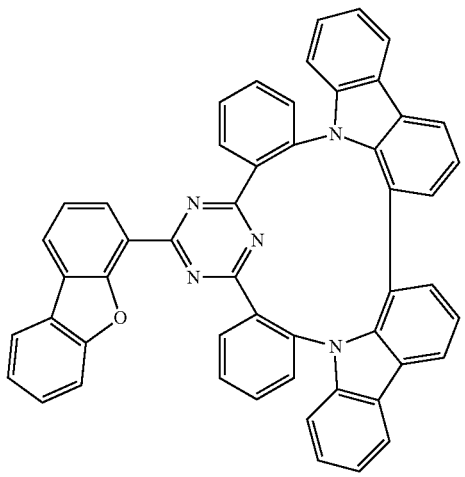
33
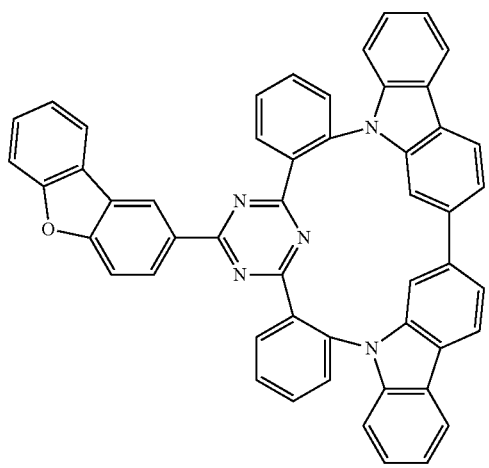
34
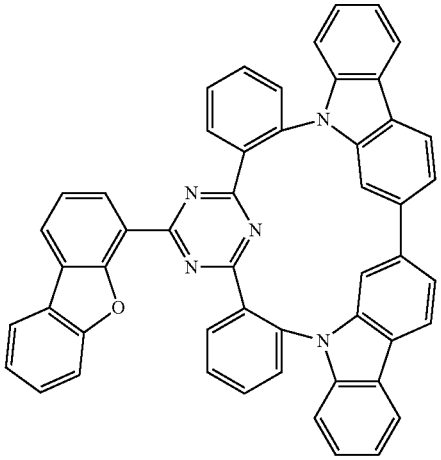

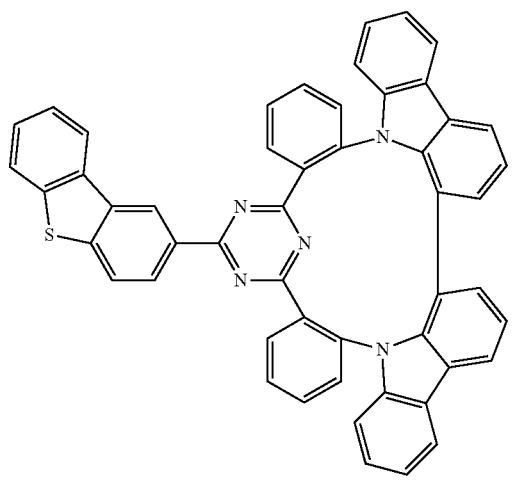
35
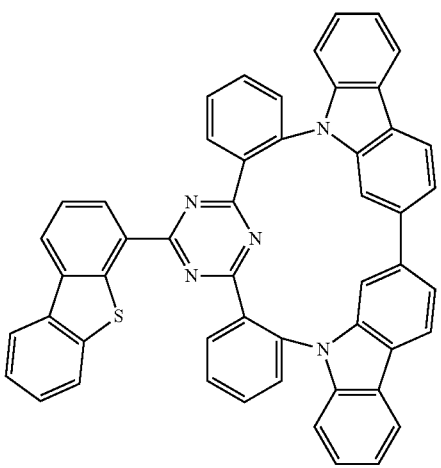
38
36
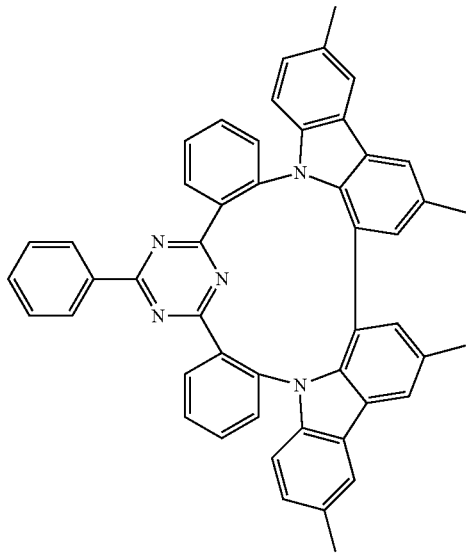
39
37
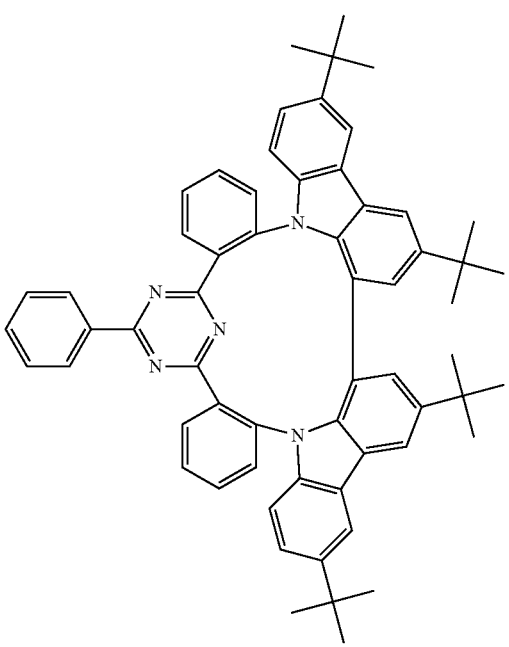
40

41
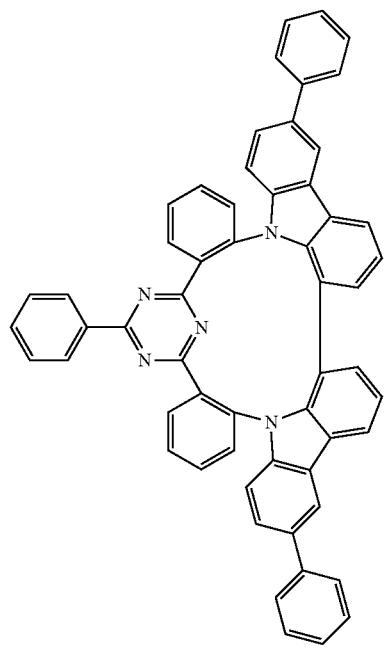
42
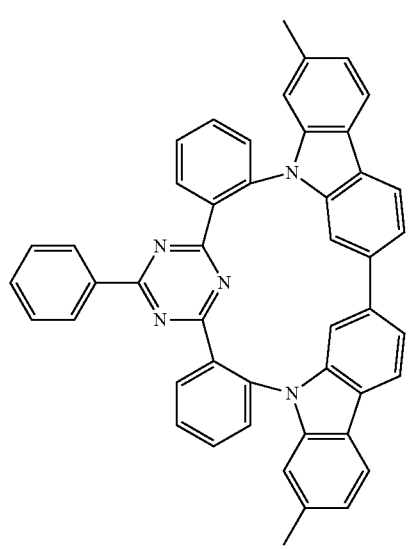
43
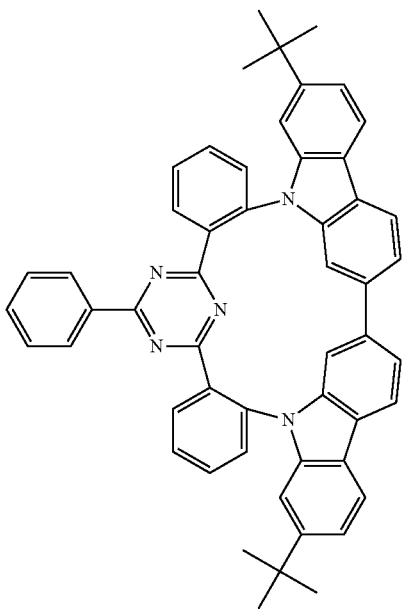
44
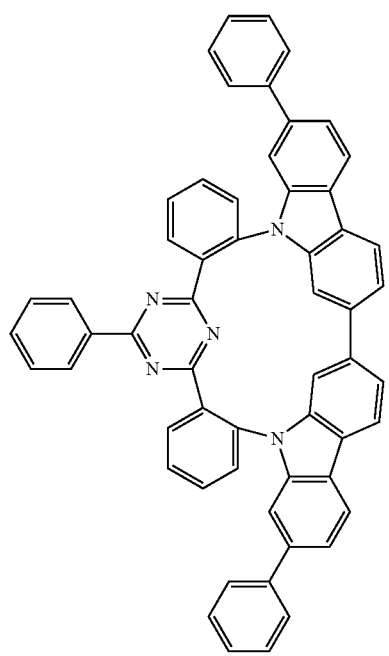
* * * * *